(12) United States Patent
Yukawa

(10) Patent No.: US 7,935,957 B2
(45) Date of Patent: May 3, 2011

(54) MEMORY DEVICE AND A SEMICONDUCTOR DEVICE

(75) Inventor: Mikio Yukawa, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 351 days.

(21) Appl. No.: 11/496,461

(22) Filed: Aug. 1, 2006

(65) Prior Publication Data

US 2007/0034865 A1 Feb. 15, 2007

(30) Foreign Application Priority Data

Aug. 12, 2005 (JP) ................. 2005-234387

(51) Int. Cl.
*H01L 51/46* (2006.01)
*H01L 51/54* (2006.01)

(52) U.S. Cl. .......... 257/40; 257/80; 257/E51.013; 257/E51.018; 257/E51.026

(58) Field of Classification Search .......... 257/40, 257/80, 81, E51.008, E51.013, E51.018, 257/E51.026, E51.048, E51.045, E51.025
See application file for complete search history.

(56) References Cited

U.S. PATENT DOCUMENTS

| | | | |
|---|---|---|---|
| 4,783,605 A | 11/1988 | Tomisawa et al. | |
| 4,871,236 A | 10/1989 | Gemma et al. | |
| 4,902,555 A | 2/1990 | Isoda et al. | |
| 5,010,451 A | 4/1991 | Ueyama et al. | |
| 5,211,762 A | 5/1993 | Isoda et al. | |
| 5,349,203 A | 9/1994 | Hanazato et al. | |
| 5,883,397 A | 3/1999 | Isoda et al. | |
| 6,055,180 A | 4/2000 | Gudesen et al. | |
| 6,324,091 B1 * | 11/2001 | Gryko et al. | 365/151 |
| 6,591,134 B2 | 7/2003 | Busch et al. | |
| 6,825,060 B1 * | 11/2004 | Lyons et al. | 438/82 |
| 6,894,392 B1 * | 5/2005 | Gudesen et al. | 257/759 |
| 6,903,958 B2 | 6/2005 | Bernds et al. | |
| 6,950,331 B2 * | 9/2005 | Yang et al. | 365/148 |
| 6,960,489 B2 | 11/2005 | Bernds et al. | |
| 6,992,323 B2 * | 1/2006 | Krieger et al. | 257/40 |

(Continued)

FOREIGN PATENT DOCUMENTS

CN 1267389 9/2000

(Continued)

OTHER PUBLICATIONS

Office Action (Application No. 200610111049.X) Dated Apr. 3, 2009.

*Primary Examiner* — Anh Phung
*Assistant Examiner* — Michael Lulis
(74) *Attorney, Agent, or Firm* — Eric J. Robinson; Robinson Intellectual Property Law Office, P.C.

(57) ABSTRACT

The present invention provides a memory device and a semiconductor device which have high reliability for writing at low cost. Furthermore, the present invention provides a memory device and a semiconductor device having a non-volatile memory element in which data can be additionally written and which can prevent forgery due to rewriting and the like. The memory element includes a first conductive layer, a second conductive layer, and an organic compound layer, which is formed between the first conductive layer and the second conductive layer, and which has a photosensitized oxidation reduction agent which can be an excited state by recombination energy of electrons and holes and a substance which can react with the photosensitized oxidation reduction agent.

32 Claims, 27 Drawing Sheets

U.S. PATENT DOCUMENTS

| | | |
|---|---|---|
| 6,998,492 B2 | 2/2006 | Seo et al. |
| 7,026,702 B2 * | 4/2006 | Krieger et al. ............... 257/464 |
| 7,041,390 B2 | 5/2006 | Seo et al. |
| 7,064,345 B2 | 6/2006 | Fix et al. |
| 7,781,758 B2 * | 8/2010 | Abe et al. ..................... 257/40 |
| 2003/0230746 A1 | 12/2003 | Stasiak |
| 2005/0112400 A1 | 5/2005 | Seo et al. |
| 2005/0211978 A1 * | 9/2005 | Bu et al. ....................... 257/40 |
| 2005/0221123 A1 | 10/2005 | Inoue et al. |
| 2005/0242715 A1 | 11/2005 | Inoue et al. |

FOREIGN PATENT DOCUMENTS

| | | |
|---|---|---|
| JP | 07-022669 | 1/1995 |
| JP | 2001-503183 | 3/2001 |
| WO | WO 98/58383 | 12/1998 |

* cited by examiner

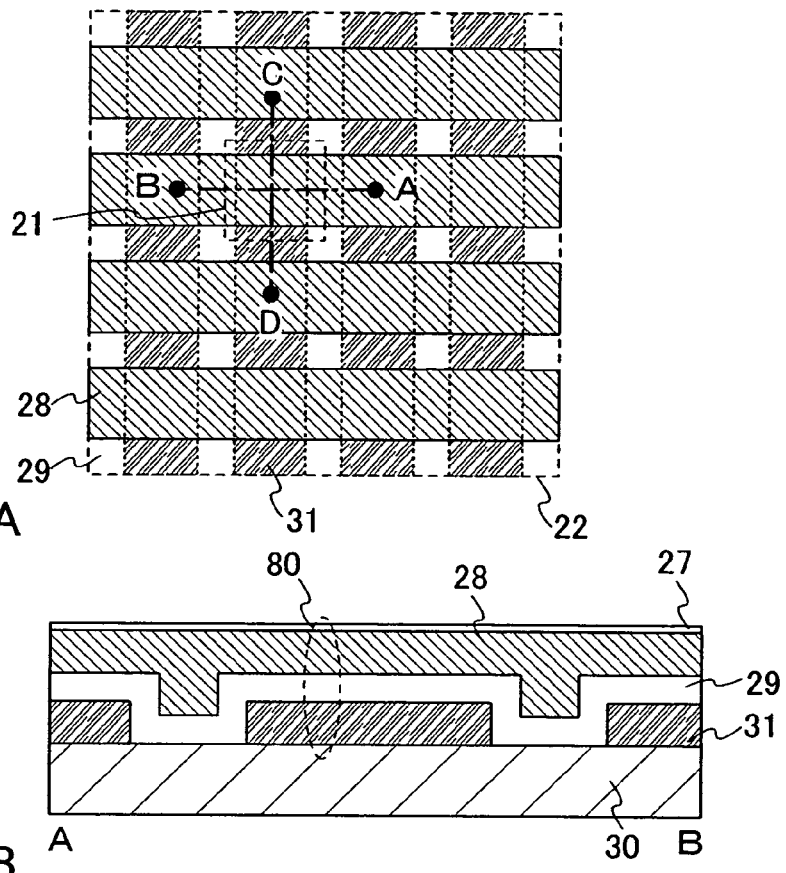
FIG. 15A
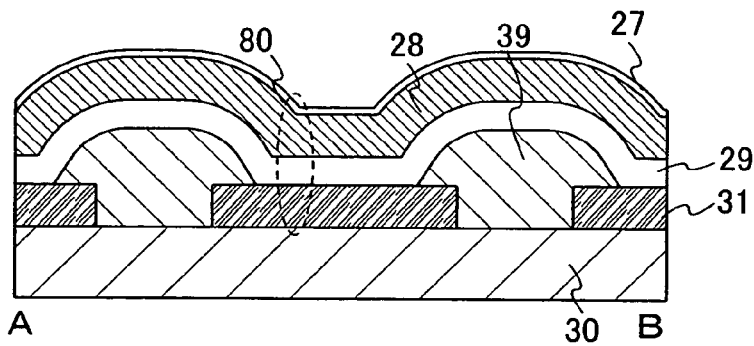
FIG. 15B
FIG. 15C
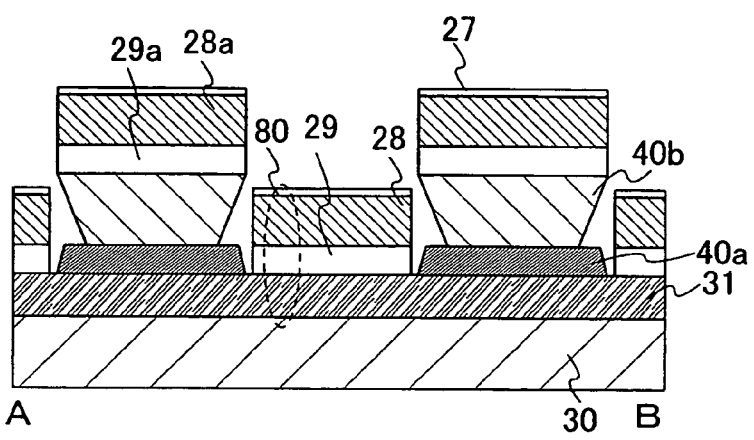
FIG. 15D

MEMORY DEVICE AND A SEMICONDUCTOR DEVICE

BACKGROUND OF THE INVENTION

1. Field of the Invention

The present invention relates to a memory device and a semiconductor device equipped with a memory element formed by using an organic compound.

2. Description of the Related Art

In recent years, a semiconductor device is required to be manufactured at low cost. Therefore, an electronic device using an organic compound in a control circuit, a memory circuit, or the like has been widely developed. Furthermore, an organic EL (Electro-Luminescence), an organic TFT (thin film transistor), an organic semiconductor laser, and the like have developed.

Moreover, a memory device having a memory element using an organic compound has been developed, and a technique of writing data by generating interaction with an organic compound of the memory element due to the generation of internal light of the memory element so as to cause chemical change and changing conductivity in the memory element is proposed. To be concrete, an example of writing data by separating chains of a conjugate molecule by an effect of internal light, heightening chemical reactivity of chemical species added by the effect of light, attacking a conductive material in a cell, and reducing conductivity of bulk is illustrated. (For example, reference 1: JP-T 2001-503183 (page 10, FIG. 6)).

SUMMARY OF THE INVENTION

However, in the memory device shown in the reference 1, when a conjugated molecule is chain-separated by generation of internal light so as to write data, a plurality of reaction products are formed since it is difficult to control a product generated due to chain separation. Moreover, when data is written by a technique of attacking a conductive material in a cell with chemical species in which chemical reactivity is heightened by the generation of the internal light and reducing conductivity of bulk, radical is generated and reaction is advanced. Thus, the stopping of the reaction is difficult to control; as a result, it is difficult to form an arbitrary product. Therefore, there are problems that conductivity of a memory element after writing in can not be controlled, variation in a written result is generated, and writing success is reduced.

As a memory circuit, a DRAM (Dynamic Random Access Memory), a SRAM (Static Random Access Memory), an FeRAM (Ferroelectric Random Access Memory), a mask ROM (Read Only Memory), an EPROM (Electrically Programmable Read Only Memory), an EEPROM (Electrically Erasable and Programmable Read Only Memory), a flash memory, and the like can be given. Among them, in the case of a DRAM and an SRAM which are volatile memory devices, data is erased when the power is turned off so that data is required to be written every time the power is turned on. An FeRAM is a nonvolatile memory circuit which uses a capacitor element including a ferroelectric layer and requires a large number of manufacturing steps. A mask ROM has a simple structure, however, data is required to be written during the manufacturing steps, and thus data cannot be additionally written. An EPROM, an EEPROM, and a flash memory are non-volatile memory devices using an element having two gate electrodes, so that the manufacturing steps are increased.

In view of the above problems, the present invention provides a semiconductor device with high reliability for writing at low cost. Furthermore, the present invention provides a semiconductor device having a non-volatile memory element in which data can be additionally written and which can prevent forgery due to rewriting and the like.

The memory element included in the memory device of the present invention has a first conductive layer, a second conductive layer, and an organic compound layer, which is formed between the first conductive layer and the second conductive layer and which has a photosensitized oxidation reduction agent may come to an excited state by recombination energy of holes and electron and a substance which reacts with the photosensitized oxidation reduction agent.

Note that a light emitting material may be included in the organic compound layer.

In the memory element included in the memory device according to the present invention, data is written by applying voltage to the first conductive layer and the second conductive layer, utilizing recombination energy or emission energy caused by recombining holes and electrons so that the photosensitized oxidation reduction agent is in an excited state, using the excited state photosensitized oxidation reduction agent to have at least one part of the photosensitized oxidation reduction reaction, and generating a reaction product which is different in conductivity from a substance.

In the electrons and holes generated by applying voltage to the first conductive layer and the second conductive layer in the memory element, recombination is performed in at least one selected from a photosensitized oxidation reduction agent, a substance, or a light emitting material, so that the photosensitized oxidation reduction agent comes to an excited state by the recombination energy or light emission energy caused by the recombination, and at least one part of the substance has a photosensitized oxidation reduction reaction by the photosensitized oxidation reduction agent in the excited state, thereby a product is formed.

Note that the organic compound layer may be formed by laminating a layer formed of a light emitting material and a layer formed of a photosensitized oxidation reduction agent and a substance.

Furthermore, either electrode of a light emitting element and either electrode of a memory element are to be a common electrode, and the common electrode is formed of the material having a light-transmitting property, and therefore, a photosensitized oxidation reduction agent of the memory element can be irradiated with light emitted from the light emitting element and the photosensitized oxidation reduction agent can be in an excited state.

At least one of a charge injection layer and a charge transport layer may be provided between the first conductive layer and the organic compound layer. Similarly, at least one of a charge injection layer and a charge transport layer may be provided between the second conductive layer and the organic compound layer. When the first conductive layer functions as an anode, at least one of the hole injection layer and the hole transport layer may be provided between the first conductive layer and the organic compound layer. When the second conductive layer functions as a cathode, at least one of the electron injection layer and the electron transport layer may be provided between the second conductive layer and the organic compound layer.

A semiconductor device having the memory device may include a conductive layer serving as an antenna and a transistor electrically connected to the conductive layer. Furthermore, the semiconductor device having the memory device may include a diode connected to the first conductive layer or the second conductive layer.

In the semiconductor device, a memory cell array and a write circuit are provided over a glass substrate or a flexible substrate, and the write circuit may be formed of a thin film transistor.

In the semiconductor device, the memory cell array and the write circuit are provided over a single crystal semiconductor substrate, and the write circuit may be formed of a field effect transistor.

Furthermore, in the semiconductor device, any one or more of a readout circuit, a power source circuit, a clock generation circuit, a data modulation/demodulation circuit, a control circuit, and interface circuit may be included in addition to the write circuit.

As a typical example of a semiconductor device according to the present invention, a wireless chip typified by an ID chip, a wireless tag, an RFID (Radio frequency identification) tag, an IC tag, or the like can be given.

In the memory element of the present invention, data is written by exciting a photosensitized oxidation reduction agent by recombination energy of holes and electrons, performing a photosensitized oxidation reduction reaction of a substance by the excited energy, and changing electrical resistance of the memory element by generating a reaction product. Because of this, writing can be controlled; as a result, variation in writing can be reduced. Moreover, the writing success can be increased.

Even if a light irradiation device for writing is not provided outside, a memory element emits light itself and data can be written in by using the light, and therefore, downsizing of a memory device and a semiconductor device is possible, and high integration is possible. Besides, since a photosensitized oxidation reduction agent can be excited without loss of energy emitted from a light emitting material, writing can be performed with high energy efficiency.

The memory device and the semiconductor device of the present invention are writable (additional writing) of data except in manufacturing tips. Furthermore, the memory device and the semiconductor device which can prevent forgery due to rewriting can be obtained since rewriting is not possible. Further, the memory device and the semiconductor device have a memory element with a simple structure in which an organic compound is sandwiched between a pair of conductive layers; thus a semiconductor device can be is provided at low cost.

BRIEF DESCRIPTION OF THE DRAWINGS

FIGS. 15A to 15D are a top view and cross sectional views of a memory device of this invention.

DETAILED DESCRIPTION OF THE INVENTION

Embodiment Mode

Figure 1A:
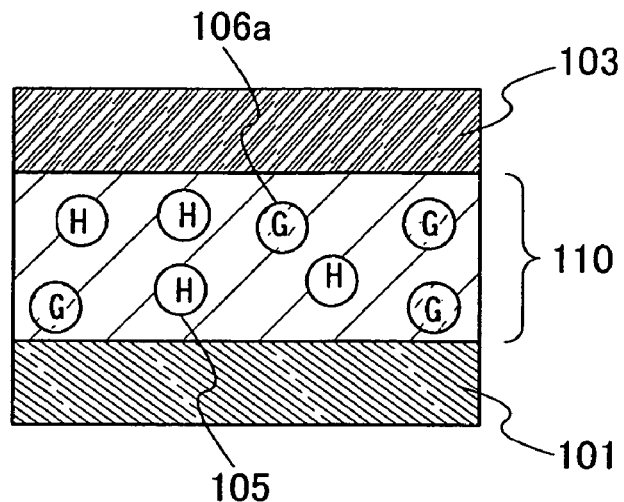
FIGS. 1A to 1C are cross-sectional views describing a memory element of this invention.

Hereinafter, embodiment modes of the invention are described with reference to the drawings. However, the present invention can be carried out in many different modes, and it is easily understood by those of ordinary skill in the art that the modes and the detail of the invention can be changed variously unless otherwise such changes and modifications depart from the purpose and the scope of the present invention. Note that the same symbol referring the same is commonly used in the drawings.

In the embodiment modes, a structure of a memory element is described using a model diagram. Therefore, the size, the thickness and the shape of each component of the memory element may be different from the original.

Embodiment Mode 1

A structural example of a memory element included in a memory device of the invention is described with reference to drawings.

Figure 1B:
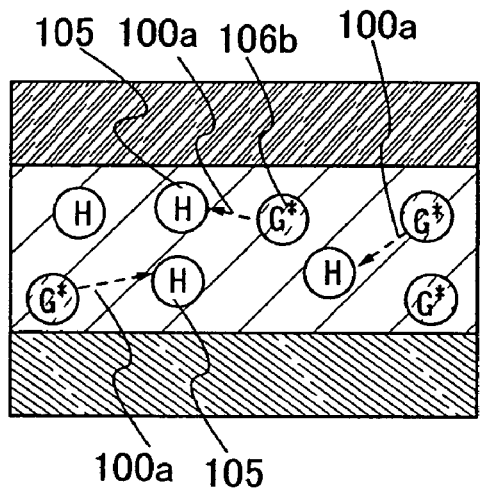
Figure 1C:
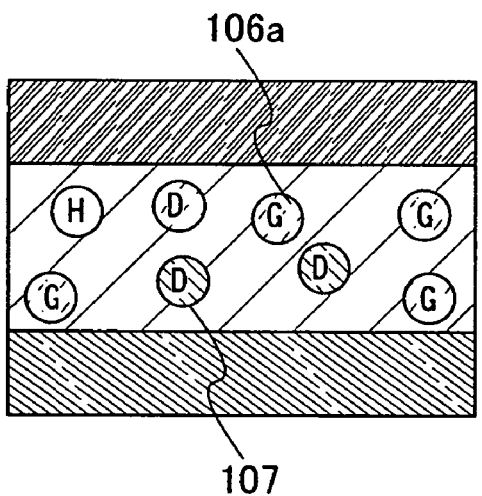

The memory element of this embodiment mode, as shown in FIGS. 1A to 1C, is formed of a first conductive layer 101, an organic compound layer 110 having contact with the first conductive layer, and a second conductive layer 103 having contact with the organic compound layer. The organic compound layer 110 has a photosensitized oxidation reduction agent 106a which may come to an excited state by recombination energy of electrons and holes, and a substance 105 which may react by the photosensitized oxidation reduction agent.

Current flows by raising electric potential of the first conductive layer 101 than that of the second conductive layer 103, and holes and electrons are recombined in the organic compound layer 110. Accordingly, the first conductive layer 101 serves as an anode and the second conductive layer 103 serves as a cathode. In this embodiment mode, recombination of the holes and electrons in the photosensitized oxidation reduction agent 106a of the organic compound layer 110 is shown as an example.

As the first conductive layer 101, a material having a work function in the range of 3.5 eV to 5.5 eV can be used. To be concrete, in addition to a transparent electrode such as indium tin oxide (ITO) and indium tin oxide added with silicon, titanium, molybdenum, tungsten, nickel, gold, platinum, silver, aluminum, and alloy thereof, and the like can be used. In particular, titanium, molybdenum, aluminum, or alloy thereof is a multipurpose metal used for a wiring, and a memory element can be provided at low cost using it as the first conductive layer 101.

The organic compound layer 110 includes a substance 105 and a photosensitized oxidation reduction agent 106a.

As the photosensitized oxidation reduction agent 106a, a alloxazine round or a compound such as chlorophyll which includes in a structure a basis having strong oxidation-reduction power in an excited state is given, and typically, lumichrome, alloxazine, lumiflavin, flavin mononucleotide, tetramethylene paraphenylene diamines, and the like are given. The photosensitized oxidation reduction agent 106a comes to an oxidation agent or a reduction agent according to combination with the substance 105 and according to reaction condition.

The substance 105 is a compound which is decomposed or in which structural change occurs by photosensitized oxidation reduction reaction, to be more precise, by oxidation of alcohol, oxidative cleavage of alkene or the like, cyclization reaction, or ring-opening reaction, or the substance 105 is a compound from which de-doping of a metal can be performed by photosensitized oxidation reaction. As a typical compound which is decomposed or in which structural change occurs due to the photosensitized oxidation reduction reaction by oxidation of alcohol, oxidative cleavage of alkene and the like, cyclization reaction, or ring-opening reaction, an ascorbic acid, guanosine, dibenzofuran, 11-cis-3,4-di dehydroretinal, an uridine, a thymidine or the like is given as an example.

The substance 105 is oxidized or reduced, according to a combination with a photosensitized oxidation reduction agent and according to reaction condition.

As a compound from which de-doping of a metal can be performed by a photosensitized oxidation reduction reaction, fullerene, chlorophyll, phthalocyanine, haemin or the like each of which has a central metal can be given as an example. As the central metal, aluminum (Al), titanium (Ti), chromium (Cr), vanadium (V), manganese (Mn), iron (Fe), cobalt (Co), nickel (Ni), copper (Cu), zinc (Zn), zirconium (Zr), niobium (Nb), molybdenum (Mo), ruthenium (Ru), rhodium (Rh), palladium (Pd), silver (Ag), cadmium (Cd), indium (In), tin (Sn), cesium (Cs), hafnium (Hf), tantalum (Ta), tungsten (W), osmium (Os), iridium (Ir), platinum (Pt), gold (Au), lead (Pb), bismuth (Bi) or the like can be given.

The second conductive layer 103 can be formed of the same material as the first conductive layer 101. Further, a metal with a low work function such as lithium, magnesium, calcium, barium, or alloy thereof can be used for the second conductive layer 103.

Subsequently, writing of data of a memory element of this embodiment mode is described. As shown in FIG. 1A, voltage is applied to the first conductive layer 101 and the second conductive layer 103 so as to generate electric potential difference between the conductive layers. Accordingly, holes and electrons are recombined in the photosensitized reducing agent 106a of the layer 110 including an organic compound, and the photosensitized reducing agent comes to an excited state 106b as shown in FIG. 1B.

Then, at least one part of reaction in the substance 105 is promoted by excited energy 100a of the photosensitized oxidation reduction agent in the excited state 106b, and a product 107 is generated as shown in FIG. 1C. As a typical example of the product, a material in which a substance is decomposed, a material in which a structure of the substance is changed, a material from which de-doping of a metal is performed, or the like can be given. On the other hand, the photosensitized oxidation reduction agent in the excited state 106b returns to the photosensitized oxidation reduction agent 106a before the excited state.

The product 107 of the substance 105 becomes an oxide when the substance is oxidized, and becomes a reduced substance when the substance is reduced. The conductivity of the product 107 is different from that of the substance 105. Consequently, by applying voltage to the first conductive layer and the second conductive layer, and generating the product 107, electric resistance of the memory element is changed. Typically, increase of the resistance which causes insulation, or decrease of the resistance is given. Namely, voltage is applied to the first conductive layer 101 and the second conductive layer 103, the photosensitized oxidation reduction agent in the organic compound layer is made an excited state, and oxidation reaction or reducing reaction of the substance is caused by the excited energy, thereby generating a product. The data can be written by the resulting change in the electric resistance of the memory element. Alternatively, there is a case where heat is generated by the photosensitized oxidation reduction reaction of the substance, and the shape or the film thickness of the layer due to the heat occur at the same time. Accordingly, data can be written in by the change of the electric resistance of the memory element.

The data of the memory element can be read out by reading the difference between the electric resistance of the memory element before writing and the electric resistance of the memory element after writing in.

In a memory device of this embodiment mode, a photosensitized oxidation reduction agent is excited by recombination energy of electrons and holes in the photosensitized oxidation reduction agent, and data is written in by generating photosensitized oxidation reduction reaction by the excited energy and changing electric resistance of the memory element. At this time, a reaction product can be controlled. As a result, variation of writing can be decreased and writing success can be increased.

Embodiment Mode 2

Figure 2A:
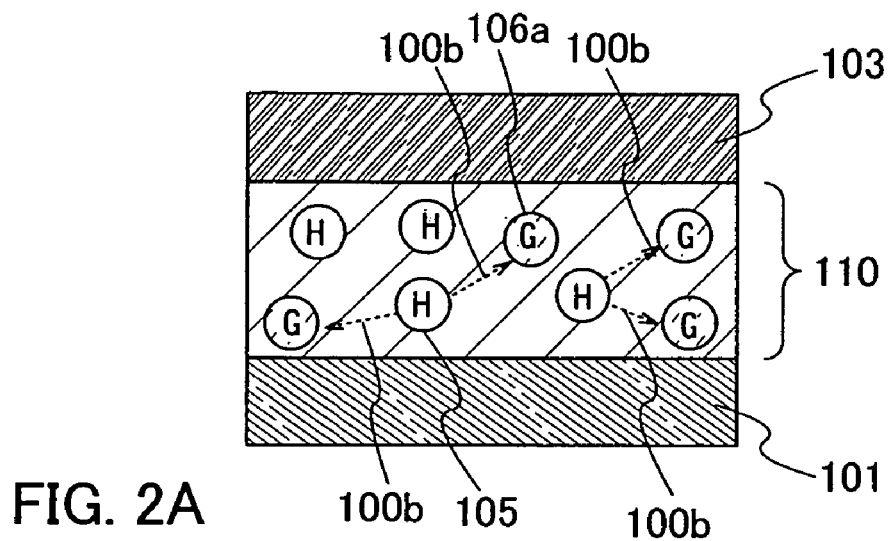
FIGS. 2A to 2C are cross-sectional views describing a memory element of this invention.
Figure 2B:
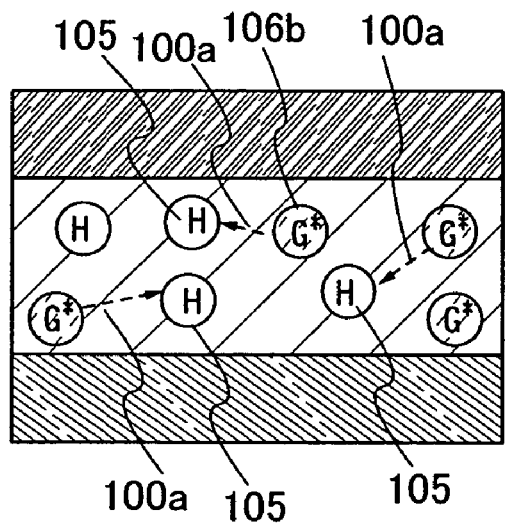
Figure 2C:
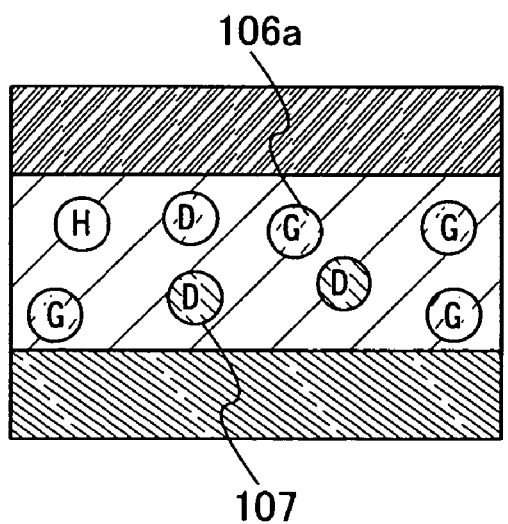

In this embodiment mode, a memory element in which recombination of holes and electrons are generated in a substance included in an organic compound layer is described in comparison with Embodiment Mode 1 with reference to FIGS. 2A to 2C.

The memory element of this embodiment mode is formed of a first conductive layer 101, an organic compound layer 110 having contact with the first conductive layer, and a second conductive layer 103 having contact with the organic compound layer.

In this embodiment mode, the organic compound layer 110 includes a substance 105 and a photosensitized oxidation reduction agent 106a. Each of the first conductive layer 101, the second conductive layer 103, the substance 105, and the photosensitized oxidation reduction agent 106a can be formed of the same material as that in Embodiment Mode 1.

Then, writing of data of a memory element of this embodiment mode is described. When voltage is applied to the first conductive layer 101 and the second conductive layer 103 and potential difference is generated between the both conductive layers as shown in FIG. 2A, holes and electrons are recombined in the substance 105 of the organic compound layer 110, and recombination energy 100b is generated.

The recombination energy is moved to the photosensitized oxidation reduction agent 106a, and the photosensitized oxidation reduction agent comes to an excited state 106b as shown in FIG. 2B.

Then, at least one part of reaction in the substance 105 is promoted by excited energy 100a of the photosensitized oxidation reduction agent in an excited state 106b, and a product 107 is generated as shown in FIG. 2C. A typical example of the product is the same as the product 107 in Embodiment Mode 1.

The conductivity of the product 107 of the substance 105 is different from that one of the substance 108. Consequently, by applying voltage to the first conductive layer and the second conductive layer, and generating the product 107, electric resistance of the memory element is changed as in the case of Embodiment Mode 1. Typically, increase of the resistance which causes insulation, or decrease of the resistance is given. The data can be written by the resulting change in the electric resistance by the applied voltage to the first conductive layer 101 and the second conductive layer 103.

The data of the memory element can be read out by reading the difference between the electric resistance of the memory element before writing in and the electric resistance of the memory element after writing in.

In the memory element of this embodiment mode, data is written in by exciting a photosensitized oxidation reduction agent by recombination energy of electrons and holes in the photosensitized oxidation reduction agent, and changing electric resistance of the memory element by generating photosensitized oxidation reduction reaction. At this time, a reaction product can be controlled. As a result, variation in writing can be decreased and writing success can be increased.

Embodiment Mode 3

In this embodiment mode, a structure of a memory element having a light emitting material in an organic compound layer is described with reference to drawings in comparison with Embodiment Mode 1 and Embodiment Mode 2.

The memory element of this embodiment mode is formed of a first conductive layer 101, an organic compound layer 102 having contact with the first conductive layer, and a second conductive layer 103 having contact with the organic compound layer.

In this embodiment mode, the organic compound layer 102 includes a substance 105, a photosensitized oxidation reduction agent 106a and a light emitting material 104. The first conductive layer 101, the second conductive layer 103, the substance 105, and the photosensitized oxidation reduction agent 106a can be formed using the same material as that in Embodiment Mode 1.

As the light emitting material 104, an organic compound having preferable energy transfer efficiency to the photosensitized oxidation reduction agent is used regardless of luminescence quantum efficiency. Therefore, one or more selected from a light emitting material, a hole transporting material, a hole injecting material, an electron transporting material, and an electron injecting material can be properly used. Here, the material with a high luminescence quantum efficiency is referred to as a light emitting material.

As the light emitting material, for example, 9,10-di(2-naphthyl)anthracene (abbr.: DNA), 2-tert-butyl-9,10-di(2-naphthyl)anthracene (abbr.: t-BuDNA), 4,4'-bis(2,2-diphenylvinyl) biphenyl (abbr.: DPVBi), Coumarin 30, Coumarin 6, Coumarin 545, Coumarin 545T, perylene, rubrene, periflanthene, 2,5,8,11-tetra(tert-butyl)perylene (abbr.: TBP), 9,10-diphenylanthracene (abbr.: DPA), 5,12-diphenyltetracene, 4-(dicyanomethylene)-2-methyl-6-[p-(dimethylamino)styryl]-4H-pyran (abbr.: DCM1), 4-(dicyanomethylene)-2-methyl-6-[2-(joulolidine-9-yl)ethenyl]-4H-pyran (abbr.: DCM2), 4-(dicyanomethylene)-2,6-bis[p-(dimethylamino)styryl]-4H-pyran (abbr.: BisDCM), or the like can be given. In addition, a compound which can emit phosphorescence can be used, such as bis[2-(4',6'-difluorophenyl)pyridinato-N,$C^2$](picolinato)iridium (abbr.: FIrpic), bis {2-[3',5'-bis(trifluoromethyl)phenyl]pyridinato-N,$C^2$}(picolinato) iridium (abbr.: Ir($CF_3$ppy)$_2$(pic)), tris(2-phenylpyridinato-N,$C^2$)iridium (abbr.: Ir(ppy)$_3$), (acetylacetonato)bis(2-phenylpyridinato-N,$C^2$)iridium (abbr.: Ir(ppy)$_2$(acac)), (acetylacetonato)bis[2-(2'-thienyl)pyridinato-N,$C^3$]iridium (abbr.: Ir(thp)$_2$(acac)), (acetylacetonato)bis(2-phenylquinolinato-N,$C^2$)iridium (abbr.: Ir(pq)$_2$(acac)), or (acetylacetonato) bis[2-(2'-benzothienyl) pyridinato-N,$C^3$]iridium (abbr.: Ir(btp)$_2$(acac)).

As the electron transporting material, tris(8-quinolinolato) aluminum (abbr.: Alq$_3$), tris(4-methyl-8-quinolinolato)aluminum (abbr.: Almq$_3$), bis(10-hydroxybenzo[h]-quinolinato) beryllium (abbr.: BeBq$_2$), bis(2-methyl-8-quinolinolato)(4-phenylphenolato)aluminum (abbr.: BAlq), bis[2-(2'-hydroxyphenyl)benzoxazolato]zinc (abbr.: Zn(BOX)$_2$), bis[2-(2'-hydroxyphenyl)benzothiazolato]zinc (abbr.: Zn(BTZ)$_2$), bathophenanthroline (abbr.: BPhen), bathocuproin (abbr.: BCP), 2-(4-biphenylyl)-5-(4-tert-butylphenyl)-1,3,4-oxadiazole (abbr.: PBD), 1,3-bis[5-(4-tert-butylphenyl)-1,3,4-oxadiazole-2-yl]benzene (abbr.: OXD-7), 2,2',2"-(1,3,5-benzenetriyl)-tris(1-phenyl-1H-benzimidazole) (abbr.: TPBI), 3-(4-biphenylyl)-4-phenyl-5-(4-tert-butylphenyl)-1,2,4-triazole (abbr.: TAZ), 3-(4-biphenylyl)-4-(4-ethylphenyl)-5-(4-tert-butylphenyl)-1,2,4-triazole (abbr.: p-EtTAZ), or the like can be given; however, the electron transporting material is not limited thereto.

As the electron injecting material, an ultrathin film of an insulator, for example, alkali metal halide such as LiF or CsF, alkaline earth metal halide such as CaF$_2$, alkali metal oxide such as Li$_2$O, or the like is often used besides the above-described electron transporting material. Further, an alkali metal complex such as lithium acetylacetonate (abbr.: Li(acac)) or 8-quinolinolato-lithium (abbr.: Liq) is also effective. Moreover, a material in which the above-mentioned electron transporting material is mixed with metal having a low work function, such as Mg, Li, or Cs, by co-evaporation or the like can also be used.

As the hole-transporting compound, for example, in addition to phthalocyanine (abbr.: H$_2$Pc), copper phthalocyanine (abbr.: CuPc), and vanadyl phthalocyanine (abbr.: VOPc), 4,4',4"-tris(N,N-diphenylamino) triphenylamine (abbr.: TDATA), 4,4',4"-tris[N-(3-methylphenyl)-N-phenylamino] triphenylamine (abbr.: MTDATA), 1,3,5-tris[N,N-di(m- tolyl)amino]benzene (abbr.: m-MTDAB), N,N'-diphenyl-N,N'-bis(3-methylphenyl)-1,1'-biphenyl-4,4'-diamine (abbr.: TPD), 4,4'-bis[N-(1-naphthyl)-N-phenylamino]biphenyl (abbr.: NPB), 4,4'-bis{N-[4-di(m-tolyl)amino]phenyl-N-phenylamino}biphenyl (abbr.: DNTPD), 4,4'-bis[N-(4-biphenylyl)-N-phenylamino]biphenyl (abbr.: BBPB), 4,4',4''-tri(N-carbazolyl)triphenylamine (abbr.: TCTA), or the like can be used; however, it is not limited to these. Among the above-mentioned compounds, an aromatic amine compound typified by TDATA, MTDATA, m-MTDAB, TPD, NPB, DNTPD, BBPB, TCTA, or the like easily generates holes, and is a compound group suitable for the organic compound.

As the hole injecting material, phthalocyanine compounds are effective. For example, phthalocyanine (abbr.: $H_2$-Pc), copper phthalocyanine (abbr.: Cu-Pc), and vanadyl phthalocyanine (abbr.: VOPc), or the like can be used. In addition, conductive high molecular compound compounds subjected to chemical doping, such as dioxythiophene (abbr.: PEDOT) doped with polystyrene sulfonate (abbr.: PSS) and polyaniline (abbr.: PAni), can also be used. Further, a thin film of an inorganic semiconductor such as molybdenum oxide (MoOx), vanadium oxide (VOx), or nickel oxide (NiOx) and an ultrathin film of an inorganic insulator such as aluminum oxide ($Al_2O_3$) are also effective. In addition, aromatic amine compounds such as 4,4',4''-tris(N,N-diphenyl-amino)-triphenylamine (abbr.: TDATA), 4,4',4''-tris[N-(3-methylphenyl)-N-phenyl-amino]-triphenylamine (abbr.: MTDATA), N,N'-bis(3-methylphenyl)-N,N'-diphenyl-1,1'-biphenyl-4,4'-diamine (abbr.: TPD), 4,4'-bis[N-(1-naphthyl)-N-phenylamino]-biphenyl (abbr.: α-NPD), and 4,4'-bis [N-(4-(N,N-di-m-tolyl)amino)phenyl-N-phenylamino]biphenyl (abbr.: DNTPD) can also be used. Further, these hole transporting materials and hole injecting materials may be doped with an acceptor substance. For example, VOPc doped with 2,3,5,6-tetrafluoro-7,7,8,8-tetracyanoquinodimethane (abbr.: $F_4$-TCNQ) that is an acceptor and α-NPD doped with MoOx that is an acceptor may be used.

Figure 3A:
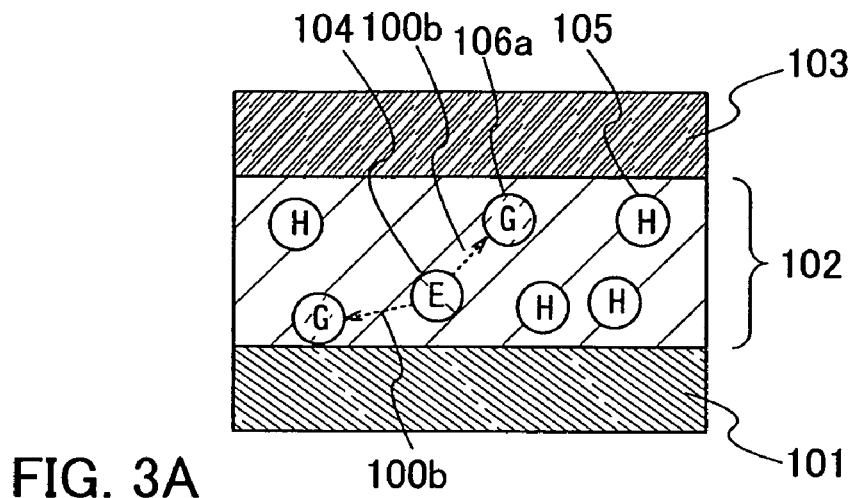
FIGS. 3A to 3C are cross-sectional views describing a memory element of this invention.
Figure 3B:
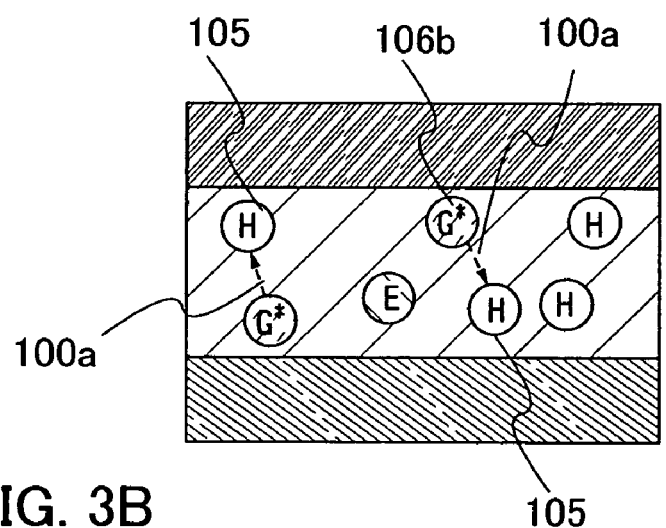
Figure 3C:
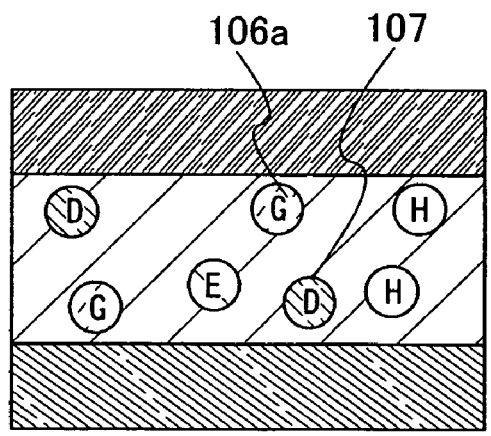

Subsequently, data writing of a memory element of this embodiment mode is described. As shown in FIG. 3A, by applying voltage to the first conductive layer 101 and the second conductive layer 103 to generate potential difference between the both conductive layers, holes and electrons are recombined in the light emitting material 104 including an organic compound layer.

When the recombination energy 100b of the light emitting material moves to the photosensitized oxidation reduction agent 106a, the photosensitized oxidation reduction agent 106a comes to an excited state 106b and generates excitation energy.

Then, reaction of the substance 105 is promoted by the excitation energy 100a of the photosensitized oxidation reduction agent in the excited state 106b, and at least one part of the product 107 of the substance 105 is formed. As a typical example of the product, a material in which a substance is decomposed, a material in which a substance is structurally changed, a material in which de-doping of metal is performed from a metal complex, or the like is given.

The conductivity of the product 107 of the substance 105 is different from the conductivity of the substance 105. Therefore, electric resistance of the memory element is changed by applying voltage to the first conductive layer and the second conductive layer and generating the product 107. Typically, increase of the resistance which causes insulation, or decrease of the resistance is given. Specifically, voltage is applied to the first conductive layer 101 and the second conductive layer 103, electrons and holes are recombined in the light emitting material and the recombination energy is transferred to the photosensitized oxidation reduction agent. As a result, the photosensitized oxidation reduction agent comes to an excited state, the substance is reacted by the excitation energy, electric resistance of the memory element is changed by forming the product, and data can be written in.

The data of the memory element can be read out by reading the difference between the electric resistance of the memory element before writing in and after writing in.

The memory element having a layer including the light emitting material, the photosensitized oxidation reduction agent, or the organic compound having a substance can control the recombination of electrons and holes in the light emitting material. Thus, recombination probability of the holes and the electrons can be increased.

Embodiment Mode 4

In this embodiment mode, a memory element in which an organic compound layer has a first layer formed of a light emitting material and a second layer formed of a substance and a photosensitized oxidation reduction agent with reference to FIGS. 4A to 4C to FIGS. 7A and 7B, in comparison with Embodiment Mode 1.

The memory element of this embodiment mode is formed of a first conductive layer 101, a first layer 111 having contact with the first conductive layer, a second layer 112 having contact with the first layer 111, and a second conductive layer 103 having contact with the second layer 112. Here, the first layer 111 is a layer formed of a light emitting material 104, and the second layer 112 is a layer formed of a substance 105 and a photosensitized oxidation reduction agent 106a. Further, the first conductive layer 101, the second conductive layer 103, the light emitting material 104, a substance 105, and the photosensitized oxidation reduction agent 106a are formed of the same material used in Embodiment Mode 1 to Embodiment Mode 3.

Here, the second layer 112 formed of the substance 105 and the photosensitized oxidation reduction agent 106a which are interposed between the first layer 111 formed of the light emitting material 104 and the second conductive layer 103 functioning as a cathode. Therefore, the first layer 111 preferably functions as a hole transporting and/or injecting layer, and the second layer preferably functions as an electron transporting and/or injecting layer. Thus, in this embodiment mode, the light emitting material 104 is preferably formed of one or more selected from the hole transporting materials and hole injecting materials shown in Embodiment Mode 3. The second layer functions as an electron transporting layer and/or an electron injecting layer in accordance with a mixture ratio of the photosensitized oxidation reduction agent and the substance.

Figure 4A:
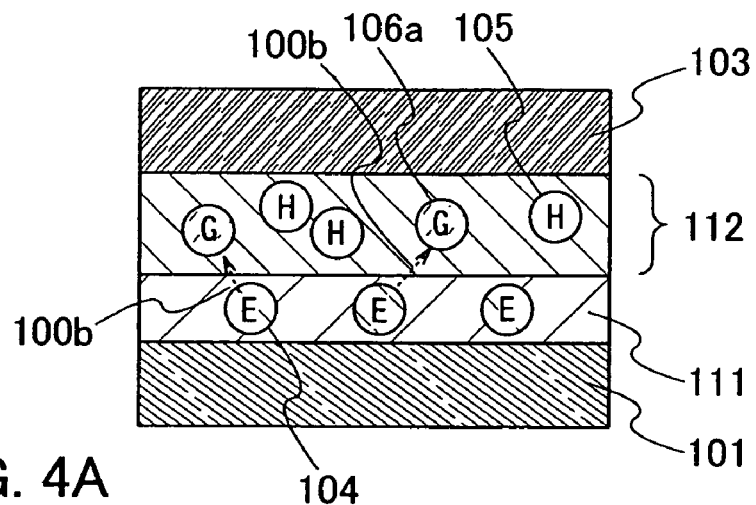
FIGS. 4A to 4C are cross-sectional views describing a memory element of this invention.
Figure 4B:
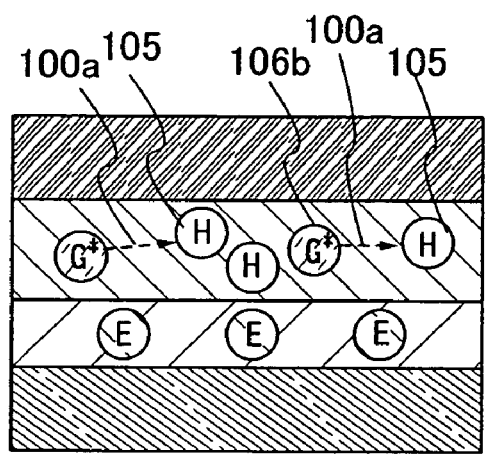

Subsequently, data writing of a memory element of this embodiment mode is described. As shown in FIG. 4A, by applying voltage to the first conductive layer 101 and the second conductive layer 103 to generate potential difference between the both conductive layers, holes and electrons are recombined in the first layer 111, and recombination energy 100b is generated. By moving the recombination energy to the photosensitized oxidation reduction agent 106a, as shown in FIG. 4B, the photosensitized oxidation reduction agent 106a comes to an excited state 106b. Note that when holes and electrons are recombined and emit light, the photosensitized oxidation reduction agent is irradiated with emission energy, and the photosensitized oxidation reduction agent 106a comes to the excited state.

Figure 4C:
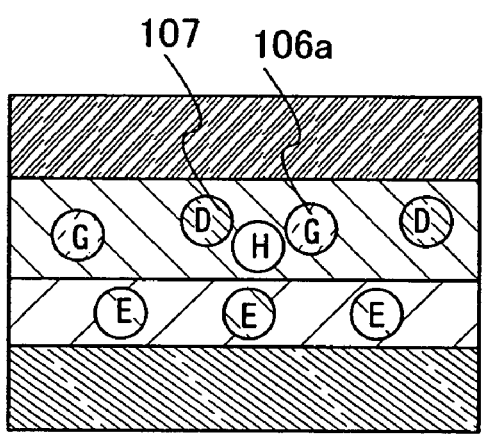

The reaction of the substance 105 is promoted by the excitation energy 100a of the photosensitized oxidation reduction agent in an excited state 106b, and a product 107 is formed as shown in FIG. 4C.

The conductivity of the product 107 of the substance is different from the one of the substance 105. Consequently, by applying voltage to the first conductive layer 101 and the second conductive layer 103 to generate the product 107, electric resistance of the memory element is changed as in the case of Embodiment Mode 1. Typically, increase of the resistance which causes insulation, or decrease of the resistance is given. The data can be written by the resulting change in the electric resistance by the applied voltage to the first conductive layer 101 and the second conductive layer 103.

The data of the memory element can be read out by reading the difference between the electric resistance of the memory element before writing in and after writing in.

Figure 5A:
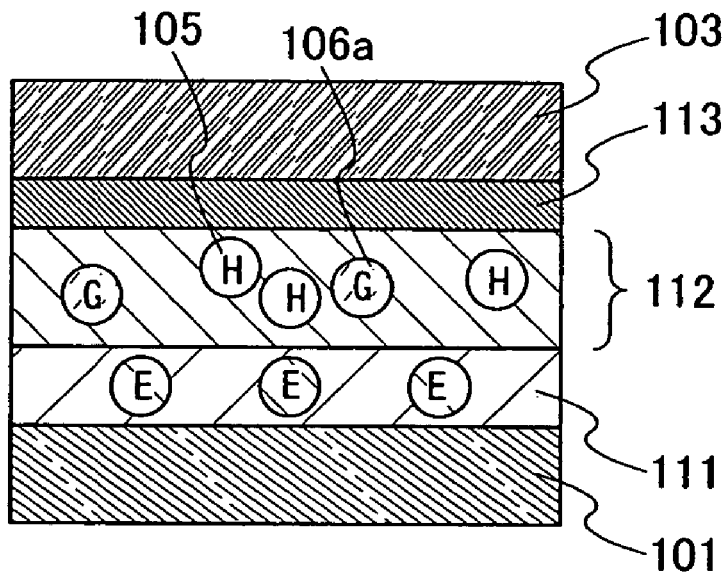
FIGS. 5A and 5B are cross-sectional views describing a memory element of this invention.

As shown in FIG. 5A, an electron injecting layer 113 may be provided between the second conductive layer 103 and the second layer 112. The electron injecting layer 113 can be formed by using the above mentioned electron injecting materials.

Figure 5B:
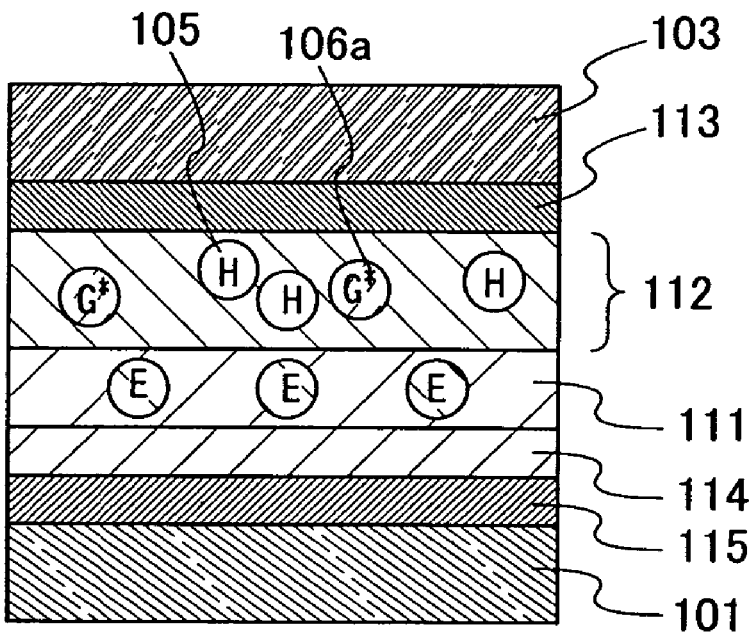

Furthermore, as shown in FIG. 5B, as the electron injecting layer 113 is provided between the second conductive layer 103 and the second layer 112, a hole injecting layer 115 and a hole transporting layer 114 may be provided between the first conductive layer 101 and the first layer 111. The hole injecting layer 115 can be formed using the above mentioned hole injecting materials. The hole transporting layer 114 can be formed using the above mentioned hole transporting material.

Figure 6A:
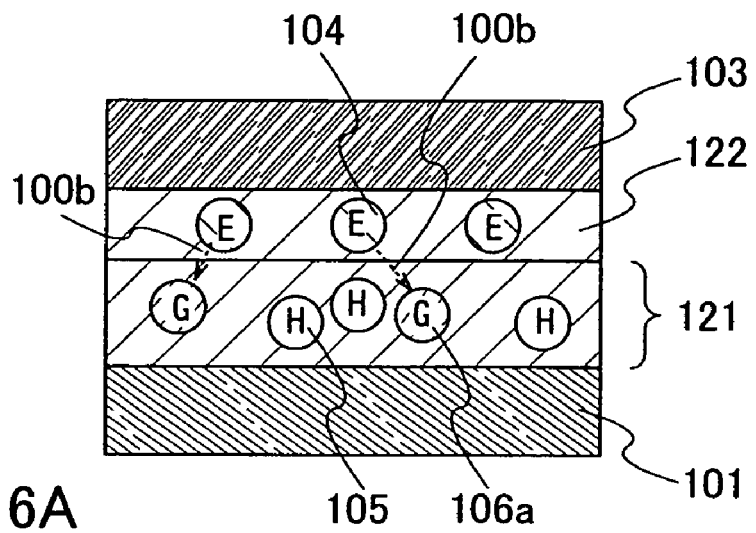
FIGS. 6A to 6C are cross-sectional views describing a memory element of this invention.

As shown in FIG. 6A, the memory element may be formed of the first conductive layer 101, the first conductive layer 121 having contact with the first conductive layer, the second layer 122 having contact with the first conductive layer 121, and the second conductive layer 103 having contact with the second layer 122. The second layer 122 is formed of the light emitting material 104. The first conductive layer 101, the second conductive layer 103, the light emitting material 104, the substance 105, and the photosensitized oxidation reduction agent 106a are formed using the same materials described in Embodiment Mode 1 to Embodiment Mode 3.

Here, the first layer 121 formed of the substance 105 and the photosensitized oxidation reduction agent 106a is interposed between the second layer 122 formed of the light emitting material 104 and the first conductive layer 101 functioning as an anode. Therefore, the first layer 121 preferably functions as a hole transporting and/or injecting layer, and the second layer preferably functions as an electron transporting and/or injecting layer. The light emitting material 104 is preferably formed of the one or more selected from the electron transporting materials and the electron injecting materials shown in Embodiment Mode 3. Note that the first layer 121 may have a light emitting material. The second layer 122 functions as a hole transporting layer or a hole injecting layer in accordance with a mixture ratio of the photosensitized oxidation reduction agent to the substance.

Figure 7A:
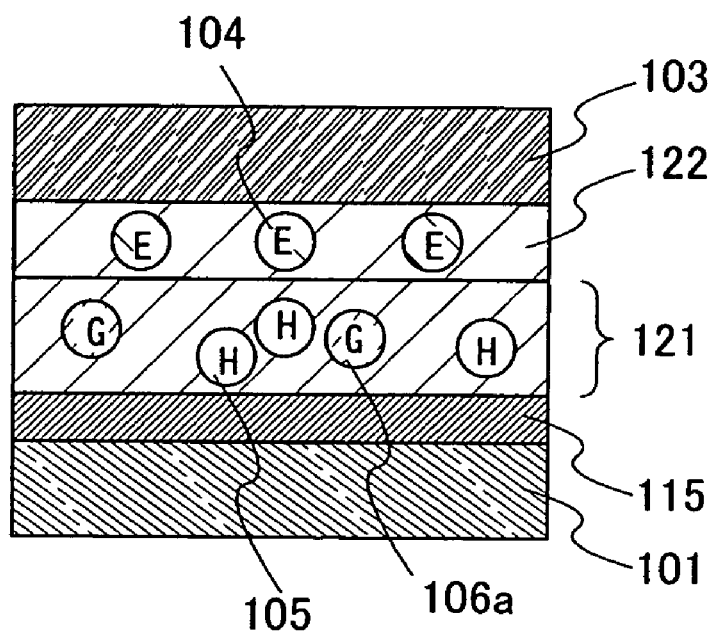
FIGS. 7A and 7B are cross-sectional views describing a memory element of this invention.

As shown in FIG. 7A, a hole injecting layer 115 may be provided between the first conductive layer 101 and the first layer 121. The hole injecting layer 115 can be formed by properly using the hole injecting materials.

Figure 7B:
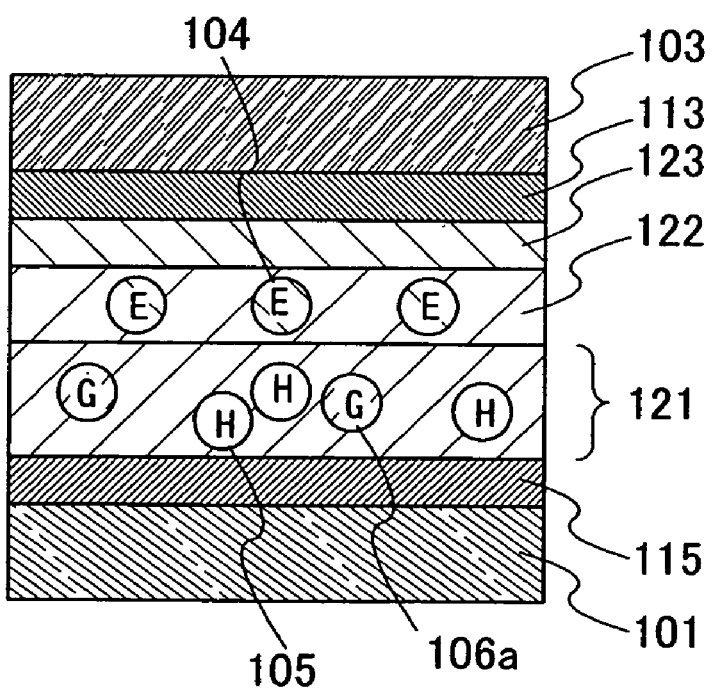

As shown in FIG. 7B, as the hole injecting layer 115 is provided between the first conductive layer 101 and the first layer 121, an electron transporting layer 123 and the electron injecting layer 113 may be provided between the second conductive layer 103 and the second layer 122. The electron injecting layer 113 can be formed by properly using the above mentioned electron injection materials. The electron transporting layer 123 can be formed by properly using the above mentioned electron transporting materials.

Figure 6B:
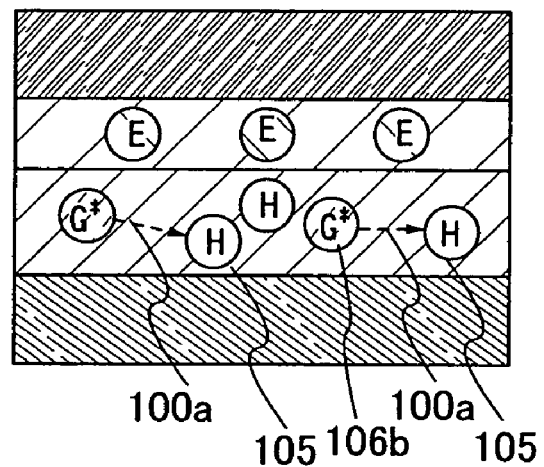
Figure 6C:
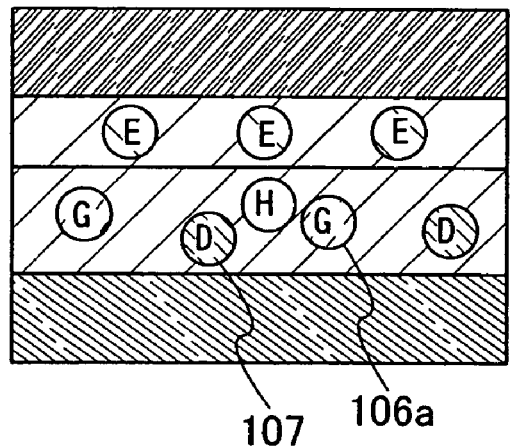

A writing method and a reading method are similar to the memory element shown in FIGS. 4A to 4C. To be concrete, as shown in FIG. 6A and FIG. 7A, by applying voltage to the first conductive layer 101 and the second conductive layer 103 to generate potential difference between the conductive layers, holes and electrons are recombined in the second layer 122. By moving the recombination energy to the photosensitized oxidation reduction agent 106a, the photosensitized oxidation reduction agent comes to an excited state 106b as shown in FIG. 6B and FIG. 7A. Subsequently, reaction of the substance 105 is promoted by the excitation energy of the photosensitized oxidation reduction agent in the excited state 106b, and a product 107 is generated as shown in FIG. 6C and FIG. 7C.

The conductivity of the product 107 of the substance is different from the one of the substance 105. Consequently, by applying voltage to the first conductive layer 101 and the second conductive layer 103 to generate the product 107, electric resistance of the memory element is changed as in the case of Embodiment Mode 1. Typically, increase of the resistance which causes insulation, or decrease of the resistance is given. The data can be written in by the resulting change in the electric resistance by the applied voltage to the first conductive layer 101 and the second conductive layer 103.

The data of the memory element can be read out by reading the difference between the electric resistance of the memory element before writing in and after writing in.

Figure 8:
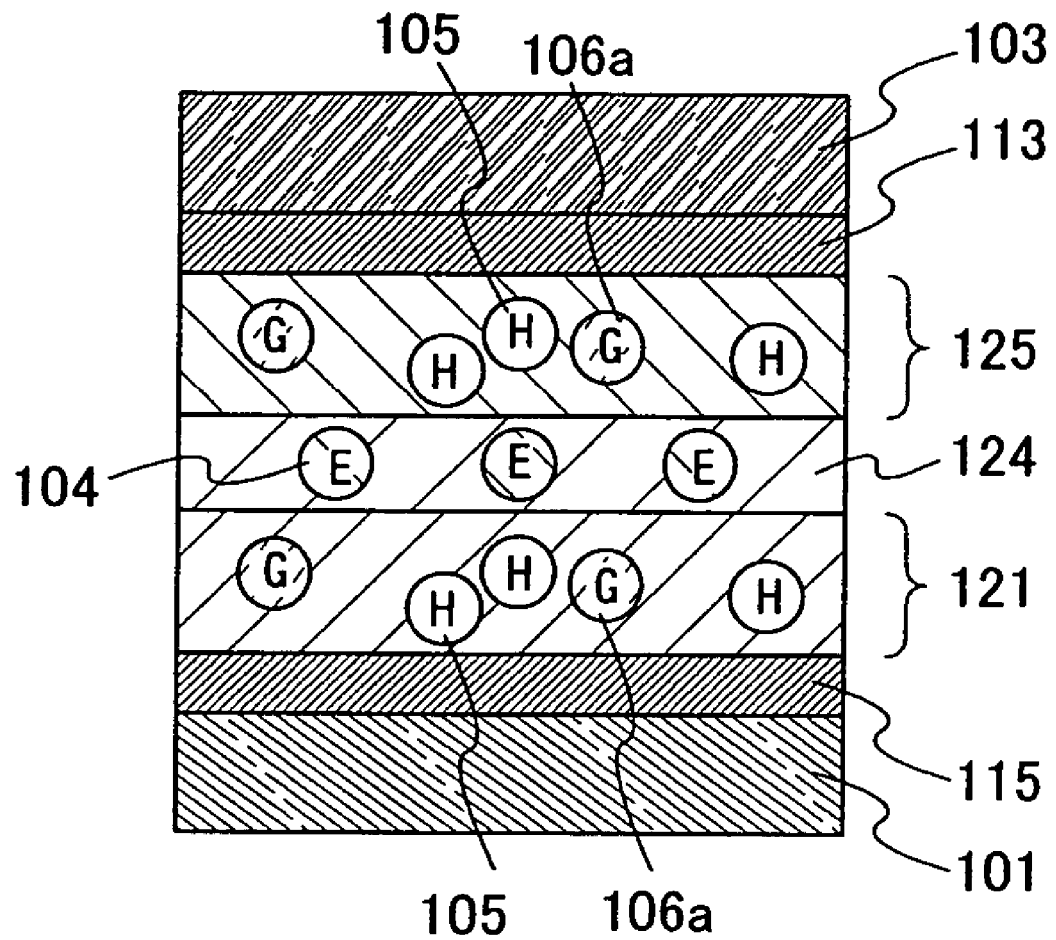
FIG. 8 is a cross-sectional view describing a memory element of this invention.

As shown in FIG. 8, the memory element may be formed of the first conductive layer 101, the hole injecting layer 115 having contact with the first conductive layer, the first layer 121 having contact with the hole injecting layer 115, a second layer 124 having contact with the first layer 121, a third layer 125 having contact with the second layer 124, the electron injecting layer 113 having contact with the third layer, and the second conductive layer 103 having contact with the electron injection layer 113. Here, the first layer 121 is a layer formed of the substance 105 and the photosensitized oxidation reduction agent 106a, and functions as a hole transporting and/or injecting layer here. The second layer 124 is a layer formed of the light emitting material 104. The third layer 125 is a layer formed of the substance 105 and the photosensitized reducing agent 106a, and functions as an electron transporting and/or injecting layer.

By laminating the layer formed of the light emitting material and the layer having the substance and the photosensitized oxidation reduction agent as described in this embodiment mode, holes or electrons which pass through the layer having the substance and the photosensitized oxidation reduction agent without being recombined can be recombined in the layer formed of the light emitting material. Therefore, recombination probability can be heightened, and accordingly, writing of the memory element can be performed easily.

Embodiment Mode 5

In this embodiment mode, a memory element in which a light emitting element portion having an organic compound layer formed of a light emitting material and a memory element portion having an organic compound layer formed of a photosensitized oxidation reduction agent and a substance are connected with a light-transmitting conductive layer which is a common electrode is described with reference to FIGS. 10A to 10C and FIGS. 11A to 11C. In this embodiment mode, one of the electrodes of the light emitting element portion and one of the electrodes of the memory element portion are to be a common electrode, and formed of a material having a light-transmitting property, therefore, the photosensitized oxidation reduction agent in the memory element can be irradiated with light emitted from a light emitting element, and the photosensitized oxidation reduction agent can be in an excited state.

The memory element of this embodiment mode is formed of a first conductive layer 101, a first layer 142 having contact with the first conductive layer, a conductive layer 141 having a light-transmitting property and having contact with the first layer 142, a second layer 143 having contact with the conductive layer 141 having a light-transmitting property, and a second conductive layer 103 having contact with the second layer 143. Here, the first conductive layer 101, the first layer 142 having contact with the first conductive layer, and the conductive layer 141 having a light-transmitting property and having contact with the first layer 142 function as a light emitting element portion, and the conductive layer 141 having a light-transmitting property, the second layer 143 having a light-transmitting property and having contact with the conductive layer 141, and the second conductive layer 103 having contact with the second layer 143 each function as a memory element portion.

The first layer 142 of the light emitting element portion is a layer formed of a light emitting material 104. In particular, the first layer 142 is preferably formed with a hole injection layer 142a, a hole transporting layer 142b, a light emitting layer 142c, an electron transporting layer 142d, and an electron injecting layer 142e. By applying such a structure, electrons and holes are recombined in the light emitting layer 142c when voltage is applied to the first conductive layer 101 and the second conductive layer 103.

The second layer 143 is a layer formed with a substance 105 and a photosensitized oxidation reduction agent 106a.

The conductive layer 141 having a light-transmitting property is formed by properly using ITO, indium tin oxide including silicon, indium oxide including 2 to 20% of zinc oxide (ZnO), or the like. Furthermore, titanium, molybdenum, tungsten, nickel, gold, platinum, silver, aluminum, lithium, magnesium, calcium, barium, and alloy thereof, or the like, each of which has a thin film thickness and which can transmit light (typically 1 nm to 10 nm film thickness) can be used for forming the conductive layer 141.

Figure 10A:
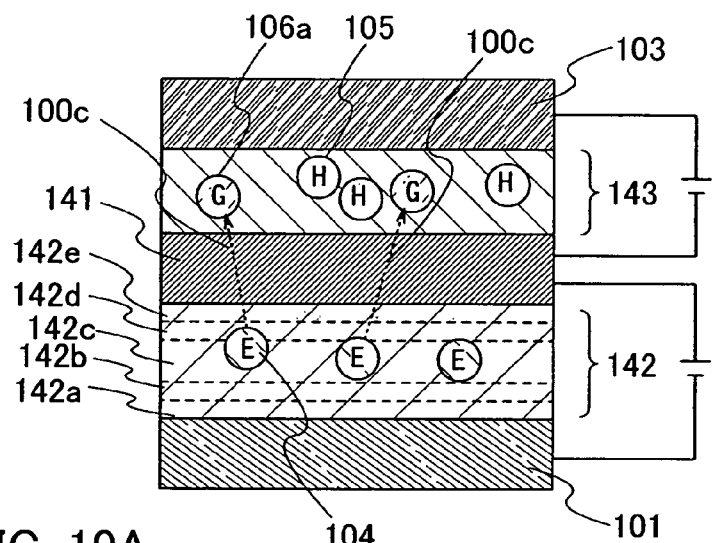
FIGS. 10A to 10C are cross-sectional views describing a memory element of this invention.

Subsequently, data writing of the memory element of this embodiment mode is described. As shown in FIG. 10A, by applying voltage to the first conductive layer 101 and the conductive layer 141 having a light-transmitting property to generate potential difference between the conductive layers, holes and electrons are recombined in the first layer 142, the light emitting material 104 emits light, and light energy 100c is generated.

Figure 10B:
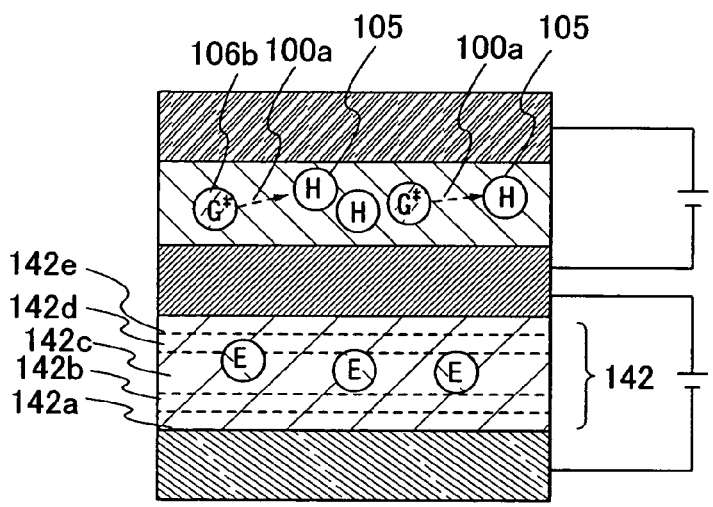

When the photosensitized oxidation reduction agent 106a of the second layer 143 is irradiated with light emitted from the light emitting material 104, A shown in FIG. 10B, the photosensitized oxidation reduction agent 106a comes to an excited state 106b by the light energy.

Figure 10C:
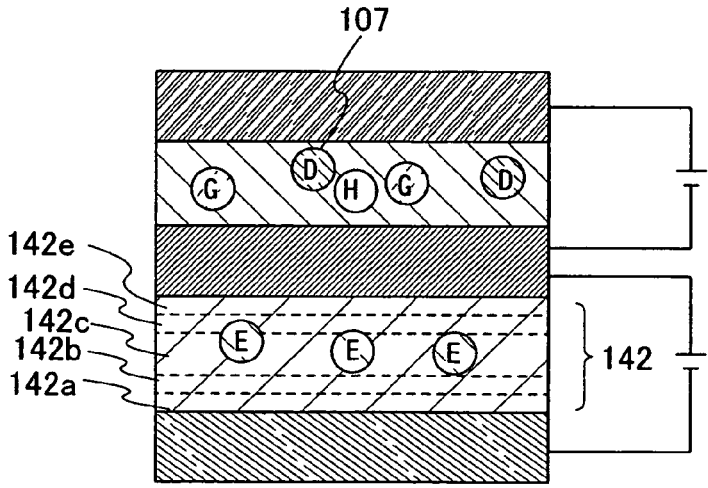

Then, reaction of the substance 105 is promoted by excitation energy 100a of the photosensitized oxidation reduction agent in the excited state 106b, and a product 107 is generated as shown in FIG. 10C.

The conductivity of the product 107 of the substance is different from the one of the substance 105. Therefore, electric resistance of the memory element is changed similarly to Embodiment Mode 1 by applying voltage to the first conductive layer 101 and the second conductive layer 103 to generate the product 107. Typically, increase of the resistance which causes insulation, decrease of the resistance or the like is given. Therefore, data can be written in by the change of the electric resistance due to the applied voltage to the first conductive layer 101, the conductive layer 141 having a light-transmitting property, and the second conductive layer 103.

Note that data of the memory element can be read out by reading out the difference between the electric resistance of the memory element before writing in and the electric resistance of the memory element after writing in.

Figure 11A:
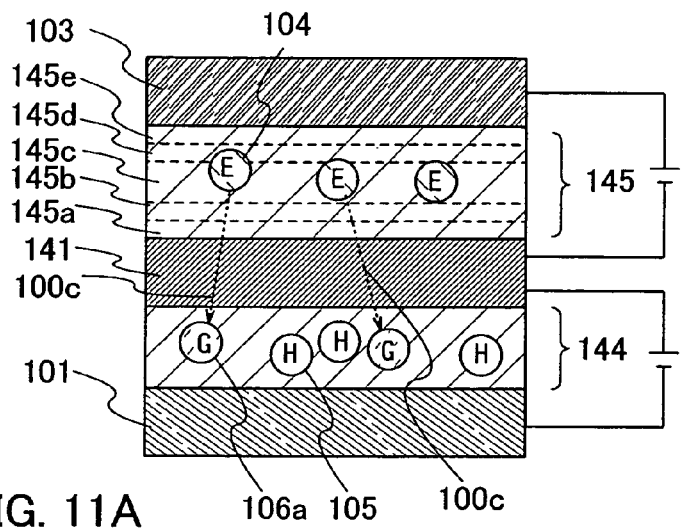
FIGS. 11A to 11C are cross-sectional views describing a memory element of this invention.

As shown in FIG. 11A, the memory element can be formed of the first conductive layer 101, the first layer 144 having contact with the first conductive layer, the conductive layer 141 having a light-transmitting property and having contact with the first layer 144, the second layer 145 having a light-transmitting property and having contact with the conductive layer 141, and the second conductive layer 103 having contact with the second layer 145.

Here, the first conductive layer 101, the first layer 144 having contact with the first conductive layer, and the conductive layer 141 having contact with the first layer 144 and having a light-transmitting property function as a memory element portion, and the conductive layer 141 having a light-transmitting property, the second layer 145 having a light-transmitting property and having contact with the conductive layer 141, and the second conductive layer 103 having contact with the second layer 145 function as a light emitting element portion. Further, voltage is applied only to the second conductive layer 103 and the conductive layer 141 having a light-transmitting property.

The first layer 144 is a layer formed of the substance 105 and the photosensitized oxidation reduction agent 106a.

The first layer 145 which is one part of the light emitting element is a layer formed of a light emitting material 104. To be concrete, it is preferably formed of a hole injecting layer 145a, a hole transporting layer 145b, a light emitting layer 145c, an electron transporting layer 145d and an electron injecting layer 145e. By employing such a structure, recombination of electrons and holes are generated in the light emitting layer 145c when voltage is applied to the first conductive layer and the second conductive layer.

The writing method and the reading method are similar to the memory element shown in FIGS. 10A to 10C. To be concrete, as shown in FIG. 11A, by applying voltage to the first conductive layer 101, the conductive layer 141 having a light-transmitting property, and the second conductive layer 103 to generate potential difference between the conductive layers, holes and electrons are recombined in the second layer 145, the light emitting material 104 emits light, and light energy 100c is generated.

Figure 11B:
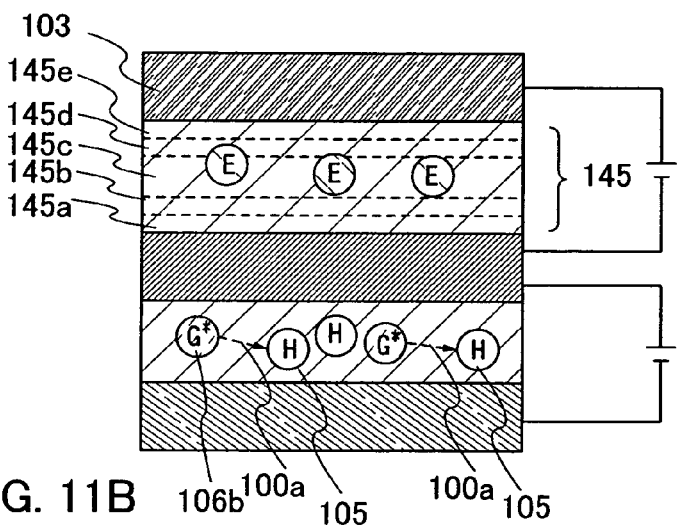

When the photosensitized oxidation reduction agent 106a of the first layer 144 is irradiated with the light emitted from the light emitting material 104, the photosensitized oxidation reduction agent 106a comes to an excited state 106b as shown in FIG. 11B.

Figure 11C:
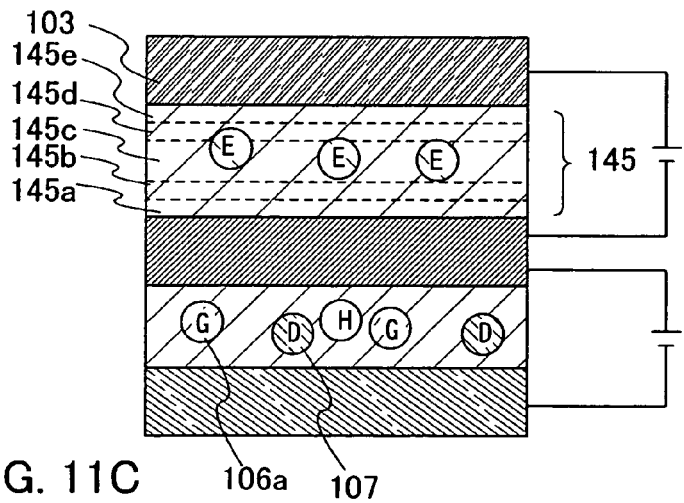

Then, reaction of the substance 105 is promoted by the excitation energy 100a of the photosensitized oxidation reduction agent in the excited state 106b, and a product 107 is formed as shown in FIG. 11C.

The conductivity of the product 107 of the substance is different from the one of the substance 105. Therefore, electric resistance of the memory element is changed by applying voltage to the first conductive layer 101 and the second conductive layer 103 to generate the product 107. Typically, increase of the resistance which causes insulation, or decrease of the resistance is given. Therefore, data can be written in by the change of the electric resistance due to the applied voltage to the first conductive layer 101, conductive layer 141 having a light-transmitting property, and the second conductive layer 103.

Note that data of the memory element can be read out by reading the difference between the electric resistance of the memory element before being writing in and the electric resistance of the memory element after writing in.

In the memory element of this embodiment mode, a light emitting element portion having an organic compound layer formed of a light emitting material and a memory element portion having an organic compound layer formed of a photosensitized oxidation reduction agent and a substance are connected with a conductive layer having a light-transmitting property which is a common electrode. Therefore, voltage can be applied to each of the light emitting portion and the memory element portion. Here, since voltage that is enough for light emission in the light emitting element portion is applied, energy can be easily generated when holes and electrons are recombined. Furthermore, a photosensitized oxidation reduction agent and a substance are not included in the light emitting element portion. Thus, data writing into the memory element can be performed at low voltage compared to the case in Embodiment Mode 4. Furthermore, since a memory element itself emits light and data can be written using the emitted light without providing a light irradiation device to perform writing outside, miniaturization and high integration of a memory device and a semiconductor device are possible.

Embodiment Mode 6

In this embodiment mode, the second layer 143 formed of the substance 105 and the photosensitized oxidation reduction agent 106a shown in Embodiment Mode 5 and FIGS. 10A to 10C, and the first layer 144 formed of the substance 105 and the photosensitized oxidation reduction agent 106a shown in Embodiment Mode 5 and FIGS. 11A to 11C have a light emitting material.

The memory element of this embodiment mode is formed of a first conductive layer 101, a first layer 142 having contact with the first conductive layer 101, a conductive layer 141 having contact with the first layer 142 and having a light-transmitting property, a second layer 146 having a light-transmitting property and having contact with the conductive layer 141, and a second conductive layer 103 having contact with the second layer 146. Here, the first layer 142 is a layer formed of a light emitting material 104, and the second layer 143 is a layer formed of a substance 105, a photosensitized oxidation reduction agent 106, and a light emitting material 147.

Figure 12A:
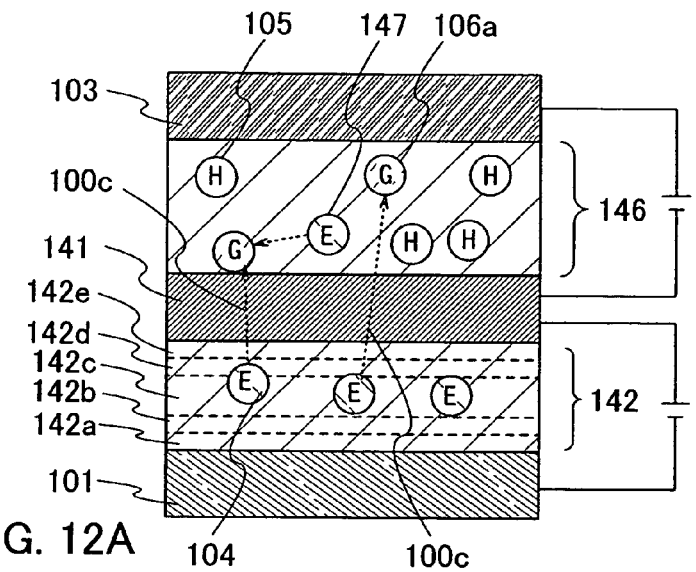
FIGS. 12A to 12C are cross-sectional views describing a memory element of this invention.
Figure 12B:
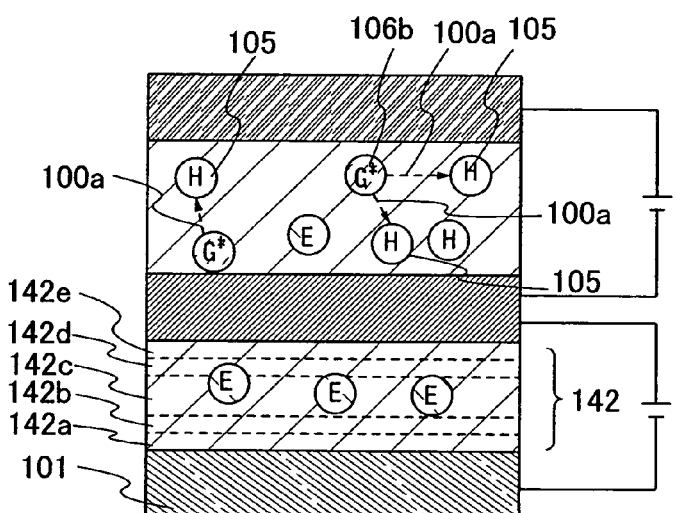
Figure 12C:
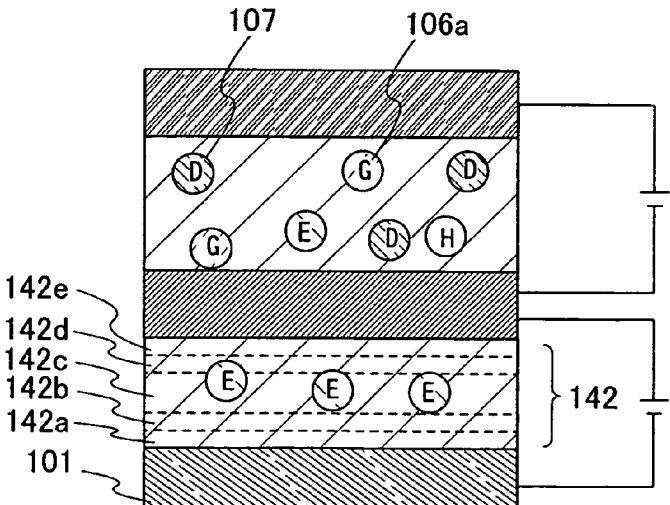

The first layer 142 is a layer formed of a light emitting material 104 and has the same structure as that of FIGS. 12A to 12C.

Subsequently, data writing of a memory element of this embodiment mode is described. As shown in FIG. 12A, by applying voltage to the first conductive layer 101, the conductive layer 141 having a light-transmitting property and the second conductive layer 103 to generate potential difference between the first conductive layer 101 and the conductive layer 141 having a light-transmitting property and between the conductive layer 141 having a light-transmitting property and the second conductive layer 103, holes and electrons are recombined in the light emitting material 104 of the first layer 142, the light emitting material 104 emits light, and holes and electrons are also recombined and emit light in the light emitting material 147 of the second layer 148 at the same time, thereby generating light energy 100c.

When the photosensitized oxidation reduction agent 106a of the second layer 146 is irradiated with light emitted from the light emitting materials 104 and 147, as shown in FIG. 12B, the photosensitized oxidation reduction agent 106a come to an excited state 106b and has excitation energy 100a. When the light emitting material 147 comes into contact with the photosensitized oxidation reduction agent 106a, recombination energy moves to the photosensitized oxidation reduction agent 106a even if the light emitting material 147 does not emit light.

Then, reaction of the substance 105 is promoted by the excitation energy 100a of the photosensitized oxidation reduction agent in an excited state 106b, and a product 107 is formed as shown in FIG. 12C.

The conductivity of the product 107 of the substance is different from that of the substance 105. Therefore, electric resistance of the memory element is changed by applying voltage to the first conductive layer 101 and the second conductive layer 103 to generate the product 107 in a similar manner to that in Embodiment Mode 1. Typically, increase of the resistance which causes insulation, or decrease of the resistance is given. Therefore, data can be written in by the change of the electric resistance due to the applied voltage to the first conductive layer 101, the conductive layer 141 having a light-transmitting property, and the second conductive layer 103.

Note that data of the memory element can be read out by reading the difference in the electric resistance of each memory element.

Figure 13A:
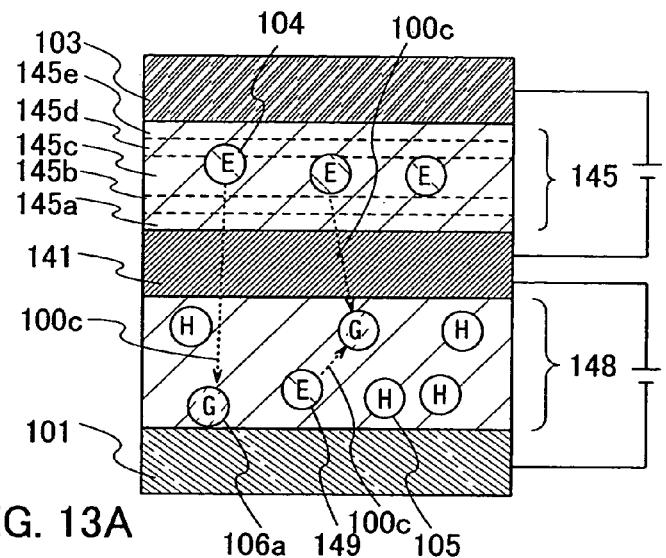
FIGS. 13A to 13C are cross-sectional views describing a memory element of this invention.

As shown in FIG. 13A, the memory element may be formed of the first conductive layer 101, a first layer 148 having contact with the first conductive layer 101, the conductive layer 141 having a light-transmitting property and having contact with the first layer 148, a second layer 145 having a light-transmitting property and having contact with the conductive layer 141, and the second conductive layer 103 having contact with the second layer 145. Here, the first layer 148 is a layer formed of a substance 105, a photosensitized oxidation reduction agent 106a, and a light emitting material 149. Furthermore, a second layer 145 is a layer formed of the light emitting material 104.

The writing method and the reading method are similar to the memory element shown in FIGS. 12A to 12C. To be concrete, as shown in FIG. 13A, by applying voltage to the first conductive layer 101, the conductive layer 141 having a light-transmitting property, and the second conductive layer 103 to generate potential difference between the first conductive layer 101 and the conductive layer 141 having a light-transmitting property and between the conductive layer 141 having a light-transmitting property and the second conductive layer 103, holes and electrons are recombined in the light emitting material 104 of the second layer 145, the light emitting material 104 emits light, holes and electrons are also recombined in the light emitting material 147 of the first layer 148 and emit light, and light energy 100c is generated.

Figure 13B:
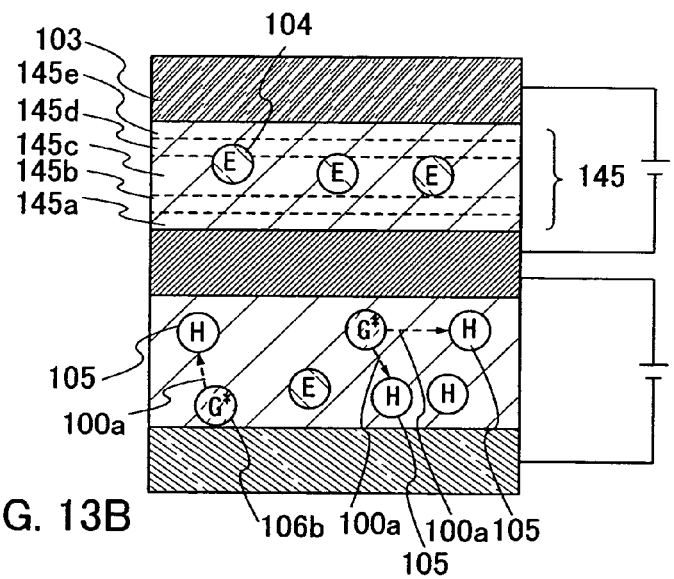

When the photosensitized oxidation reduction agent 106a of the first layer 148 is irradiated with light emitted from the light emitting materials 104 and 147, as shown in FIG. 13B, the photosensitized oxidation reduction agent 106a comes to an excited state 106b and has excitation energy 100a. When the light emitting material 147 comes into contact with the photosensitized oxidation reduction agent 106a, recombination energy moves to the photosensitized oxidation reduction agent 106a even if the light emitting material 147 does not emit light.

Figure 13C:
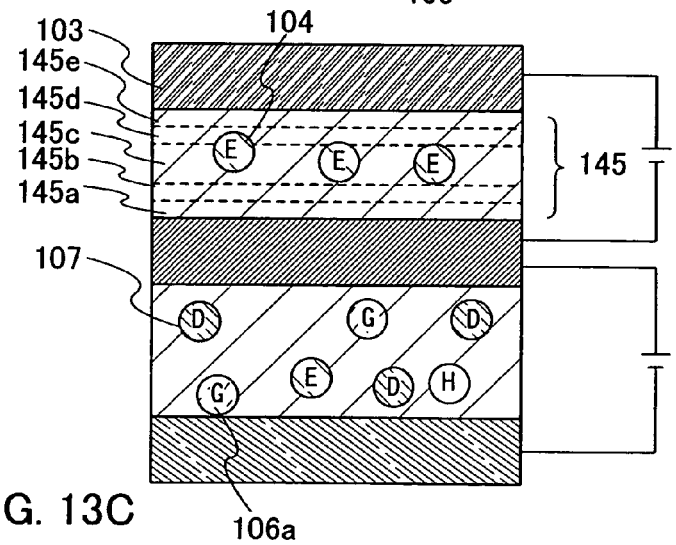

Then, reaction of the substance 105 is promoted by the excitation energy of the photosensitized oxidation reduction agent in an excited state 106b, and a product 107 is formed as shown in FIG. 13C.

The conductivity of the product 107 of the substance is different from the one of the substance 105. Therefore, electric resistance of the memory element is changed by applying voltage to the first conductive layer and the second conductive layer to generate the product 107 as shown in Embodiment Mode 1. Typically, increase of the resistance which causes insulation, or decrease of the resistance is given. Therefore, data can be written in by the change of the electric resistance due to the applied voltage to the first conductive layer 101, the conductive layer 141 having a light-transmitting property, and the second conductive layer 103.

Note that data of the memory element can be read out by reading the difference in the electric resistance of each memory element.

In the memory element of this embodiment mode, a light emitting element portion having an organic compound layer formed of a light emitting material and a memory element portion having an organic compound layer formed of a photosensitized oxidation reduction agent and a substance are connected with a conductive layer having a light-transmitting property which is a common electrode. Furthermore, the layer formed of the substance and the photosensitized oxidation reduction agent in the memory element portion includes a light emitting material, and recombination energy generated by the recombination of the light emitting material in the layer moves to the photosensitized oxidation reduction agent 106a. Therefore, the photosensitized oxidation reduction agent can come to an excited state by even more recombination energy. As a result, data writing at low voltage is possible and writing success can be heightened. Moreover, the memory element itself emits light and data can be written in using the light without providing a light irradiation device outside, and therefore, miniaturization and integration of the memory device and the semiconductor device can be obtained.

Embodiment Mode 7

In the memory element shown in Embodiment Modes 1 to 6, a charge transport layer formed of an inorganic compound and an organic compound may be provided between a first conductive layer and an organic compound layer. A charge transport layer formed of an inorganic compound and an organic compound may be provided between a second conductive layer and an organic compound layer. Furthermore, a charge transport layer formed of an inorganic compound and an organic compound may be provided between the first conductive layer and the organic compound layer and between the second conductive layer and the organic compound layer, respectively. Note that description of this embodiment mode is provided with reference to Embodiment Mode 1; however, the embodiment mode can also adapt to Embodiment Mode 2 to Embodiment Mode 6.

Figure 9A:
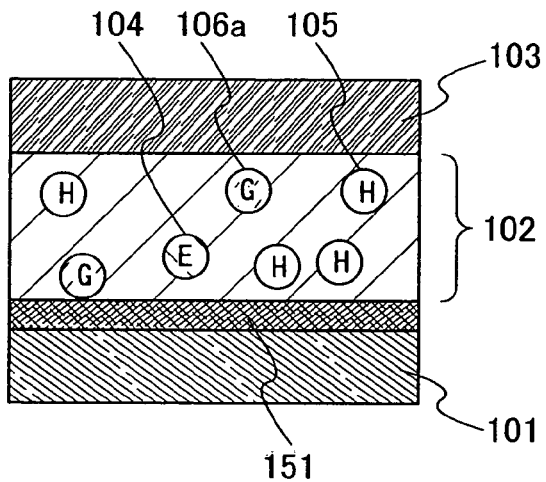
FIGS. 9A to 9C are cross-sectional views describing a memory element of this invention.

In the memory element shown in FIG. 9A, a hole transporting layer 151 is included between a first conductive layer 101 functioning as an anode and an organic compound layer 102. The hole transporting layer 151 has a structure including an organic compound and an inorganic compound having an electron-accepting property with respect to the organic compound. By mixing the inorganic compound having the electron-accepting property to the organic compound, a large number of holes are generated in the organic compound and excellent hole injecting and/or transporting properties can be given.

Since holes are generated in the organic compound, as the organic compound, the above mentioned organic compound having a hole transporting property is properly used to form the organic compound. As the inorganic compound, anything which can easily receive electrons from the organic compound is fine to be used. For example, various metal oxides and metal nitrides can be used, however, any transition metal oxide belonging group 4 to group 12 of the periodic table easily gives electron-accepting property, and are preferable. To be concrete, titanium oxide, zirconium oxide, vanadium oxide, molybdenum oxide, tungsten oxide, rhenium oxide, ruthenium oxide, zinc oxide and the like are given as examples. In the above mentioned metal oxides, any transition metal oxide belonging to group 4 to group 8 of the periodic table has higher electron-accepting property and are particularly preferable. In particular, vanadium oxide, tungsten oxide, and rhenium oxide are preferable since vacuum deposition is applicable and they are easy to handle.

Figure 9B:
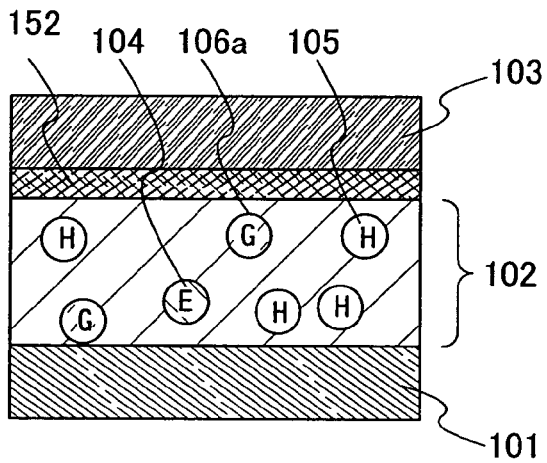

The memory element shown in FIG. 9B has an electron transporting layer 152 between a second conductive layer 103 functioning as a cathode and the organic compound layer 102. The electron transporting layer 152 has a structure including an organic compound and an inorganic compound having an electron donating property as against the organic compound. By mixing the inorganic compound having the electron donating property with respect to the organic compound, a large number of electrons are generated in the organic compound and excellent electron injecting and/or transporting properties can be given.

Since electrons are generated in the organic compound, the above mentioned organic compounds having the electron transporting property are properly used for the organic compound. Furthermore, as the inorganic compound, anything which can easily provide electrons from the organic compound is fine to be used, and various metal oxides or metal nitrides can be used. An alkali metal oxide, an alkaline earth metal oxide, a rare-earth metal oxide, an alkali metal nitride, an alkaline earth metal nitride, and a rare-earth metal nitride are preferably used since each of which gives electron-donating ability. To be concrete, lithium oxide, strontium oxide, barium oxide, erbium oxide, lithium nitride, magnesium nitride, calcium nitride, yttrium fluoride, and lanthanum nitride are given as examples. Since lithium oxide, barium oxide, erbium oxide, lithium nitride, magnesium nitride, and magnesium nitride can use vacuum evaporation and are easy to handle, they are preferably used.

Figure 9C:
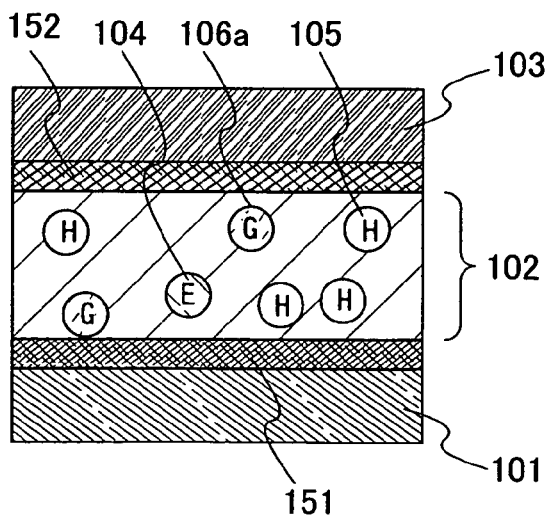

The memory element shown in FIG. 9C includes a hole transporting layer 151 between a first conductive layer 101 functioning as an anode and an organic compound layer 102, and an electron transporting layer 152 between a second conductive layer 103 functioning as a cathode and the organic compound layer 102.

Note that a hole transporting layer may be additionally formed using the above mentioned organic compounds having a hole transporting property between the hole transporting layer 151 and the organic compound layer 102. Furthermore, an electron transporting layer may be formed using the above mentioned organic compounds having an electron transporting property between the electron transporting layer 152 and the organic compound layer 102.

As described, excellent conductivity can be also obtained in the memory element by providing the charge transport layer formed using the organic compound and the inorganic compound between the conductive layer and the organic compound layer. Therefore, electrons and holes can be recombined at lower voltage than ever before, and data writing can be performed at low power consumption.

Embodiment Mode 8

In this embodiment mode, a structural example of a memory device having a memory element in the above mentioned embodiment modes is described with reference to drawings. To be concrete, the case where the structure of the memory device is a passive matrix type is described.

Figure 14A:
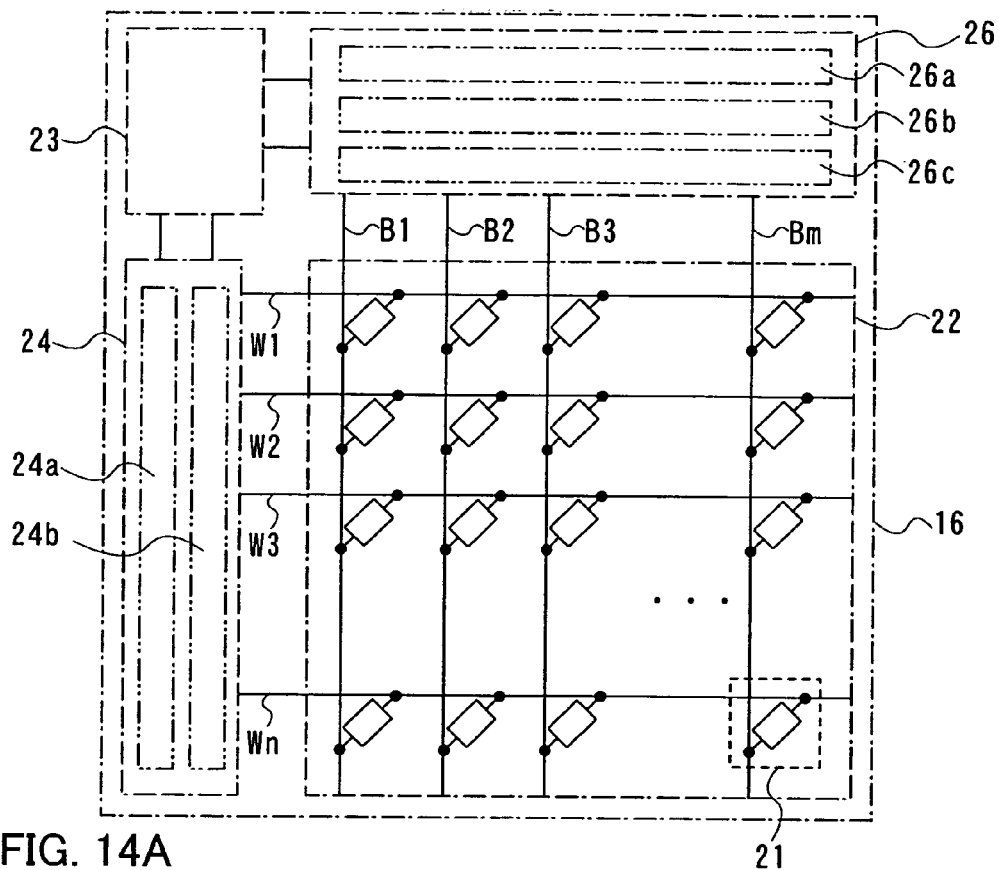
FIGS. 14A to 14C are views describing a memory device of this invention.

FIG. 14A shows one structural example of a memory device of this embodiment mode. The memory device includes a memory cell array 22 in which memory cells 21 are arranged in a matrix form, a bit line driver circuit 26 having a column decoder 26a, a readout circuit 26b, and a selector 26c, a word line driver circuit 24 having a row decoder 24a and a level shifter 24b, and an interface 23 having a write circuit and the like and communicating with an external portion. Note that the structure of the memory device 16 shown in FIG. 14A is just one example; and therefore, the memory device may further include other circuits such as a sense amplifier, an output circuit, and a buffer, or, a write circuit may be provided in the bit line driver circuit.

Each of the memory cells 21 has a first conductive layer constituting a bit line Bx ($1 \leq x \leq m$), a second conductive layer constituting a word line Wy ($1 \leq y \leq n$), and an organic compound layer. The organic compound layer is provided between the first conductive layer and the second conductive layer and includes a singe layer or a plurality of layers.

Examples of a top structure and cross-sectional structures of the memory cell array 22 are shown in FIGS. 15A to 15D. FIG. 15A shows a top structure of the memory cell array 22, FIG. 15B and FIG. 15C show cross sectional structures along a line A-B of FIG. 15A, and FIG. 15D shows a cross sectional structure along a line C-D of FIG. 15A. Note that an insulating layer 27 functioning as a protection film is not shown in FIG. 15A.

In the memory cell array 22, the memory cells 21 are provided in a matrix form (see FIG. 15A). Each of the memory cells 21 has a memory element 80 (see FIG. 15B). Over a substrate 30, the memory element 80 includes a first conductive layer 31 extending in a first direction, an organic compound layer 29 covering the first conductive layer 31, and a second conductive layer 28 extending in a second direction orthogonal to the first direction. Further, here, an insulating film 27 functioning as a protection film is formed to cover the second conductive layer 28.

The memory elements shown in Embodiment Mode 1 to 7 can be properly used as the memory element 80.

In the above memory element, an element having a rectifying property may be provided at the opposite side of the organic compound layer 29 through the first conductive layers 31. The element having the rectifying property is a transistor whose gate electrode and drain electrode are connected to each other, a diode, or the like. As a typical diode, a PN junction diode, a PIN junction diode, an avalanche diode, and the like can be given. Alternatively a diode having another structure may be used. Note that an element having a rectifying property may be provided at the opposite side of the organic compound layer through the second conductive layer. An element having a rectifying property may be provided between the organic compound layer 29 and the first conductive layers 31. Also, an element having a rectifying property may be provided between the organic compound layer 29 and the second conductive layer 28. By providing an element having a rectifying property in such a manner, current only flows in one direction, and therefore, readout errors are reduced and a readout margin is improved.

Further, a thin film transistor (TFT) may be provided over a substrate having an insulating property and a memory element 80 may be provided thereover. As a substitute for the substrate having the insulating property, a field-effect transistor (FET) may be formed over a semiconductor substrate such as a Si substrate or an SOI substrate, and the memory element 80 may be provided thereover. Furthermore, since the transistor formed of a single crystal semiconductor can be microfabricated, high integration and miniaturization of a semiconductor device are possible. Furthermore, since the transistor formed of a single crystal semiconductor can be microfabricated, high integration and miniaturization of a semiconductor device are possible. Moreover, since the transistor is formed of the single crystal semiconductor, high-speed operation is possible. Note that examples in which the memory element is formed over the thin film transistor or the field effect transistor are shown here; however, the memory element may be attached to the thin in different steps from each other, and then the memory element and the thin film transistor or the field-effect transistor are attached to each other by using a conductive film, an anisotropic conductive adhesive agent, or the like. Furthermore, any known structure may be used for the thin film transistor or the field-effect transistor.

When there is a concern that an adverse effect of an electric field is caused in a horizontal direction between adjacent memory elements, partition walls (insulating layers) may be provided between the organic compound layers provided in each of memory elements so as to isolate the organic compound layers provided in each of the memory elements from one another. Alternatively, the organic compound layer may be selectively provided in each memory cell.

When an organic compound layer 29 is provided so as to cover the first conductive layers 31, partition walls (insulating layers) 39 may be provided so as to prevent a disconnection of the organic compound layer 29 caused by steps of the first conductive layers 31 or an adverse effect of an electric field in the horizontal direction between adjacent memory cells (FIG. 15C). Note that in cross sections of the partition walls (insulating layers) 39, a side surface of each of the partition walls (insulating layers) 39 preferably has an angle of gradient of 10 degrees or more and less than 60 degrees, and more preferably, 25 degrees or more and 45 degrees or less with respect to the surfaces of the first conductive layers 31. Furthermore, the partition walls (insulating layers) 39 preferably have a curved shape. Thereafter, the insulating layers 32, the organic compound layer 29, and the second conductive layer 28 are provided so as to cover the first conductive layers 31 and the partition walls (insulating layers) 39.

In place of the partition walls (insulating layers) 39, an interlayer insulating layer 40a partly covering the first conductive layer 31 extending in the first direction may be provided over the substrate 30, and partition walls (insulating layers) 40b may be provided over the interlayer insulating layers (FIG. 15D).

The interlayer insulating layers 40a partly covering the first conductive layer 31 has an opening for each memory element 80. The partition walls (insulating layers) 40b are provided in regions where the opening is not provided in the interlayer insulating layers. The partition walls (insulating layers) 40b extend in the second direction in a similar manner to the second conductive layers 28. Further, a cross section of each of the partition walls (insulating layers) 40b has an angle of gradient of 95 degrees or more and 135 degrees or less with respect to a surface of each of the interlayer insulating layers 40a.

The partition walls (insulating layers) 40b are formed by photolithography, wherein a positive photosensitive resin in which a non exposure portion remains, is used, and light exposure or developing time is controlled such that a lower portion of a pattern is etched more. The height of the partition walls (insulating layers) 40*b* is set larger than the thickness of the organic compound layer 29 and the second conductive layers 28. As a result, the organic compound layers 29 and the second conductive layers 28 can be formed in a striped-form, which are electrically isolated from one another in a plurality of regions and extend in a direction intersect with the first direction of the first conductive layers 31, only by a process of evaporating the organic compound layers 29 and the second conductive layers 28 over an entire surface of the substrate 30. Therefore, the number of steps can be reduced. Note that organic compound layers 29*a* and conductive layers 28*a* are also provided over the partition walls (insulating layers) 40*b*; however, they are not connected to the organic compound layers 29 and the conductive layers 28.

An operation in writing data in a memory device will be described below. Here, a case where operation in writing data is performed by applying voltage is described (see FIGS. 14A to 14C and FIGS. 15A to 15D).

When data is written in the memory element by applying voltage, one memory cell 21 is selected by a row decoder 24*a*, a column decoder 26*a*, and a selector 26*c*, and then, data is written in the memory cell 21 by using a write circuit (see FIG. 14A). When voltage is applied between the first conductive layer 31 and the second conductive layer 28 of the memory cell 21, a layer formed of a light emitting material emits light. An oxidation reduction agent in the organic compound layer comes to an excited state by the light emitting energy. Moreover, the substance brings about chemical reactions by the excited photosensitized oxidation reduction agent, and chemical reactants are generated. As a result, electric resistance of the memory element is changed.

As compared to other memory elements before writing in, electric resistance of the memory element having the chemical reactants is largely changed. By applying voltage to the memory cell, data is written in the memory cell by utilizing a change in electric resistance between two conductive layers. For example, when data "1" is written in, in the case where the memory cell is in the state of data "0", resistance is changed by selectively applying large voltage to the organic compound layer of a desired memory element.

Figure 14B:
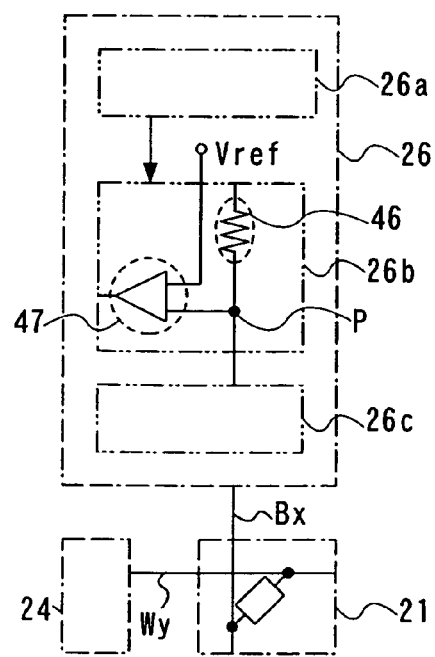
Figure 14C:
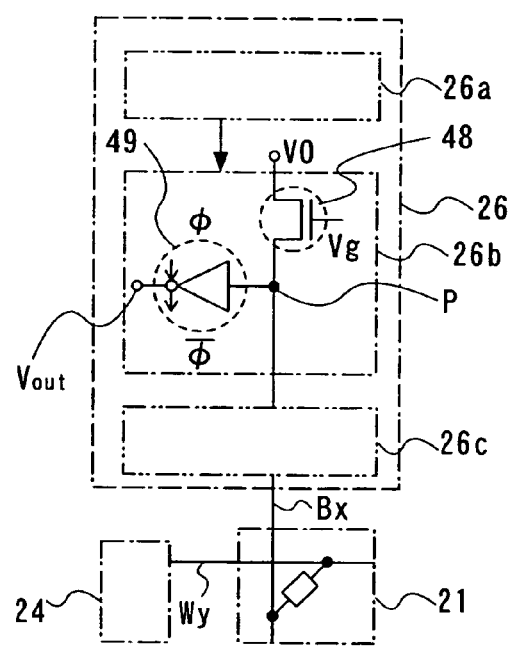

Next, an operation in reading out data from an organic memory will be described (see FIG. 14B). Data readout is performed by utilizing a difference in electric characteristics between the first and second conductive layers included in a memory cell having the data "0" and a memory cell having the data "1". For example, a method for reading out data by utilizing a difference in electric resistance in a case where effective electric resistance between the first and second conductive layers included in the memory cell having the data "0" (hereinafter, simply referred to as electric resistance of the memory cell) is R0 at a readout voltage and electric resistance of the memory cell having data "1" is R1 at a readout voltage, will be described. Note that R1<R0. Here, the readout circuit 26*b* has a structure including a resistance element 46 and a sense amplifier 47, the resistance element 46 has resistance value Rr, wherein R1<Rr<R0. However, as the structure of the readout circuit 26*b*, is not limited to the foregoing structures, and may have any kind of structure. For example, a transistor 48 may be used as a substitute for the resistance element 46, or a clocked inverter 49 may be used as a substitute for the sense amplifier 47 (FIG. 14C). A signal ϕ or an inversion signal ϕ̄, which becomes Hi in a case of reading out data and Lo in a case of reading out no data, is input in the clocked inverter 49.

When reading out data, the memory cell 21 is selected by the row decoder 24*a*, a column decoder 26*a*, and the selector 26*c*. Specifically, predetermined voltage Vy is applied to a word line Wy connected to the memory cell 21 by the row decoder 24*a*. Further, a bit line Bx connected to the memory cell 21 is connected to a terminal P of the readout circuit 26*b* by the column decoder 26*a* and the selector 26*c*. As a result, potential Vp of the terminal P becomes a value determined by resistance division generated by the resistance element 46 (resistance value Rr) and the memory cell 21 (resistance value R0 or R1). Accordingly, when the memory cell 21 has the data "0", Vp0=Vy+(V0−Vy)×R0/(R0+Rr). Further, when the memory cell 21 has the data "1", Vp1=Vy+(V0−Vy)×R1/(R1+Rr). As a result, by selecting Vref to be between Vp0 and Vp1 in FIG. 14A and by selecting a variation point of the clocked inverter between Vp0 and Vp1 in FIG. 14B, Lo/Hi (or Hi/Lo) is output as output voltage Vout in accordance with the data "0" and data "1", and reading out can be carried out.

For example, the sense amplifier 47 is operated with Vdd=3 V, and Vy=0 V; V0=3 V; and Vref=1.5 V. If R0/Rr=Rr/R1=9, when the memory cell has the data "0", Vp0 becomes 2.7 V and Hi is output as Vout. When the memory cell has the data "1", Vp1 becomes 0.3 V and Lo is output as Vout. Thus, data can be read out from the memory cell.

When reading out data, forward voltage is applied to the memory cell. Alternatively, reverse voltage may be applied thereto.

According to the above described method, a condition of electric resistance of the organic compound layer 29 is read out by a voltage value utilizing a difference in resistance values and resistance division. Of course, the readout method is not limited thereto. For example, the condition of electric resistance of the organic compound layer may be read out by comparing current values. Namely, the condition of the electric resistance is read out by, for example, utilizing a current value Ia1 where voltage is not applied to an organic compound layer and a resistance value Ib1 where short-circuiting between two conductive films is caused due to applied voltage, which satisfies Ia1<Ib1.

In this embodiment mode, the resistance value is read out by substituting it with the value of voltage; however, the present invention is not limited thereto. For example, the data may be read out by utilizing a difference in a current value other than to utilize a difference in electric resistance. Further, when an electronic characteristic of a memory cell has a diode characteristic in which threshold voltage is different between the data "0" and the data "1", the condition of electric resistance of the organic compound layer may be read out by utilizing a difference in threshold voltage. Furthermore, a method by which a bit line is pre-charged can be employed.

Embodiment Mode 9

In this embodiment mode, a memory device having a different structure from those of Embodiment Mode 8 will be described. Specifically, the memory device has an active matrix type structure.

Figure 16A:
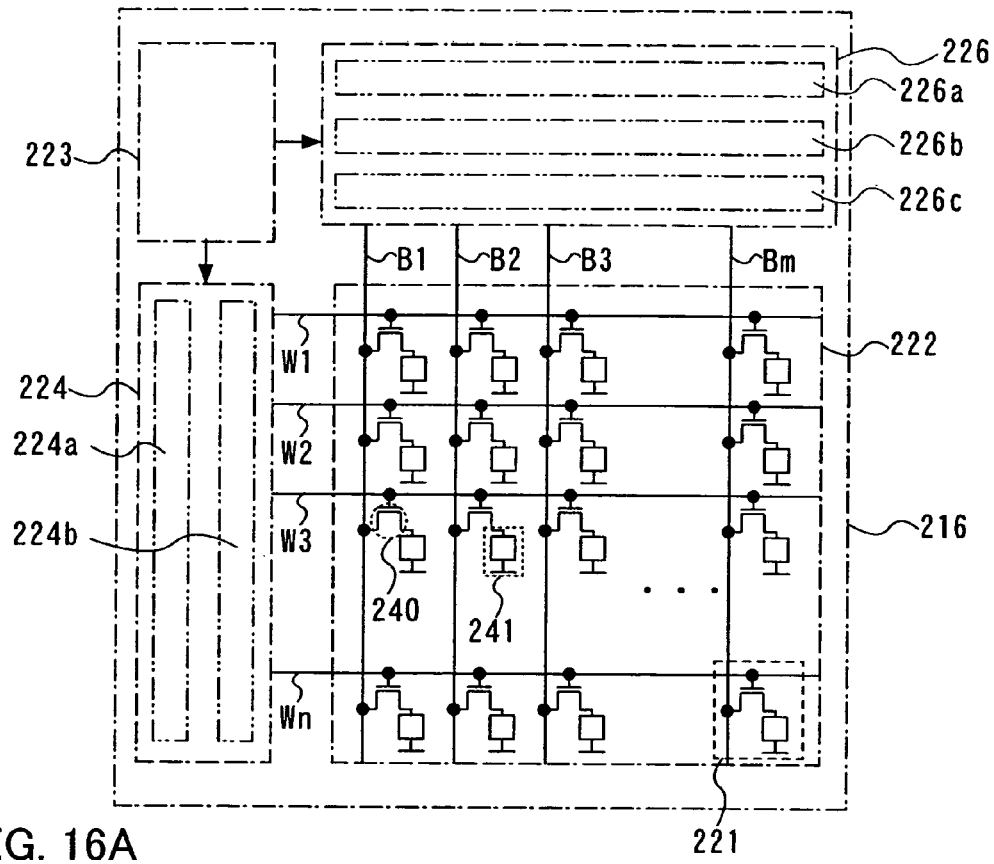
FIGS. 16A to 16C are views describing a memory device of this invention.

FIG. 16A shows a structural example of a memory device shown in this embodiment mode. The memory device includes a memory cell array 222 in which memory cells 221 are arranged in a matrix form, a bit line driver circuit 226 having a column decoder 226*a*, a readout circuit 226*b*, and a selector 226*c*, a word line driver circuit 224 having a row decoder 224*a* and a level shifter 224*b*, and an interface 223 having a write circuit and the like and communicating with an external portion. Note that the structure of the memory device 216 shown here is just one example; and therefore, the memory device may further include other circuits such as a sense amplifier, an output circuit, and a buffer, or, a write circuit may be provided in the bit line driver circuit.

Each of the memory cells 221 has a first wiring constituting a bit line Bx ($1 \leq x \leq m$), a second wiring constituting a word line Wy ($1 \leq y \leq n$), a transistor 240, and a memory element 241. The memory element 241 has a structure in which an organic compound layer is interposed between a pair of conductive layers.

Figure 17A:
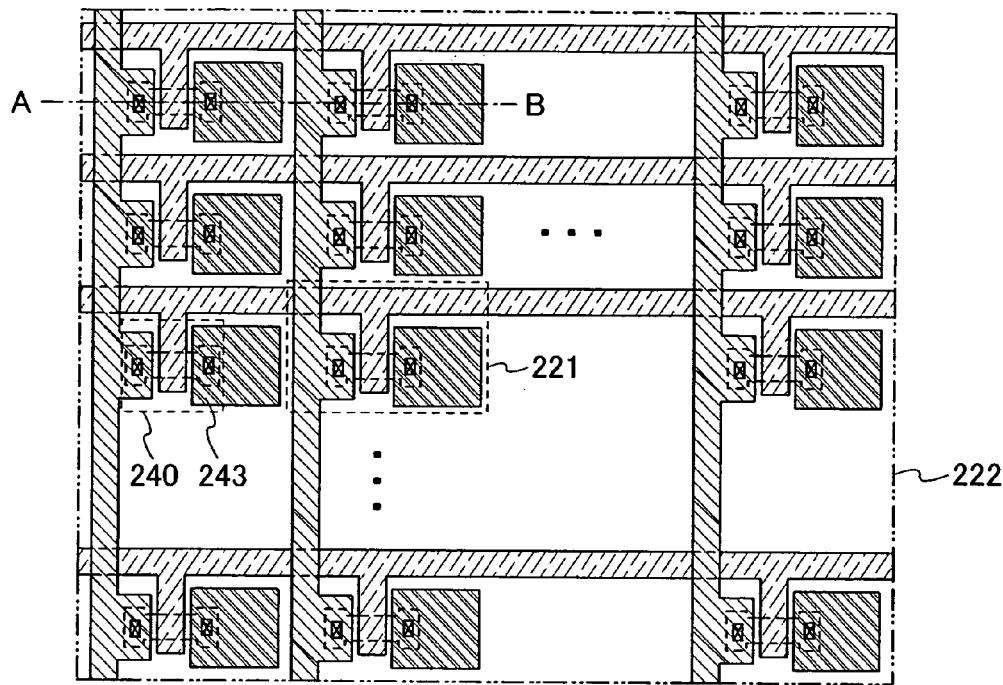
FIGS. 17A to 17C are a top view and cross sectional views of a memory device of this invention.
Figure 17B:
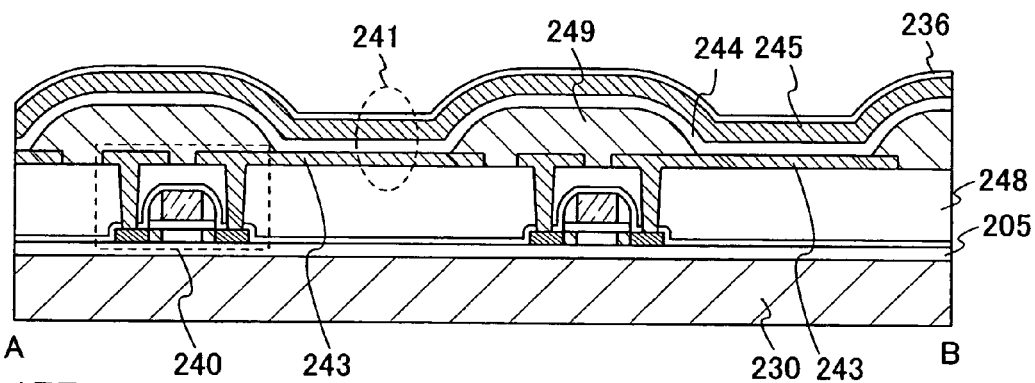

Next, examples of a top view and cross sectional views of the memory cell array 222 having the above mentioned structure will be described with reference to FIGS. 17A to 17C. FIG. 17A is a top view of the memory cell array 222. FIG. 17B is a cross sectional view along a line A-B of FIG. 17A. In FIG. 17A, partition walls (insulating layers) 249, an organic compound layer 244, and a second conductive layer 245, which are formed over first conductive layers 243, are omitted.

In the memory cell array 222, a plurality of memory cells 221 are provided in a matrix form. Each of the memory cells 221 has a transistor 240 serving as a switching element and a memory element 241 connected to the transistor 240 over a substrate 230 having an insulated surface (see FIGS. 17A and 17B). The memory element 241 has first conductive layers 243 formed over an insulating layer 248, an organic compound layer 244 covering the first conductive layers 243 and the partition walls (insulating layers) 249, and a second conductive layer 245. Note that partition walls (insulating layers) 249 covering a part of the first conductive layers are formed. As the transistor 240, a thin film transistor is used. The memory cell array 222 further includes an insulating layer 236 serving as a protection film so as to cover the second conductive layer 245.

Figure 25A:
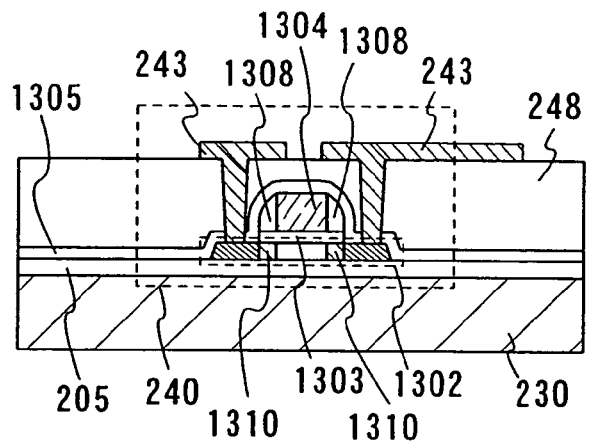
FIGS. 25A to 25D are cross sectional views describing a thin film transistor applicable to this invention.

One mode of a thin film transistor, which can be used for the transistor 240, will be described with reference to FIGS. 25A to 25D. FIG. 25A shows an example of a top gate type thin film transistor. An insulating layer 205 is provided over a substrate 230 having an insulated surface, and a thin film transistor is provided over the insulating layer 205. The thin film transistor includes a semiconductor layer 1302 and an insulating layer 1303 serving as a gate insulating layer, over the insulating layer 205. Over the insulating layer 1303, a gate electrode 1304 is provided corresponding to the semiconductor film 1302. Over the gate electrode 1304, an insulating layer 1305 serving as a protection layer and an insulating layer 248 serving as an interlayer insulating layer are provided. First conductive layers 243 connected to a source region and a drain region of the semiconductor layer are formed. In addition, an insulating layer serving as a protection layer may be provided over the first conductive layers 243.

The semiconductor layer 1302 is formed by a semiconductor having a crystalline structure, and can be formed using an amorphous semiconductor or a single crystalline semiconductor. In particular, a crystalline semiconductor formed by crystallizing an amorphous or microcrystalline semiconductor by laser irradiation, a crystalline semiconductor formed by crystallizing an amorphous or microcrystalline semiconductor by heat treatment, a crystalline semiconductor formed by crystallizing an amorphous or microcrystalline semiconductor by heat treatment and laser irradiation, or the like is preferable to be used. In the heat treatment, a crystallization method using a metal element such as nickel, which has a function of promoting crystallization of a silicon semiconductor, can be employed.

In the case of crystallizing by irradiating with laser light, it is possible to conduct crystallization in such a way that a portion in a crystalline semiconductor that is melted by irradiation with laser light is continuously moved in a direction where the laser light is delivered, wherein the laser light is continuous wave laser light or ultrashort pulsed laser light having a high repetition rate of 10 MHz or more and a pulse width of 1 nanosecond or less, preferably 1 to 100 picoseconds. By using such a crystallization method, a crystalline semiconductor having a large grain diameter with a crystal grain boundary extending in one direction can be obtained. By making a drift direction of carriers conform to the direction where the crystal grain boundary extends, the electric field effect mobility in the transistor can be increased. For example, 400 $cm^2/V$ sec or more can be achieved.

In the case of applying the above crystallization step to a crystallization process where the temperature is not more than the upper temperature limit of a glass substrate (approximately 600° C.), a large glass substrate can be used. Therefore, a large number of semiconductor devices can be manufactured with one substrate, and cost can be decreased.

The semiconductor layer 1302 may be formed by conducting a crystallization step through heating at the temperature higher than the upper temperature limit of a glass substrate. Typically, a quartz substrate is used as the insulating substrate and an amorphous or microcrystalline semiconductor is heated at 700° C. or more to form the semiconductor layer 1302. As a result, a semiconductor with superior crystallinity can be formed. Therefore, a thin film transistor which is superior in response speed, mobility, and the like and which is capable of high-speed operation can be provided.

The gate electrode 1304 can be formed using metal or a polycrystalline semiconductor added with an impurity having one conductivity type. When the gate electrode 1304 is formed using metal, tungsten (W), molybdenum (Mo), titanium (Ti), tantalum (Ta), aluminum (Al), or the like can be used. In addition, metal nitride formed by nitriding the above mentioned metal, can be used. Further, the gate electrode 1304 may include a first layer made from the metal nitride and a second layer made from the metal. In the case where the gate electrode 1304 has a laminated structure, an edge of the first layer may protrude from an edge of the second layer. In this case, when the first layer is formed using metal nitride, the first layer can serve as barrier metal. Therefore, such the first layer can prevent metal contained in the second layer from dispersing in the insulating layer 1303 and the underlying semiconductor layer 1302.

Sidewalls (sidewall spacers) 1308 are provided at the both sides of the gate electrode 1304. The sidewalls can be formed by forming an insulating layer over a substrate using silicon oxide by CVD, and by being subjected to an anisotropic etching by an RIE (reactive ion etching) method.

The thin film transistor including the semiconductor layer 1302, the insulating layer 1303, the gate electrode 1304, and the like can employ various kinds of structures such as a single drain structure, an LDD (lightly doped drain) structure, and a gate overlapping drain structure. A thin film transistor having an LDD structure in which low concentration impurity regions 1310 are formed in the semiconductor layer overlapped with the sidewalls, is shown here. In addition, a single gate structure, a multi-gate structure, in which thin film transistors, to which gate voltage having the same potential in term of equivalence is applied, are connected in series, or a dual-gate structure in which a semiconductor layer is interposed between gate electrodes can be applied.

The insulating layer 248 is formed by using an inorganic insulating material such as silicon oxide and silicon oxynitride, or an organic insulating material such as an acrylic resin and a polyimide resin. When a coating method such as spin coating and roll coater is used, after applying an insulating film material dissolved in an organic solvent, an insulating layer may be formed by heat treatment. For example, a film containing siloxane bonds is formed first by the coating method, and is subjected to heat treatment at 200 to 400° C. so as to obtain an insulating layer. When an insulating layer formed by a coating method or an insulating layer which is planarized by reflow is formed as the insulating layer 248, disconnection of a wiring provided over the insulating layer can be prevented. Further, such a method can be effectively used in a case of forming a multilayer wiring.

The first conductive layers 243 formed over the insulating layer 248 can be provided to be intersected with a wiring formed in the same layer as the gate electrode 1304. A multilayer wiring structure is formed. By laminating a plurality of insulating layers having the same function as the insulating layer 248 and forming a wiring thereover, a multilayer structure can be formed. The first conductive layer 243 serving as a wiring is preferably formed using a laminated structure of titanium (Ti) and aluminum (Al), a laminated structure of molybdenum (Mo) and aluminum (Al), a combination of a low resistance material such as aluminum (Al) and barrier metal using a high melting point metal material such as titanium (Ti) and molybdenum (Mo).

Figure 25B:
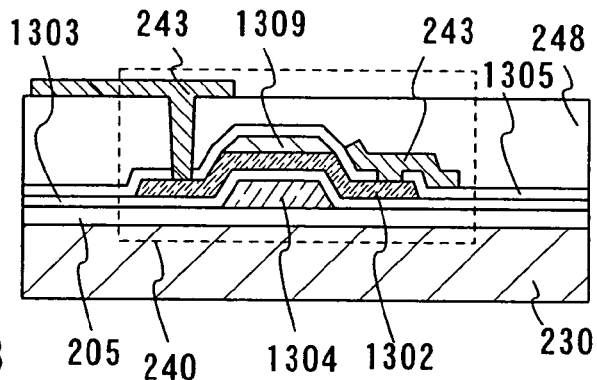

FIG. 25B shows one example of employing a bottom-gate type thin film transistor. An insulating layer 205 is formed over a substrate 230 having an insulated surface, and a thin film transistor is provided thereover. The thin film transistor includes a gate electrode 1304, an insulating layer 1303 serving as a gate insulating layer, a semiconductor layer 1302, a channel protection layer 1309, an insulating layer 1305 serving as a protection layer, and an insulating layer 248 serving as an interlayer insulating layer. Further, an insulating layer serving as a protection layer may be provided thereover. The conductive layer 243 can be formed over the insulating layer 1305 or the insulating layer 248. Note that the insulating layer 205 may not be provided in the case of the bottom-gate type thin film transistor.

In a case where the substrate 230 having the insulated surface is a flexible substrate, the substrate 230 has lower heat resistance as compared to a non-flexible substrate such as a glass substrate. Therefore, the thin film transistor is preferably formed using an organic semiconductor.

Figure 25C:
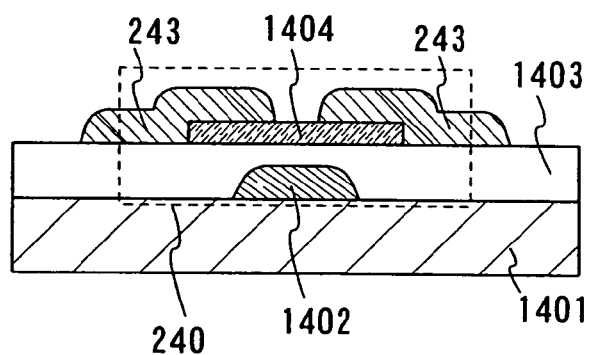

Here, a structure of a thin film transistor formed using an organic semiconductor will be described with reference to FIGS. 25C and 25D. FIG. 25C shows an example of applying a staggered organic semiconductor transistor. An organic semiconductor transistor is provided over a flexible substrate 1401. The organic semiconductor transistor includes a gate electrode 1402, an insulating layer 1403 serving as a gate insulating film, a semiconductor layer 1404 being overlapped with the gate electrode and the insulating layer 1403 serving as the gate insulating film, and a conductive layer 243 serving as a wiring connected to the semiconductor layer 1404. Further, the semiconductor layer 1404 is in contact with the insulating layer 1403 serving as the gate insulating film and the conductive film 243 serving as the wiring.

The gate electrode 1402 can be formed using the same material and the same method as the gate electrode 1304. Further, the gate electrode 1402 can also be formed by a droplet discharging method and by drying and baking. Furthermore, a paste containing a conductive fine particle is printed over a flexible substrate by printing and the paste is dried and baked so as to form the gate electrode 1402. As a typical example of the conductive fine particle, a fine particle mainly containing any one of gold, copper, an alloy of gold and silver, an alloy of gold and copper, an alloy of silver and copper, and an alloy of gold, silver, and copper may be used. In addition a fine particle mainly containing conductive oxide such as indium tin oxide (ITO) may be used.

The insulating layer 1403 serving as the gate insulating film can be formed using the same material through the same method as the insulating layer 1303. Note that when an insulating layer is formed by heat treatment after applying an insulating film material dissolved in an organic solvent, the heat treatment is performed at a lower temperature than an allowable temperature limit of the flexible substrate.

As a material for the semiconductor layer 1404 of the organic semiconductor transistor, a polycyclic aromatic compound, a conjugated double bond compound, phthalocyanine, a charge transfer complex, and the like can be given. For example, anthracene, tetracene, pentacene, 6T (hexathiophene), TCNQ (tetra-cyanoquinodimethane), PTCDA (a perylene carboxylic acid anhydrous compound), NTCDA (a naphthalenecarboxylic acid anhydrous compound), and the like can be given. Further, as a material for the semiconductor layer 1404 of the organic semiconductor transistor, a n-conjugated system high molecule such as an organic high molecular compound, carbon nanotube, polyvinyl pyridine, a phthalocyanine metal complex, and the like can be given. In particular, a π-conjugated system high molecule composed of a conjugated double bond such as polyacetylene, polyaniline, polypyrrole, polythienylene, a polythiophene derivative, poly(3alkylthiophene), a polyparaphenylene derivative, and a polyparaphenylenevinylene derivative, is preferably used.

As a method for forming the semiconductor layer of the organic semiconductor transistor, a method for forming a film having a uniform thickness may be used. The thickness of the semiconductor layer is preferably set to be 1 nm or more and 1,000 nm or less, and more preferably, 10 nm or more and 100 nm or less. As a specific method of the organic semiconductor transistor, an evaporation method, a coating method, a spin coating method, a solution cast method, a dipping method, a screen printing method, a roll coater method, or a droplet discharging method can be used.

Figure 25D:
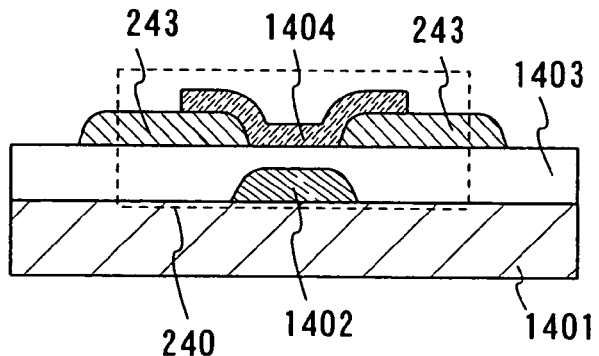

FIG. 25D shows an example of applying a coplanar type organic semiconductor transistor. An organic semiconductor transistor is provided over a flexible substrate 1401. The organic semiconductor transistor includes a gate electrode 1402, an insulating layer 1403 serving as a gate insulating film, conductive layers 243, and a semiconductor layer 1404 being overlapped with the gate electrode and the insulating layer 1403 serving as the gate insulating layer. Further, each of the first conductive layers 243 serving as a wiring is in contact with the insulating layer serving as the gate insulating layer and the semiconductor layer.

Further, the thin film transistor and the organic semiconductor transistor may be provided to have any structure so long as they can serve as switching elements.

Furthermore, a transistor may be formed using a single crystalline substrate or an SOI substrate, and a memory element may be provided thereover. The SOI substrate may be formed by using a method in which a wafer is attached, a method of forming an insulating layer in an interior portion by doping a Si substrate with an oxygen ion, which is also referred to as an SIMOX. Here, as shown in FIG. 17C, a memory element 241 is connected to a field-effect transistor 262 provided over a single crystalline semiconductor substrate 260. Further, an insulating layer 250 is provided to cover a wiring of the field-effect transistor 262, and a memory element 241 is provided over the insulating layer 250.

Since the transistor formed using such a single crystalline semiconductor has good characteristics such as high response speed and good mobility, the transistor can be operated at high speed. Further, such a transistor has slight variations in its characteristics, and therefore, a highly-reliable semiconductor device can be provided by using the transistor.

The memory element 241 includes a first conductive layer 264 formed over the insulating film 250, an organic compound layer 244 covering the first conductive layer 243 and the partition walls (insulating layers) 249, and a second conductive layer 245. Note that the partition walls (insulating layers) 249 for covering one part of the first conductive layer is formed.

Accordingly, by forming the memory element 241 after forming the insulating layer 250, the first conductive layer 264 can be freely arranged. That is, the memory element 241 must be provided in a region outside of a wiring of the transistor 240, in the structure as shown in each of FIGS. 17A and 17B; however, by using the above structure, for example, the memory element 241 can be formed over the transistor 262, which is provided in a layer 251 having transistors. As a result, memory device 216 can be highly integrated.

Figure 17C:
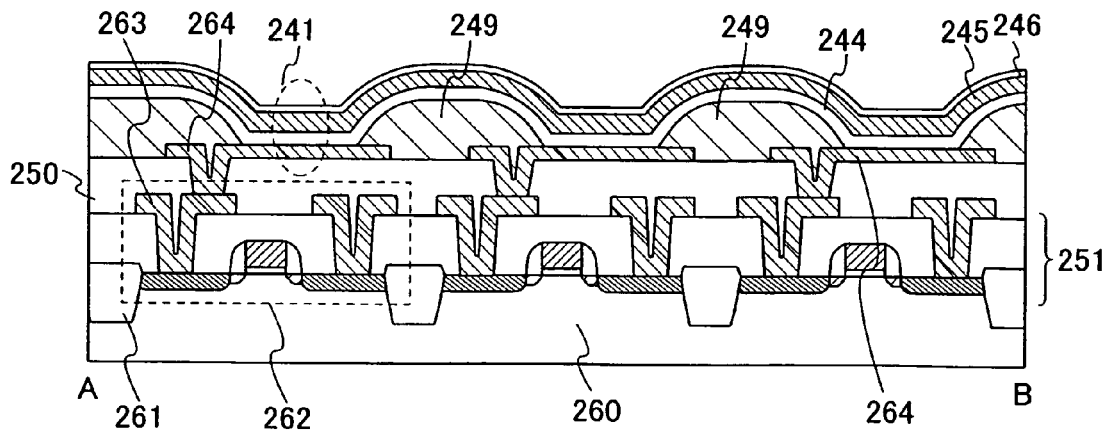

In each of FIGS. 17B and 17C, the organic compound layer 244 is provided over an entire surface of the substrate. Alternatively, organic compound layers 244 may be selectively provided only in respective memory cells. In this case, an organic compound is discharged by using a droplet discharging method or the like and baked to selectively form organic compound layers, making it possible to improve material use efficiency.

The first conductive layers 243 and 264 and the second conductive layer 245 can be formed using the same material through the same method shown in Embodiment Mode 1.

Further, the organic compound layers 244 can be provided by using the same material through the same method shown in Embodiment Mode 1.

Furthermore, an element having a rectifying property may be provided between the first conductive layers 243 and the organic compound layer 244, and the first conductive layer 264 and the organic compound layer 244, respectively. The element having a rectifying property is a transistor whose gate and drain electrodes are connected to each other or a diode. Further, an element having the rectifying property may be provided between the organic compound layer 244 and the second conductive layer 245.

Figure 20:
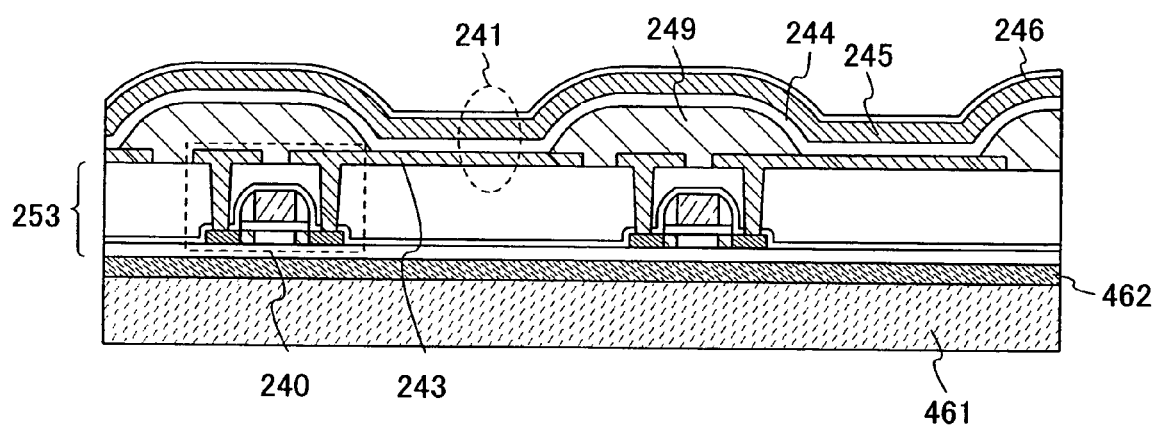
FIG. 20 is a cross sectional view describing a semiconductor device of this invention.

Moreover, after a separation layer is provided over the substrate 230 having the insulated surface and a layer 253 having a transistor and a memory element 241 are provided over the separation layer, the layer 253 having the transistor and the memory element 241 may be separated from the separation layer and may be attached to a substrate 461 through an adhesive layer 462 (see FIG. 20). As a separation method, the following four methods and the like can be employed: a separation method 1 where a metal oxide layer is provided as a separation layer between a substrate having an insulated surface and a layer having a transistor, and the metal oxide layer is weakened by crystallization so as to separate the layer having the transistor from the substrate by physical means; a separation method 2 where an amorphous silicon film containing hydrogen is provided as a separation layer between a substrate having an insulated surface and a layer having a transistor, and hydrogen gas contained in the amorphous silicon film is released by laser irradiation so as to separate the substrate having high heat resistance, or an amorphous silicon film is provided as a separation layer and the amorphous silicon film is removed by etching so as to separate the layer having the transistor; a separation method 3 where a substrate having high heat resistance over which a layer having a transistor is provided, is mechanically removed or removed by etching with a use of a solution or halogen fluoride gas such as $NF_3$, $BrF_3$, and $ClF_3$; and a separation method 4 where after a metal layer and a metal oxide layer are provided as separation layers between a substrate having an insulated surface and a layer having a transistor, the metal oxide layer is weakened by crystallization, and a part of the meal layer is removed by etching with a use of a solution or halogen fluoride gas such as $NF_3$, $BrF_3$, and $ClF_3$, and then the weakened metal oxide layer is physically separated.

When a flexible substrate like the substrate 30 shown in Embodiment Mode 1, a film having a thermoplastic property, a paper made from a fibrous material, or the like is used as the substrate 461, a small, thin, and lightweight memory device can be realized.

Figure 16B:
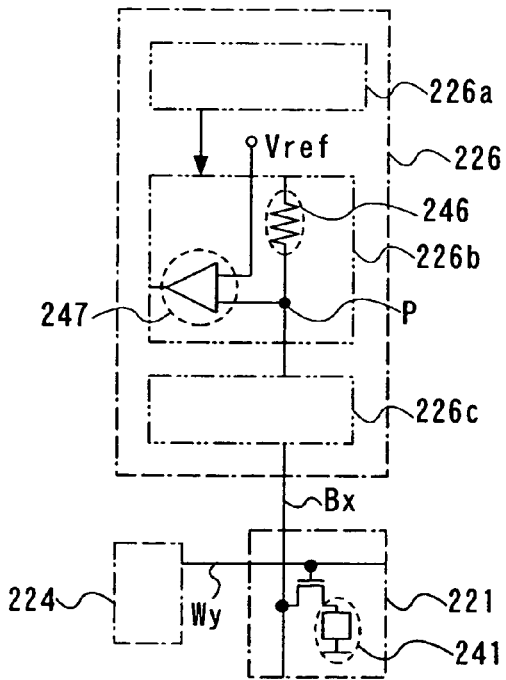

Next, an operation in writing date in the memory device 216 will be described (FIGS. 16A and 16B).

When writing data by applying voltage, one memory cell 221 is selected by a row decoder 224a, a column decoder 226a, and a selector 226c, and then data is written in the memory cell 221 using a write circuit (See FIG. 16A). A layer formed of a light emitting material emits light by applying voltage between the first conductive layer 243 and the second conductive layer 245 in the memory cell. With the emission energy, the photosensitized oxidation reduction agent in the organic compound layer come to an excited state. Furthermore, the substance brings about chemical reactions by the excited photosensitized oxidation reduction agent, and chemical reactants are generated. As a result, electric resistance of the memory element is varied.

As compared to other memory elements before writing in, electric resistance of the memory element having the chemical reactants is varied. By applying voltage to the memory cell, data is written in the memory cell while utilizing a change in electric resistance between two conductive layers. For example, when data "1" is written in, in the case where the memory cell is in the state of data "0", resistance is changed by selectively applying larger voltage to the organic compound layer of a desired memory element.

Here, a case of writing data in a memory cell 221 in the m-th column and the n-th row, will be described. In this case, a bit line Bm in the m-th column and a word line Wn in the n-th row are selected by a row decoder 224a, a column decoder 226a, and a selector 226c, and a transistor 240 included in the memory cell 221 in the m-th column and the n-th row is turned on. Subsequently, voltage is applied between the first conductive layer 243 and the second conductive layer 245 in the memory cell, and the layer formed of the light emitting material emits light. Note that the second conductive layer 245 of the memory element 241 is connected to a common electrode with potential Vcom. With the emission energy, the photosensitized oxidation reduction agent in the organic compound layer comes to the one in an excited state. Furthermore, the substance causes chemical reactions by the excited photosensitized oxidation reduction agent, and chemical reactants are generated. As a result, electric resistance of the memory element is changed.

Figure 16C:
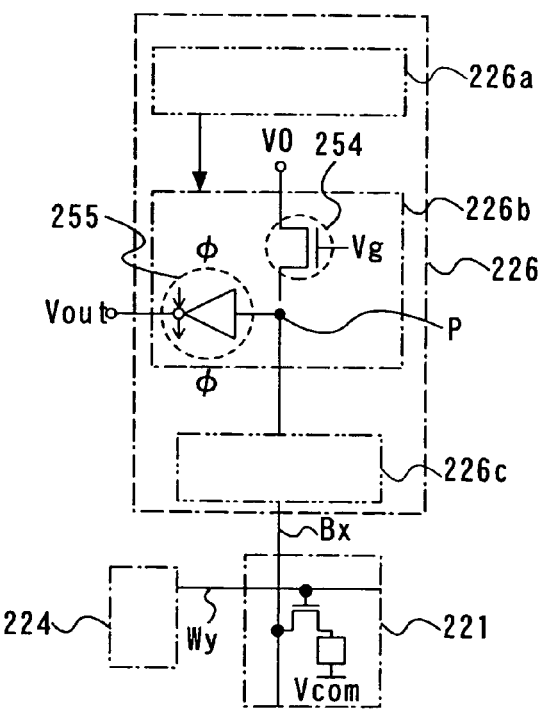

Next, an operation in reading out data by applying voltage will be described (see FIGS. 16A to 6C.). Data readout is performed by utilizing a difference in electric characteristics of the memory elements 241 included in a memory cell having the data "0" and a memory cell having the data "1". For example, a method for reading out data by utilizing a difference in electric resistance in a case where electric resistance of the memory elements included in the memory cell having the data "0" is R0 at a reading voltage and electric resistance of the memory cell having data "1" is R1 at a reading voltage, will be described. Note that R1<R0. Here, a readout portion of the readout circuit 226b has a structure including a resistance element 246 and a sense amplifier 247. The resistance element 246 has resistance value Rr, wherein R1<Rr<R0. A transistor 254 may be used as a substitute for the resistance element 246, or a clocked inverter 255 may be used as a substitute for the sense amplifier 247 (FIG. 16C). Needless to say, the structure of a circuit is not limited thereto shown in FIG. 16C.

Data readout is performed by reading electric resistance of the organic compound layer 244 by applying voltage between the first conductive layer 243 and the second conductive layer 245. For example, a case of reading data in a memory cell 221 in the m-th column and the n-th row, among plural memory cells 221 included in the memory cell array 222, will be described. In this case, a bit line Bm in the m-th column and a word line Wn in the n-th row are selected by a row decoder 224a, a column decoder 226a, and a selector 226c. Specifically, a predetermined voltage of 24V, is applied to a word line Wy connected to the memory cell 221 by the row decoder 224a and the transistor 240 is turned on. A bit line Bx connected to the memory cell 221 is connected to a terminal P of the readout circuit 226b by the column decoder 226a and the selector 226c. As a result, potential Vp of the terminal P becomes a value which is determined by Vcom and V0, which are values determined by resistance division of the resistance element 246 (resistance value Rr) and the memory element 241 (resistance value R0 or R1). Therefore, in a case where the memory cell 221 has the data "0", Vp0=Vcom+(V0−Vcom)×R0/(R0+Rr). When the memory cell 221 has the data "1", Vp1=Vcom+(V0−Vcom)×R1/(R1+Rr). As a result, by selecting Vref to be between Vp0 and Vp1 in FIG. 16B, Lo/Hi (or Hi/Lo) of an output potential Vout is output in accordance with the data "0" or data "1", and hence, the data can be read out.

For example, the sense amplifier 47 is operated with Vdd=3 V, and Vy=0 V; V0=3 V; and Vref=1.5 V. If R0/Rr=Rr/R1=9 and on-resistance of the transistor 240 can be ignored, when the memory cell has the data "0", Vp0 becomes 2.7 V and Hi is output as Vout. When the memory cell has the data "1", Vp1 becomes 0.3 V and Lo is output as Vout. Thus, data can be read out from the memory cell.

Subsequently, operation in reading out data of a memory element by applying voltage in the case of using a transistor as a resistance element will be described by giving a specific example in FIG. 21.

Figure 21:
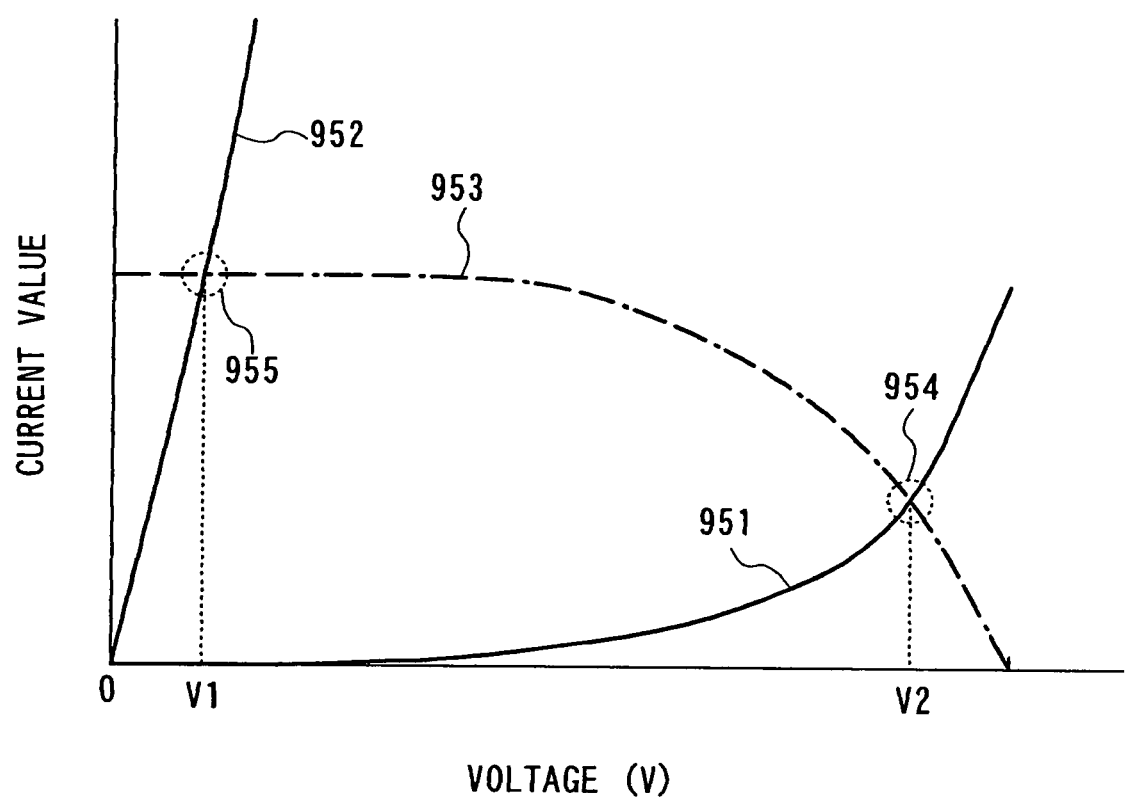
FIG. 21 is a view showing a current-voltage characteristic of a memory element and a resistance element.

FIG. 21 shows a current-voltage characteristic 951 of a memory element in which the data "0" is written, a current-voltage characteristic 952 of a memory element in which the data "1" is written, and a current-voltage characteristic 953 of a transistor. Further, a case where 3 V is applied between the first conductive layer 243 and the second conductive layer 245 as operation voltage when reading out data, will be described.

In FIG. 21, in a memory cell having the memory element, in which data "0" is written, an intersection point 954 of the current-voltage characteristic 951 of the memory element with the current-voltage characteristic 953 of the transistor is an operation point. In this case, potential of a node P becomes V2 (V). A potential of the node P is supplied to the sense amplifier 247. In the sense amplifier 247, data stored in the memory cell is determined as "0".

On the other hand, in a memory cell having the memory element, in which the data "1" is written, an intersection point 955 of the current-voltage characteristic 952 of the memory element with the current-voltage characteristic 953 of the transistor is an operation point. In this case, potential of the node P becomes V1 (V) (V1<V2). The potential of the node P is supplied to the sense amplifier 247. In the differential amplifier 247, data stored in the memory cell is determined as "1".

By reading out potential which is subjected to resistance division in accordance with a resistance value of the memory elements 241, data stored in the memory cell can be determined.

According to the above described method, data is read out by voltage value while utilizing a difference in resistance values of the memory elements 241 and resistance division; however, information stored in the memory elements 241 may be read out by amount of current.

Furthermore, this embodiment mode can be implemented by being freely combined with the above described embodiment modes.

Embodiment Mode 10

In this embodiment mode, an example of a semiconductor device typified by wireless chip having a memory device as shown in the above described embodiment modes will be described with reference to the drawings.

One feature of the semiconductor device shown in this embodiment mode is that data can be read out from and written in the semiconductor device without contact. Data transmitting types can be largely classified into three of an electromagnetic coupling type in which a pair of coils is placed to face each other and communication is performed by mutual induction; an electromagnetic induction type in which communication is performed by an induction field; and a radio wave type in which communication is performed by utilizing radio waves. Any type can be employed. Further, there are two types of layouts of an antenna used for transmitting data: one is a case where an antenna is provided over a substrate over which a transistor and a memory element are provided; and the other is a case where a terminal portion is provided over a substrate over which a transistor and a memory element are provided and an antenna, which is provided over the other substrate, is connected to the terminal portion.

First, a structural example of a semiconductor device in a case where an antenna is provided over a substrate over which a plurality of elements and a plurality of memory elements are provided will be described with reference to FIGS. 18A and 18B.

Figure 18A:
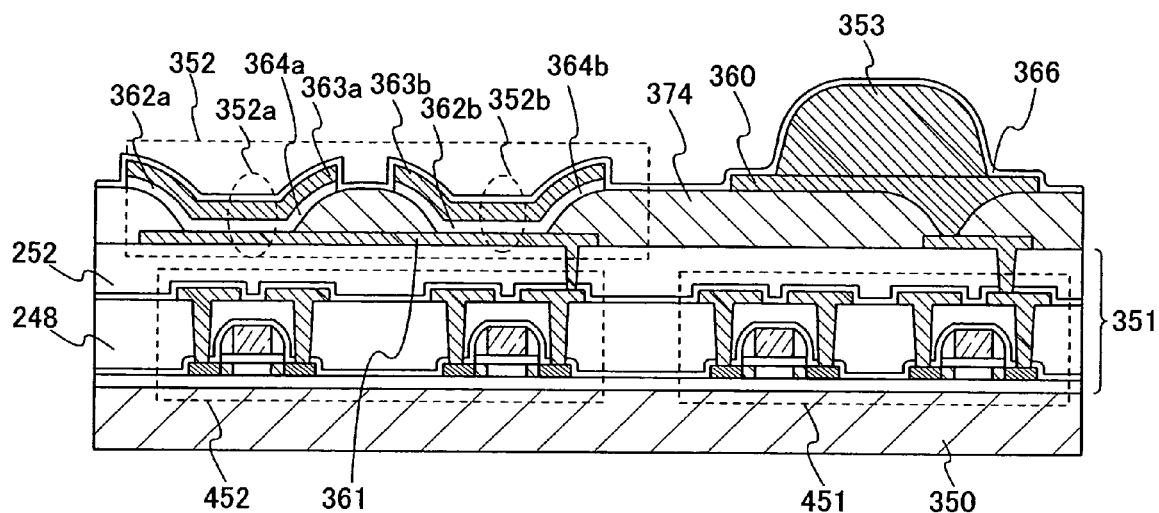
FIGS. 18A and 18B are cross sectional views describing a semiconductor device of this invention.

FIG. 18A shows a semiconductor device having a passive matrix type memory circuit. Over a substrate 350, the semiconductor device includes a layer 351 having transistors 451 and 452, a memory element portion 352 formed over the layer 351 having the transistors, and a conductive layer 353 serving as an antenna.

Note that a case where the semiconductor device includes the memory element portion 352 and the conductive layer 353 serving as an antenna over the layer 351 having the transistors; however, the present invention is not limited thereto. The memory element portion 352 or conductive layer 353 serving as an antenna may be provided under or in the same layer as the layer 351 having the transistors.

The memory element portion 352 has a plurality of memory elements 352a and 352b. The memory element 352a includes a first conductive layer 361 formed over an insulating layer 252, an organic compound layer 362a covering the first conductive layer 361 and partition walls (insulating layers) 374, and a second conductive layer 363a. Note that the partition walls (insulating layers) 374 covers a part of the first conductive layer. The memory element 352b includes the first conductive layer 361 formed over the insulating layer 252, the partition walls (insulating layers) 374 partly covering the first conductive layer, the organic compound layer 362b covering the first conductive layer 361 and the partition walls (insulating layers) 374, and the second conductive layer 363b. Note that the partition walls (insulating layers) 374 cover a part of the first conductive layer.

Further, an insulating layer 366 serving as a protection film is formed to cover the second conductive layers 363a and 363b and the conductive layer 353 serving as an antenna. The first conductive layer 361 of the memory element portion 352 is connected to a wiring of a transistor 452. The memory element portion 352 can be formed using the same material through the same manufacturing method as those shown in the above embodiment modes.

In the memory element portion 352, as shown in the above embodiment modes, an element having a rectifying property may be provided between the first conductive layer 361 and the organic compound layers 362a and 362b, or between the organic compound layers 362a and 362b and the second conductive layers 363a and 363b. The same element having the rectifying property described in Embodiment Mode 7 can be used as the element having the rectifying property.

In this embodiment mode, the conductive layer 353 serving as an antenna is provided over the conductive layer 360 which is formed in the same layer as the second conductive layers 363a and 363b. Note that, the conductive layer serving as an antenna may be formed in the same layer as the second conductive layers 363a and 363b. The conductive layer 353 serving as an antenna is connected to a source wiring or a drain wiring of the transistor 451.

As a material for the conductive layer 353 serving as the antenna, one element selected from gold (Au), platinum (Pt), nickel (Ni), tungsten (W), molybdenum (Mo), cobalt (Co), copper (Cu), aluminum (Al), manganese (Mn), titanium (Ti), and the like; or an alloy containing a plurality of the above mentioned elements; and the like can be given. As a method for forming the conductive layer 353 serving as the antenna, evaporation, sputtering, CVD, various kinds of printing methods such as screen printing and gravure printing, a droplet discharging method, or the like can be used.

The transistors 240 and 262 shown in Embodiment Mode 8 can be properly used as the transistors 451 and 452 contained in the layer 351 having the transistors.

Furthermore, a separation layer, the layer 351 having the transistors, the memory element portion 352, and the conductive layer 353 serving as the antenna are provided over a substrate, and the layer 351 having the transistors, the memory element portion 352, and the conductive layer 353 serving as the antenna are separated from the substrate by property using the separation method mentioned in Embodiment Mode 8. Thereafter, the layer 351 having the transistors, the memory element portion 352, and the conductive layer 353 serving as the antenna separated from the substrate may be attached to another substrate by using an adhesive layer. Utilizing a flexible substrate shown as the substrate 30 in Embodiment Mode 1, a film having a thermoplastic property, a paper made from a fibrous material, a base material film, or the like as the other substrate makes it possible to achieve a small, thin, and lightweight memory device.

Figure 18B:
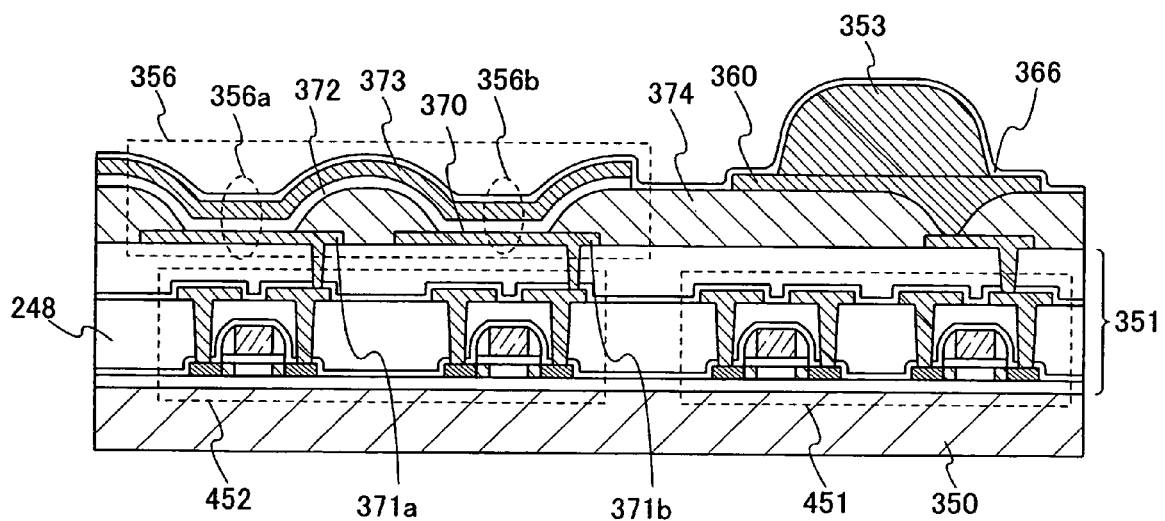

FIG. 18B shows an example of a semiconductor device having an active matrix type memory circuit. Portions different from those of FIG. 18A will be described in FIG. 18B.

The semiconductor device shown in FIG. 18B includes the layer 351 having the transistors 451 and 452 over the substrate 350, a memory element portion 356 over the layer 351 having the transistors, and the conductive layer 353 serving as the antenna over the layer 351 having the transistors. Note that, a case where the transistor 452 serving as a switching element of the memory element portion 356 is formed in the same layer as the transistor 451 and the memory element portion 356 and the conductive layer 353 serving as the antenna are formed over the layer 351 having the transistors, is shown here; however, the memory element portion 356 and the conductive layer 353 serving as the antenna can be formed under or in the same layer as the layer 351 having the transistors.

The memory element portion 356 includes the memory elements 356a and 356b. The memory element 356a includes first conductive layer 371a formed over the insulating layer 252, an organic compound layer 372 covering the first conductive layer 371a and the partition walls (insulating layers) 374, and the second conductive layer 373. Note that the partition walls (insulating layers) 374 cover a part of the first conductive layer 371a. The memory element 356b includes the first conductive layer 371b formed over the insulating layer 252, the organic compound layer 372 covering the first conductive layer 371 and the partition walls (insulating layers) 374. Note that the partition walls (insulating layers) 374 cover a part of the first conductive layer 371b. The first conductive layer 371a and the first conductive layer 371b are connected to wirings of each of the transistors. That is, the memory elements are connected to each transistor.

Note that the same material and the same manufacturing method as shown in Embodiment Modes 1 and 7 can be used for forming the memory elements 356a and 356b. Further, in the memory elements 356a and 356b, as described above, an element having a rectifying property may be provided between the first conductive layers 371a and 371b and the organic compound layer 372 or between the organic compound layer 372 and the second conductive layer 373.

The conductive layer formed with the layer 351 having the transistors, the conductive layer formed with the memory element portion 356, and the conductive layer 353 serving as the antenna can be formed by using evaporation, sputtering, CVD, printing, a droplet discharging method, or the like as described above. Further, they may be formed by different methods depending on their portions to be formed.

Furthermore, a separation layer, the layer 351 having the transistors, the memory element portion 356, and the conductive layer 353 serving as the antenna may be provided over a substrate, the layer 351 having the transistors, the memory element portion 356, and the conductive layer 353 serving as the antenna may be separated from the substrate by property using the separation method shown in Embodiment Mode 8. The layer 351 having the transistors, the memory element portion 356, and the conductive layer 353 serving as the antenna separated from the substrate may be attached to the other substrate having flexibility by using an adhesive layer. By utilizing a flexible substrate shown as the substrate 30 in Embodiment Mode 1, a film having a thermoplastic property, a paper made from a fibrous material, a base material film, or the like as the other substrate, it is possible to achieve a small, thin, and lightweight memory device.

Note that a sensor may be provided to be connected to the transistors. As a sensor, an element which detects temperature, humidity, illuminance, gas, gravity, pressure, sound (vibration), acceleration, and other characteristics by physical means or chemical means, can be given. The sensor is typically formed using an element such as a resistance element, a capacitance coupled element, an inductively-coupled element, a photovoltaic element, a photoelectric conversion element, a thermo-electromotive element, a transistor, a thermistor, and a diode.

Next, a structural example of a semiconductor device including a first substrate, which includes a layer having transistors, a terminal portion being connected to the transistors, and a memory element, and a second substrate over which an antenna being connected to the terminal portion, will be described with reference to FIGS. 19A and 19B. Note that, portions different from those of FIGS. 18A and 18B will be described in FIGS. 19A and 19B.

Figure 19A:
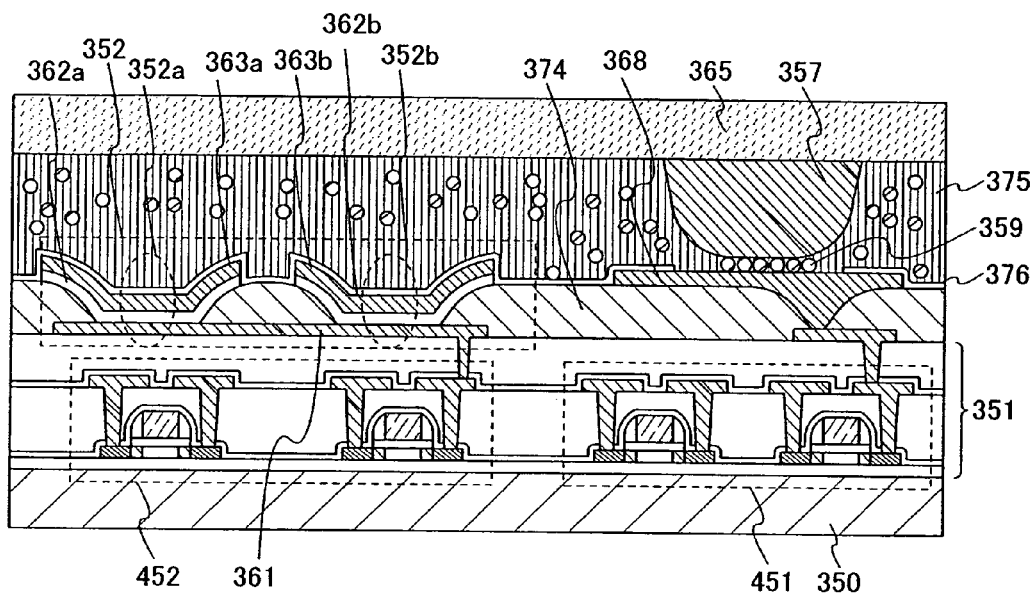
FIGS. 19A and 19B are cross sectional views describing a semiconductor device of this invention.

FIG. 19A shows a semiconductor device having a passive matrix type memory circuit. The semiconductor device includes a layer 351 having transistors formed over a substrate 350, a memory element portion 352 formed over the layer 351 having the transistors, a connection terminal 368 being connected to the transistor 451, and a substrate 365 over which a conductive layer 357 serving as an antenna is provided. The conductive layer 357 is connected to the connection terminal 368 by conductive particles 359. Note that, a case in which the memory element portion 352 is provided over the layer 351 having the transistors, is shown here; however, the present invention is not limited thereto. Alternatively, the memory element portion 352 may be provided under or in the same layer as the layer 351 having the transistors.

The memory element portion 352 can be formed using the memory element portion 352 having the structure as shown in FIG. 18A.

Further, the substrate including the layer 351 having the transistors and the memory element portion 352 and the substrate 365 including the conductive layer 357 serving as the antenna are attached to each other with a resin 375 having an adhesion property. The layer 351 having the transistors and a conductive layer 357 are electrically connected to each other through the conductive particles 359 contained in the resin 375. Alternatively, the substrate 350 including the layer 351 having the transistors and the memory element portion 352 and the substrate 365 including the conductive layer serving as the antenna, may be attached to each other by using a conductive adhesive agent such as a silver paste, a copper paste, and a carbon paste or a solder joint method.

Figure 19B:
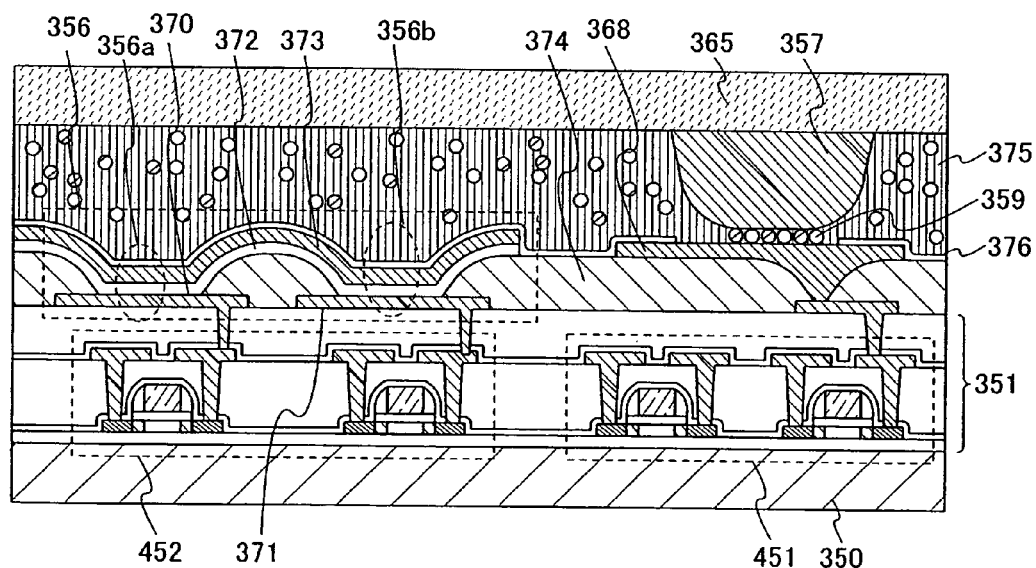

FIG. 19B shows a semiconductor device having the memory device shown in Embodiment Mode 9. The semiconductor device includes a layer 351 having transistors 451 and 452 formed over a substrate 350, a memory element portion 356 formed over the layer 351 having the transistors, a connection terminal 368 being connected to the transistor 451, and a substrate 365 over which a conductive layer 357 serving as an antenna is provided. The conductive layer 357 and the connection terminal 378 are connected to each other by conductive particles 359. Note that a case where in the layer 351 having the transistors 451 and 452, the transistor 451 is formed in the same layer as the transistor 452 and the conductive layer 357 serving as the antenna is formed over the layer 351 having the transistors, is shown here; however, the present invention is not limited thereto. Alternatively, the memory element portion 356 may be provided under or in the same layer as the layer 351 having the transistors.

The memory element portion 356 can be formed using the memory elements 356a and 356b having the structure shown in FIG. 18B.

Also, in FIG. 19B, the substrate 350, which includes the layer 351 having the transistors and the memory element portion 356, and the substrate 365, over which the conductive layer 357 serving as the antenna is provided, are attached to each other by a resin 375 containing the conductive particles 359. Further, the conductive layer 357 and the connection terminal 378 are connected to each other by the conductive particles 359.

Furthermore, a separation layer, the layer 351 having the transistors, and the memory element portion 356 may be provided over a substrate, and the layer 351 having the transistors and the memory element portion 356 may be separated from the substrate by using the separation method shown in Embodiment Mode 9. The layer 351 having the transistors and the memory element portion 356 may be attached to the substrate 461 by using an adhesive layer having flexibility.

Moreover, each of the memory element portions 352 and 356 may be provided over the substrate 365 over which the conductive layer serving as the antenna is provided. Specifically, a first substrate over which a layer having transistors is provided, and a second substrate over which a memory element portion and a conductive layer serving as an antenna are provided, may be attached to each other by using a resin containing conductive particles. A sensor being connected to the transistors may also be provided as well as the semiconductor devices shown in FIGS. 18A and 18B.

Furthermore, the present embodiment mode can be implemented by being freely combined with the above described embodiment modes.

Embodiment Mode 11

In this embodiment mode, a light emitting material which can be used in a memory element shown in Embodiment Mode 1 to Embodiment Mode 6, a memory device shown in Embodiment Mode 8 and Embodiment Mode 9, and a semiconductor device shown in Embodiment Mode 10 are described as follows.

A light emitting element formed using an inorganic compound as a light emitting material can be used in a light emitting element portion shown in Embodiment Mode 5 and Embodiment Mode 6. Typically, an inorganic EL element utilizing electroluminescence can be given.

The inorganic EL element is classified into a dispersed inorganic EL element or a thin film inorganic EL element depending on the element constitution. They are different in that the former has an electroluminescence layer in which particles of the light emitting material are dispersed in a binder, and the latter has an electroluminescence layer formed of a thin film made of a light emitting material; however, a common point is that they both require electrons which are accelerated at high electric field. As a mechanism of the obtained emission, there are two types: donor-acceptor recombination emission in which a donor level and an acceptor level are used, and local emission in which inner shell electron transition in a metal ion is used. Generally, the dispersed inorganic EL element typically has a donor-acceptor recombination emission and the thin film inorganic EL element typically has local emission.

The light emitting material which can be used in this embodiment mode is formed of a host material and an impurity element which becomes the center of the emission. By changing the included impurity element to be included, variety of colors of emission can be obtained. As a manufacturing method of the light emitting material, various methods such as a solid phase method, a liquid phase synthesis method (coprecipitation method), or the like can be used. Alternatively, a spraying thermal decomposition method, a double decomposition method, a method by thermal decomposition reaction of a precursor, a reversed micelle method, a method in which these methods and high temperature firing are combined, a solution synthetic method such as a freeze-drying method, or the like can be used.

The solid phase method is a method in which a compound including a host material and an impurity element or a compound including the impurity element are weighed, mixed in a mortar, heated in an electric-furnace and baked to react so as to include an impurity element in the host material. The baking temperature is preferably 700° C. to 1500° C. This is because solid-phase reaction does not proceed when temperature is too low, and the host material is decomposed when temperature is too high. The baking may be performed in a powder state; however, it is preferably performed in a pellet state. Baking at a comparatively high temperature is required. However, since it is a simple method, high productivity can be obtained; therefore, it is suitable for mass-production.

The liquid phase synthesis method (coprecipitation method) is a method in which a host material or a compound including the host material, and an impurity element or a compound including the impurity element are reacted in a solution, dried, and then baked. The particles of the light emitting material are dispersed uniformly, and the reaction is advanced even if the particles are small and baking temperature is low.

As the host material to be used for the light-emitting material, a sulfide, an oxide, or a nitride can be used. As a sulfide, zinc sulfide (ZnS), cadmium sulfide (CdS), calcium sulfide (CaS), yttrium sulfide ($Y_2S_3$), gallium sulfide ($Ga_2S_3$), strontium sulfide (SrS), barium sulfide (BaS), or the like can be used. As an oxide, for example, zinc oxide (ZnO), yttrium oxide ($Y_2O_3$), or the like can be used. As an nitride, aluminum nitride (AlN), gallium nitride (GaN), indium nitride (InN), or the like can be used. Alternatively, zinc selenide (ZnSe), zinc telluride (ZnTe), or the like can be also used. Furthermore, mixed crystal of a three-dimensional structure such as calcium sulfide-gallium ($CaGa_2S_4$), strontium sulfide-gallium ($SrGa_2S_4$), and barium sulfide-gallium ($BaGa_2S_4$) may be used.

As a luminescence center of the local emission, manganese (Mn), copper (Cu), samarium (Sm), terbium (Tb), erbium (Er), thulium (Tm), europium (Eu), cerium (Ce), praseodymium (Pr), or the like can be used. As charge compensation, a halogen element such as fluorine (F), chlorine (Cl) may be added.

On the other hand, as a luminescence center of the donor-acceptor recombination emission, a light emitting material including a first impurity element forming a donor level and a light emitting material including a second impurity element forming an acceptor level can be used. As the first impurity element, for example, fluorine (F), chlorine (Cl), bromine (Br), Iodine (I), boron (B), aluminum (Al), gallium (Ga), indium (In), thallium (Tl), or the like can be used. As the second impurity element, for example, a metal element such as copper (Cu), silver (Ag), iron (Au), platinum (Pt), or silicon (Si) can be used.

When a light emitting material of donor-acceptor recombination emission is synthesized by a solid phase method, a host material, a first impurity element or a compound including the first impurity element, and a second impurity element or a compound including the second impurity element are weighed, mixed in a mortar, heated in an electric-furnace and baked. As the host material, the above mentioned host materials can be used. As the first impurity element or the compound including the impurity element, for example, fluorine (F), chlorine (Cl), aluminum sulfide ($Al_2S_3$), or the like can be used. As the second impurity element or the compound including the second impurity element, for example, copper (Cu), silver (Ag), copper sulfide ($Cu_2S$), silver sulfide ($Ag_2S$), or the like can be used. The burning temperature is preferably 700° C. to 1500° C. It is because a solid-phase reaction does not proceed when temperature is too low, and the host material is decomposed when temperature is too high. The baking may be performed in a powder state, however preferably performed in a pellet state.

As an impurity element in the case of using a solid-phase reaction, a combination of compounds formed of the first impurity element and the second impurity element may be used. In this case, since the impurity element is easily dispersed and the solid-phase reaction is easily advanced, a uniform light emitting material can be obtained. Furthermore, since impurity element is not entered excessively, the light emitting material with high purity can be obtained. As the compound formed of the first impurity element and the second impurity element, for example, copper fluoride ($CuF_2$), copper chloride (CuCl), copper iodide (CuI), copper bromide (CuBr), copper nitride ($Cu_3N$), copper phosphide ($Cu_3P$), silver fluoride (AgF), silver chloride (AgCl), silver iodide (AgI), silver bromide (AgBr), Auric chloride ($AuCl_3$), Auric bromide ($AuBr_3$), chlorination platinum ($PtCl_2$), or the like can be used.

Note that the concentration of these impurity elements is in the range of 0.01 to 10 atom % with respect to the host material, preferably, 0.05 to 5 atom %.

As a light emitting material having a luminescence center of the donor-acceptor recombination emission, a light emitting material including the third impurity element may be used. As the third impurity element, for example, lithium (Li), sodium (Na), potassium (K), rubidium (Rb), caesium (Cs), nitrogen (N), phosphorus (P), arsenic (As), antimony (Sb), bismuth (Bi), or the like can be used. In this case, the concentration of the third impurity element is preferably 0.05 to 5% atom % with respect to the host material. Light emission at low voltage is possible by using the light emitting material having such a structure. Accordingly, a light emitting element which can emit light at low driving voltage can be obtained, and a light emitting element with reduced power consumption can be obtained. Furthermore, the impurity element which becomes the luminescence center of the local emission may be included.

As the light emitting material, for example, a light emitting material including ZnS as the host material, Cl as the first impurity element, Cu as the second impurity element, Ga and As as the third impurity element, and Mn as the luminescence center of the local emission may be used. The following method can be used to form such a light emitting material. First, Mn is added to the light emitting material (ZnS: Cu, Cl), and baked for 2 to 4 hours in vacuum. The burning temperature is preferably 700 to 1500° C. This baked material is powdered to have a grain size of 5 to 20 μm, and GaAs having a grain size of 1 to 3 μm is added thereto, and is agitated. By baking this mixture in a nitrogen current of air including a sulfur gas at about 500 to 800° C. for 2 to 4 hours, the light emitting material can be obtained. By using the light emitting material to form a thin film by a vapor deposition method, the thin film can be used as a light emitting layer of the light emitting element.

Light emission is possible without using hot electrons which are accelerated by high electric field in the light emitting layer using the above mentioned material as a host material, and using the light emitting layer made of the light emitting material including the first impurity element, the second impurity element and the third impurity element. Namely, since it is not necessary to apply high voltage to the light emitting element, the light emitting element which can operate at low driving voltage can be obtained. Furthermore, since light emission is possible at low driving voltage, a light emitting element in which power consumption is reduced can be obtained. Moreover, an element which can be another luminescence center can be included.

The inorganic EL element includes the above mentioned material as a host material, the second impurity element, the third impurity element and the light emitting material having a luminescence center utilizing the inner shell electron transition in the metal ion. In this case, the metal ion which becomes the luminescence center is preferably 0.05 to 5 atomic % with respect to the host material. The concentration of the second impurity element is preferably 0.05 to 5 atomic % with respect to the host material. The concentration of the third impurity element is preferably 0.05 to 5 atomic % to the host material. In the light emitting material having such a structure, light emission at low voltage is possible. Since the light emitting element which can emits light at low voltage can be obtained, a light emitting element with reduced power consumption can be obtained. Furthermore, an element which can be another luminescence center may be included.

In the case of a thin film type inorganic EL, an electroluminescent layer is a layer including the light emitting material, and can be formed by a vacuum evaporation method such as a resistance heating vapor evaporation method or electron-beam evaporation (EB deposition) method, a physical vapor deposition (PVD) method such as a sputtering method, an organic metal CVD method, a chemical vapor deposition method such as hydride transfer low pressure CVD method (CVD), an atomic layer epitaxy (ALE) method, or the like.

Figure 26A:
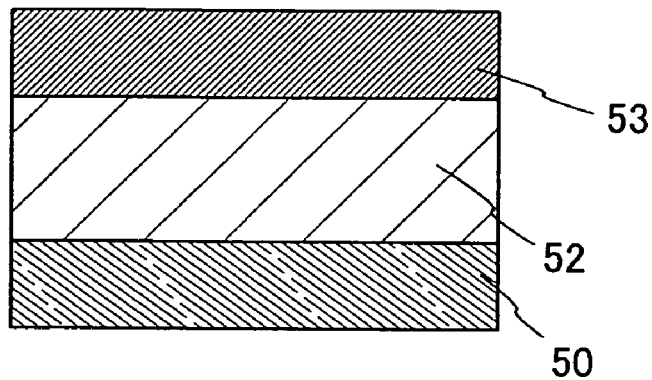
FIGS. 26A to 26C are cross sectional views describing a light emitting element applicable to this invention.
Figure 26B:
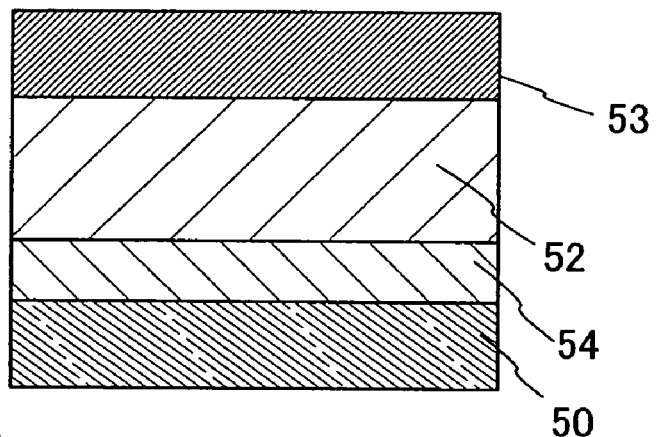
Figure 26C:
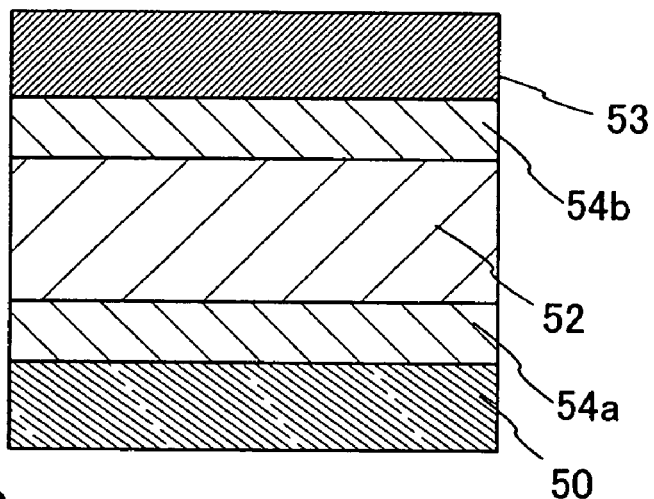

An example of a thin film type inorganic EL element which can be used as a light emitting element is shown in FIGS. 26A to 26C. In FIGS. 26A to 26C, the light emitting element includes a first conductive layer 50, an electroluminescent layer 51, and a conductive layer 53 having a light-transmitting property.

The light emitting element shown in FIGS. 26B and 26C has a structure in which one or more insulating layer is provided between one or a pair of conductive layers and an electroluminescent layer in a light emitting element in FIG. 26A. The light emitting shown in FIG. 26B has an insulating layer 54 between a first conductive layer 50 and an electroluminescent layer 52, and the light emitting element shown in FIG. 26C has an insulating layer 54a between the first conductive layer 50 and the electroluminescent layer 52, and an insulating layer 54b between the conductive layer 53 having a light-transmitting property and the electroluminescent layer 52. The insulating layer may be provided between the electroluminescent layer and a conductive layer or the insulating layers may be provided between the electroluminescent layer and the pair of the electrode layers. Furthermore, the insulating layer may be a single layer or a lamination layer formed of a plurality of layers.

The insulating layer 54 is provided so as to have contact with the first conductive layer 50 in FIG. 26B, however the insulating layer 54 may be provided so as to have contact with the conductive layer 53 having a light-transmitting property by reversing the order of the insulating layer and the electroluminescent layer.

In the case of the dispersed inorganic EL, particulate light emitting materials are dispersed in a binder, thereby forming a membranous electroluminescent layer. When a particle having a size that is desirably enough can not be obtained, it can be processed by crushing in mortar or the like to have adequate particulate light emitting materials. The binder is a substance for fixing the granular light emitting material in a dispersed state, and holding in a form of an electroluminescent layer. The light emitting material is uniformly dispersed in the electroluminescent layer by the binder and fixed.

In the case of the dispersed inorganic EL, the electroluminescent layer can be formed by a droplet discharge method in which an electroluminescent layer can be selectively formed, a printing method (screen printing, offset printing, or the like), a coating method such as spin coating, dipping method, a dispenser method, or the like. The film thickness is not specifically limited; however, it is preferably from 10 nm to 1000 nm. In the electroluminescent layer including a light emitting material and a binder, the ratio of the light emitting material is preferably from 50 wt % to 80 wt %.

Figure 27A:
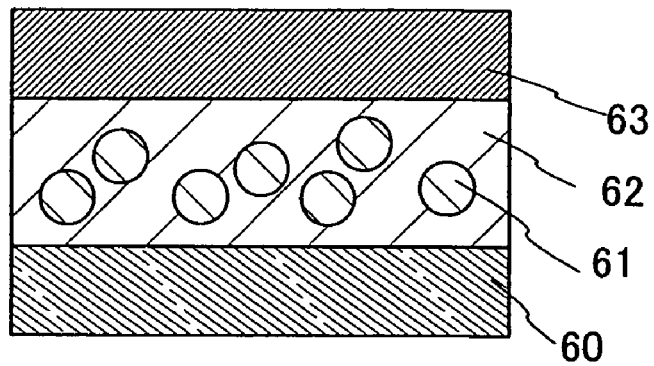
FIGS. 27A to 27C are cross sectional views describing a light emitting element applicable to this invention.
Figure 27B:
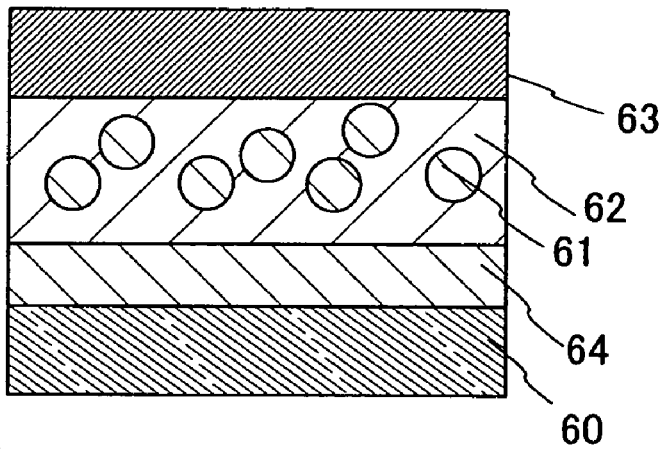
Figure 27C:
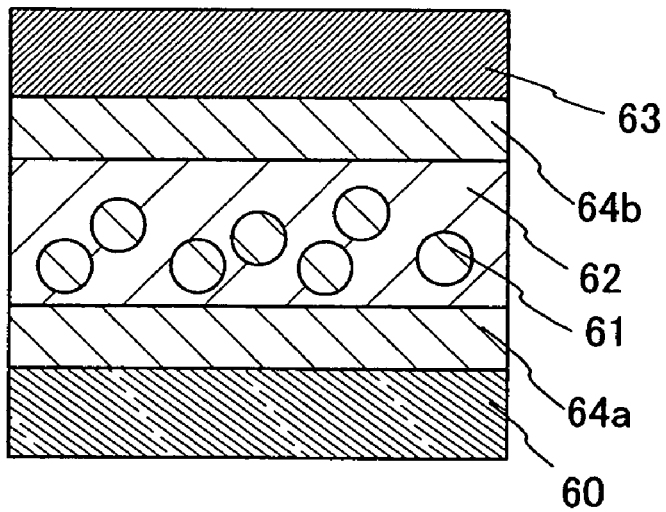

An example of the dispersed inorganic EL element which can be used as a light emitting element is shown in FIG. 27A to FIG. 27C. The light emitting element in FIG. 27A has a laminated structure of the first conductive layer 60, the electroluminescent layer 62, and the conductive layer 63 having a light-transmitting property. And the light emitting element 61 kept by the binder is included in the electroluminescent layer 62.

As the binder which can be used in this embodiment mode, an insulating material can be used. In addition, an organic material or an inorganic material, or a mixed material of the organic material and the inorganic material can be used. As the organic insulating material, like a cyanoethyl cellulose resin, a polymer having a relatively high dielectric constant, resin such as polyethylene, polypropylene, polystyrenic resin, silicon resin, epoxy resin, vinylidene fluoride, or the like can be used. Alternatively, a thermally stable polymer such as aromatic polyamide and polybenzimidazole, or a siloxane resin may be used. Note that the siloxane resin corresponds to a resin containing a Si—O—Si bond. In siloxane, a skeleton structure is constituted by a bond between silicon (Si) and oxygen (O). As a substituent, an organic group at least including hydrogen (for example, alkyl group, aromatic hydrocarbon) is used. As the substituent, a fluoro group may be used. Alternatively, an organic group at least including hydrogen and fluoro group may be used as a substituent. Alternatively, a resin material such as a vinyl resin like polyvinyl alcohol, polyvinyl butyral, or the like, a phenol resin, a novolac resin, an acrylic resin, a melamine resin, an urethane resin, or an oxazole resin (polybenz oxazole) can be used. Furthermore, a photo-curing resin material may be used. The dielectric constant can be adjusted by adequately mixing fine particles of high dielectric constant such as barium titanate ($BaTiO_3$) or strontium titanate ($SrTiO_3$).

The inorganic insulating material included in the binder can be formed of silicon oxide (SiOx), silicone nitride (SiNx), silicon including oxygen and nitrogen, aluminum nitride (AlN), aluminum including oxygen and nitrogen or aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), ZnS, or other material selected from a substance including other inorganic insulating materials. By adding the inorganic material having a high dielectric constant in the organic material (using a doping method or the like), the dielectric constant of the electroluminescent layer made from the light emitting material and the binder can be controlled further, and the dielectric constant can be increased further.

In a manufacturing step, a light emitting material is dispersed in a solution including a binder. As a solvent of solution including the binder which can be used for this embodiment mode, a solvent in which a binder material is dissolved, and a solution having a viscosity suitable for a method for manufacturing an electroluminescent layer (various wet processes) and for a desired film thickness can be formed, is properly selected. In the case where the organic solvent or the like can be used, for example, a siloxane resin is used as a binder, propylene glycol monomethylether, propylene glycol monomethylether acetate (also referred to as PGMEA), 3-methoxy-3 methyl-1-butanol (also referred to as MMB), or the like can be used.

The light emitting element shown in FIGS. 27B and 27C has a structure in which one or more insulating layer is provided between one or a pair of conductive layers and an electroluminescent layer in a light emitting element in FIG. 27A. The light emitting shown in FIG. 27B has an insulating layer 64 between a first conductive layer 60 and an electroluminescent layer 62, and the light emitting element shown in FIG. 27C has an insulating layer 64a between the first conductive layer 60 and the electroluminescent layer 62, and an insulating layer 64b between the conductive layer 63 having a light-transmitting property and the electroluminescent layer 62. The insulating layer may be provided between the electroluminescent layer and a conductive layer or the insulating layers may be provided between the electroluminescent layer and the pair of the electrode layers. Furthermore, the insulating layer may be a single layer or a lamination layer formed of a plural layers.

The insulating layer 64 is provided so as to have contact with the first conductive layer 60 in FIG. 27B, however the insulating layer 64 may be provided so as to have contact with the conductive layer 63 having a light-transmitting property by reversing the order of the insulating layer and the electroluminescent layer.

A first conductive layer 50 and a conductive layer 53 having a light-transmitting property in FIGS. 26A to 26C, a first conductive layer 60 and a conductive layer 63 having a light-transmitting property in FIGS. 27A to 27C, a first conductive layer 101 shown in Embodiment Mode 5 and Embodiment Mode 6, and a conductive layer 141 having a light-transmitting property can be property used.

An insulating layer such as the insulating layer 54 in FIG. 26 and the insulating layer 64 in FIG. 27 is not specifically limited; however it preferably has a high insulation resistance, a fine film quality, and a high dielectric constant. For example, silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), or zirconium oxide ($ZrO_2$), a mixed layer of these, or a lamination film including two or more kinds of these can be used. These insulating films can be formed by sputtering, evaporation, CVD, or the like. The insulating layer may be also formed by dispersing particles of these insulating materials in a binder. The material for the binder is formed of the same material as the binder included in the electroluminescent layer using the same method. The film thickness is not specifically limited; however, it is preferably in the range of 10 nm to 1000 nm.

As the light emitting material shown in Embodiment Mode 1 to 4, the host material and the impurity element which becomes a luminescence center can be properly used.

The light emitting element shown in this embodiment mode can obtain light emission by applying voltage between a pair of electrode layers sandwiching the electroluminescent layer, however, the light emitting element can operate either in AC drive or DC drive.

Embodiment 1

Figure 22A:
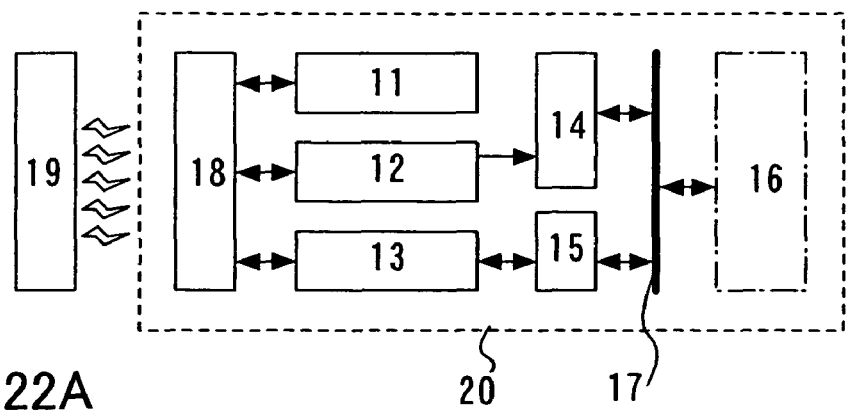
FIGS. 22A to 22C are views describing a constitutional example of a semiconductor device of this invention.

Here, a structure of a semiconductor device of this embodiment is described with reference to FIGS. 22A to 22C. As shown in FIG. 22A, a semiconductor device 20 of this embodiment has a function to send and receive data wirelessly, and also has a power source circuit 11, a clock generation circuit 12, a data modulation/demodulation circuit 13, a control circuit 14 which controls another circuit, an interface circuit 15, a memory device 16, a bus 17, and an antenna 18.

Figure 22B:
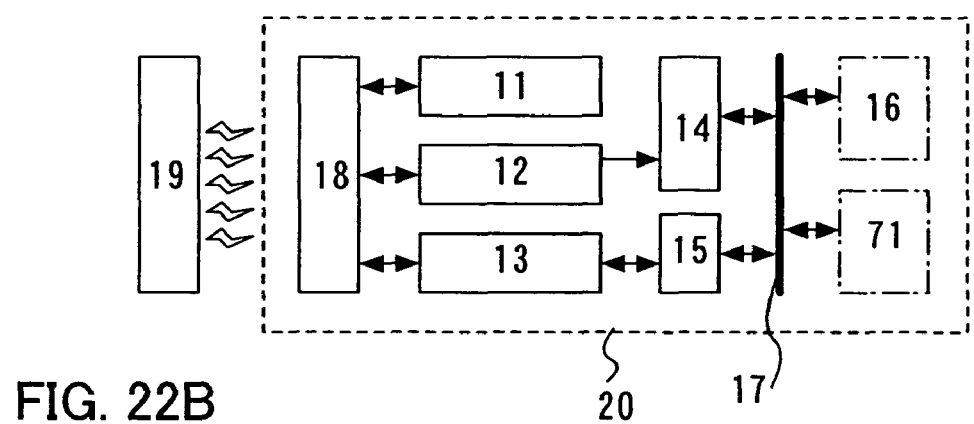

Further, as shown in FIG. 22B, a semiconductor device 20 of this embodiment has a function to send and receive data wirelessly, and also has a power source circuit 11, a clock generation circuit 12, a data modulation/demodulation circuit 13, a control circuit 14 which controls another circuit, an interface circuit 15, a memory device 16, a bus 17, and an antenna 18. In addition, a central processing unit 71 may be included.

Figure 22C:
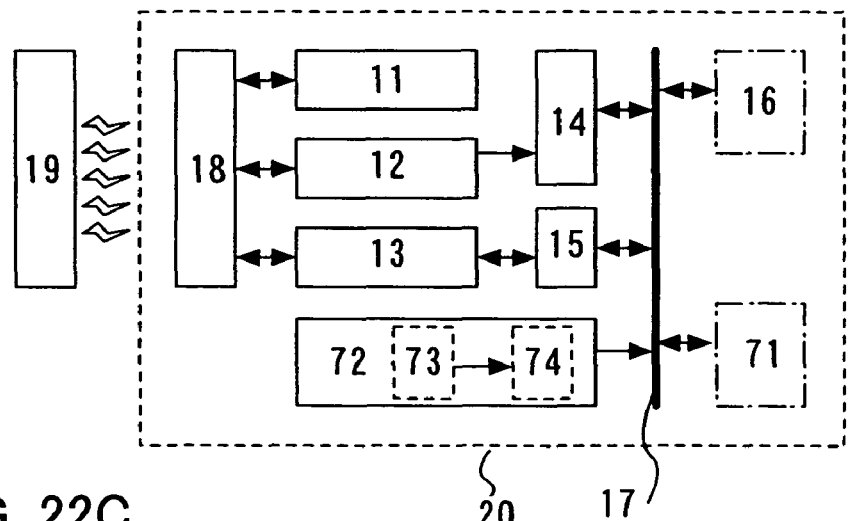

Further, as shown in FIG. 22C, a semiconductor device 20 of this embodiment has a function to send and receive data wirelessly, and also has a power source circuit 11, a clock generation circuit 12, a data modulation/demodulation circuit 13, a control circuit 14 which controls another circuit, an interface circuit 15, a memory device 16, a bus 17, an antenna 18, and a central processing unit 71. In addition, a detecting portion 72 including a detecting element 73 and a detecting control circuit 74 may be included.

In a semiconductor device of this embodiment mode, a small and multifunctional semiconductor device can be manufactured by forming a detecting portion 72 including a detecting element 73 and a detecting control circuit, and the like in addition to a power source circuit 11, a clock generation circuit 12, a data modulation/demodulation circuit 13, a control circuit 14 which controls another circuit, an interface circuit 15, a memory device 16, a bus 17, an antenna 18, and a central processing unit 71

The power source circuit 11 is a circuit generating various power sources to be supplied to the respective circuits in the semiconductor device 20 based on an alternating signal inputted from the antenna 18. The clock generation circuit 12 is a circuit generating various clock signals to be supplied to the respective circuits in the semiconductor device 20 based on an alternating signal inputted from the antenna 18. The data modulation/demodulation circuit 13 has a function to modulate/demodulate data to be sent to or received from a reader/writer 19. The control circuit 14 has a function to control the storage circuit 16. The antenna 18 has a function to send and receive an electric field or an electric wave. The reader/writer 19 has a function to exchange data with the semiconductor device, control semiconductor device, and control the process of the data sent to or received from the semiconductor device. The semiconductor device is not limited to the above structure, and for example, another element such as a limiter circuit of power source voltage or hardware only for processing codes may be added.

The memory device 16 has one or a more selected from the memory devices shown in Embodiment Mode 8 or Embodiment Mode 9. Since the size reduction, the decrease in film thickness, as well as the increase in capacitance can be achieved simultaneously in the memory element including an organic compound, the semiconductor device can be compact and lightweight by forming the memory device 16 with the memory element including the organic compound.

The detecting portion 72 can detect temperature, pressure, flow rate, light, magnetism, acoustic wave, acceleration, humidity, gas constituent, liquid constituent, and other characteristics by a physical or chemical means. Moreover, the detecting portion 72 has the detecting element 73 for detecting a physical amount or a chemical amount and the detecting control circuit 74 for converting the physical amount or the chemical amount detected by the detecting element 73 into an appropriate signal such as an electric signal. As the detecting element 73, it is possible to use a resistance element, a capacitance-coupled element, an inductively-coupled element, a photoelectromotive element, a photoelectric conversion element, a thermoelectromotive element, a transistor, a thermistor, a diode, or the like. The number of detection portions 30 may be more than one and, in such a case, it is possible to detect a plurality of physical amounts or chemical amounts simultaneously.

The physical amount described here means temperature, pressure, flow rate, light, magnetism, acoustic wave, acceleration, humidity, and the like, while the chemical amount means a chemical substance such as a gas constituent or a liquid constituent like ions, or the like. In addition, an organic compound such as a particular biological substance included in blood, sweat, urine, or the like (for example, blood-sugar level in the blood) is also included. In particular, in the case of detecting the chemical amount, since a particular substance needs to be selectively detected, a substance which selectively reacts with the substance to be detected is provided in advance in the detecting element 73. For example, in the case of detecting a biological substance, it is preferable to fix, in a polymer or the like, enzyme, a resistor molecule, a microbial cell, or the like which selectively reacts with the biological substance to be detected by the detecting element 73.

Embodiment 2

Figure 24A:
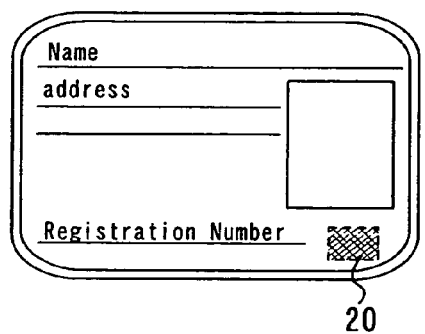
FIGS. 24A to 24F are views describing usage patterns of a semiconductor device of this invention.
Figure 24B:
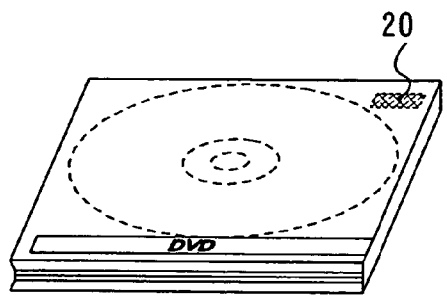
Figure 24C:
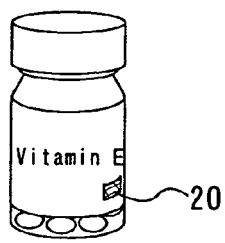
Figure 24D:
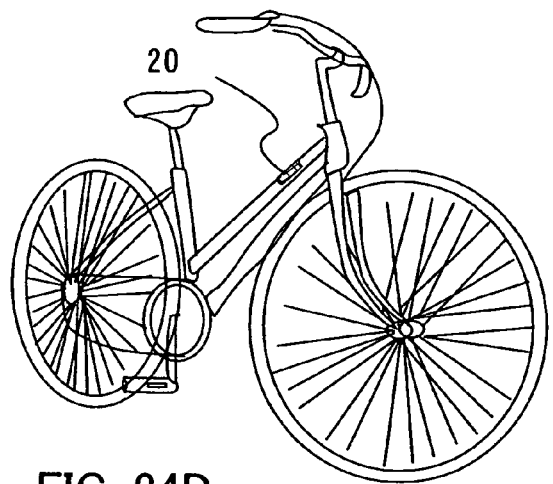
Figure 24E:
Figure 24F:
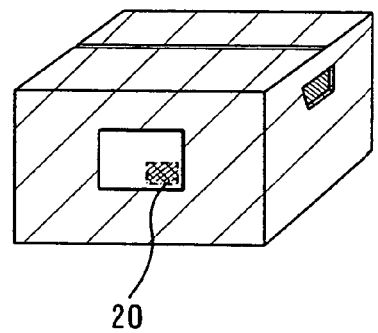

According to this embodiment, a semiconductor device 20 serving as a wireless chip can be formed. The semiconductor device serving as a wireless chip can be applied over a wide range and specific examples of these applications are described hereinafter. The semiconductor device 20 of the present invention can be applied to, for example, a banknote, a coin, documents of value, unregistered bonds, identification certificates (driver's license, certificate of residence, and the like, refer to FIG. 24A), pack cases (a pack paper, a bottle, and the like, refer to FIG. 24C), recording media (DVD software, a video tape, and the like, refer to FIG. 24B), vehicles (a bicycle and the like, refer to FIG. 24D), personal belongings (a bag, glasses, and the like, foods, plants, animals, a human body, clothes, general merchandise, objects such as merchandises of electronic appliances, labels of goods (refer to FIGS. 24E and 24F) and the like. The electronic appliances include a liquid crystal display device, an EL display device, a television device (also referred to as simply a TV, a TV receiving machine, or a television receiving machine), a mobile phone, and the like.

The semiconductor device 20 of this embodiment is fixed to an object by mounting the device onto a print substrate, pasting the device to the surface, or embedding the device inside the object. For example, if the object is a book, the device is fixed to the book by embedding the device inside the paper, and if the object is a package made of an organic resin, the device is fixed to the package by embedding the device inside the organic resin. Since the semiconductor device 20 of this embodiment is small, thin, and light-weight, the design quality is not degraded even after the device is fixed to an object. By providing the semiconductor device 20 of this embodiment to a banknote, a coin, documents of value, unregistered bonds, identification certificates, and the like, an identification function can be provided, thereby preventing the forgery. Moreover, by providing the semiconductor device 20 of this embodiment for pack cases, recording media, personal belongings, foods, clothes, general merchandise, electronic appliances, and the like, a system such as an inspection system becomes more efficient.

Figure 23:
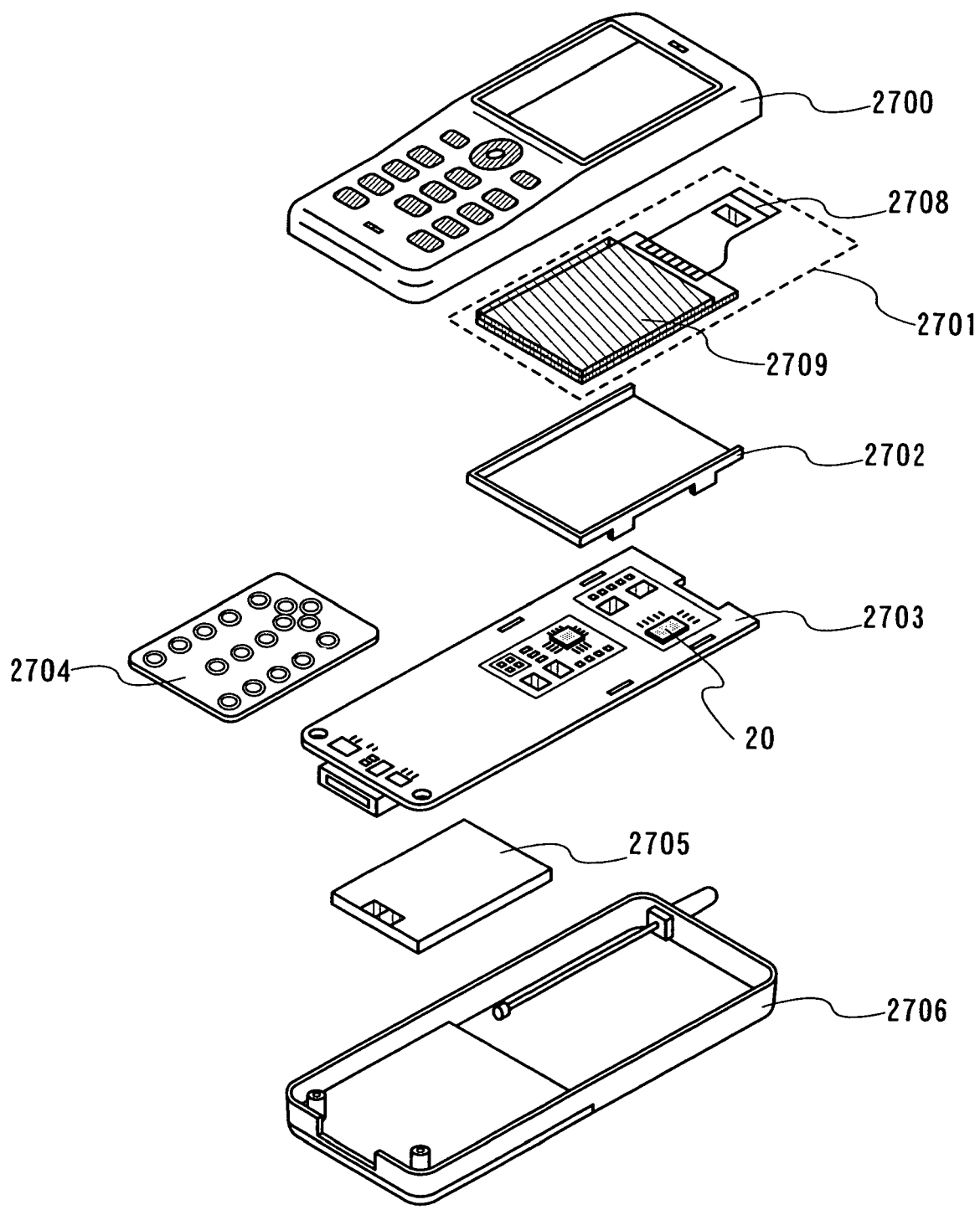
FIG. 23 is a view describing an electric device having a semiconductor device of this invention.

Next, a mode of the electronic appliance where the semiconductor device of this embodiment is mounted is described with reference to the drawing. The electronic appliance shown here is a mobile phone including cases 2700 and 2706, a panel 2701, a housing 2702, a printed circuit board 2703, operation buttons 2704, a battery 2705, and the like (refer to FIG. 23). The panel 2701 is detachably incorporated in the housing 2702. The housing 2702 is fitted into the printed circuit board 2703. The shape and dimension of the housing 2702 are appropriately changed in accordance with the electronic appliance where the panel 2701 is to be incorporated. Over the printed circuit board 2703, a plurality of packaged semiconductor devices are mounted and the semiconductor device 20 of this embodiment can be used as one of the plurality of packaged semiconductor devices. The plurality of semiconductor devices mounted onto the printed circuit board 2703 has any one of functions of a controller, a central processing unit (CPU), a memory, a power source circuit, an audio processing circuit, a sending/receiving circuit, and the like.

The panel 2701 is connected to the printed circuit board 2703 through a connection film 2708. The above panel 2701, the housing 2702, and the printed circuit board 2703 are placed in the cases 2700 and 2706 together with the operation buttons 2704 and the battery 2705. A pixel region 2709 in the panel 2701 is provided so as to be observed through an opening window provided in the case 2700.

As above, the semiconductor device of this embodiment is small, thin, and lightweight, whereby the limited space in the cases 2700 and 2706 of the electric appliance can be effectively used.

The semiconductor device of this embodiment includes a memory device having a simple structure where an organic compound layer which is changed by applied voltage from outside is sandwiched between a pair of electrodes, and therefore, electronic devices using an inexpensive semiconductor device can be provided. Furthermore, since high integration is easy in the semiconductor device of this embodiment, electronic devices using the semiconductor device having a high-capacity memory device can be provided.

The memory device included in a semiconductor device of this embodiment is nonvolatile and additionally recordable in which data is written by applied voltage from outside. With this characteristic, forgery by rewriting can be prevented and new data can be written additionally. Therefore, electronic devices using a sophisticated and high-value-added semiconductor device can be provided.

The cases 2700 and 2706 are shown as an example of an exterior shape of the mobile phone. The electronic appliance of this embodiment can be changed variously in accordance with the function or the intended purpose thereof.

The present application is based on Japanese Priority Application No. 2005-234387 filed on Aug. 12, 2005 with the Japanese Patent Office, the entire contents of which are hereby incorporated by reference.

What is claimed is:

1. A memory device having a memory element comprising:
a first conductive layer;
a second conductive layer; and
an organic compound layer between the first conductive layer and the second conductive layer,
wherein the organic compound layer comprises:
a photosensitized oxidation agent; and
a substance,
wherein when the photosensitized oxidation agent is excited, the photosensitized oxidation agent is capable of oxidizing the substance at least partly, so that a conductivity of the oxidized substance is different from a conductivity of the substance before oxidation, and
wherein rewriting is not possible in the memory element.

2. The memory device according to claim 1,
wherein a voltage is applied to the first conductive layer and the second conductive layer, and
wherein the photosensitized oxidation agent is excited by recombination energy of holes and electrons generated by the voltage.

3. The memory device according to claim 1,
wherein the photosensitized oxidation agent is one selected from the group consisting of lumichrome, alloxazine, lumiflavin, flavin mononucleotide, and tetramethylene paraphenylene diamines.

4. The memory device according to claim 1,
wherein the substance is one selected from the group consisting of an ascorbic acid, guanosine, dibenzofuran, 11-cis-3,4-di dehydroretinal, an uridine, and a thymidine.

5. The memory device according to claim 1,
wherein the photosensitized oxidation agent comprises alloxazine round or chlorophyll.

6. A memory device having a memory element comprising:
a first conductive layer;
a second conductive layer; and
an organic compound layer between the first conductive layer and the second conductive layer,
wherein the organic compound layer comprises:
a light emitting material;
a photosensitized oxidation agent; and
a substance,
wherein when the photosensitized oxidation agent is excited, the photosensitized oxidation agent is capable of oxidizing the substance at least partly, so that a conductivity of the oxidized substance is different from a conductivity of the substance before oxidation, and
wherein rewriting is not possible in the memory element.

7. The memory device according to claim 6,
wherein the organic compound layer comprises:
a first layer comprising the light emitting material; and
a second layer comprising the photosensitized oxidation agent and the substance.

8. The memory device according to claim 6,
wherein a voltage is applied to the first conductive layer and the second conductive layer,
wherein the light emitting material emits light by recombination energy of holes and electrons generated by the voltage, and
wherein the photosensitized oxidation agent is excited by the light.

9. The memory device according to claim 6,
wherein the photosensitized oxidation agent is one selected from the group consisting of lumichrome, alloxazine, lumiflavin, flavin mononucleotide, and tetramethylene paraphenylene diamines.

10. The memory device according to claim 6,
wherein the substance is one selected from the group consisting of an ascorbic acid, guanosine, dibenzofuran, 11-cis-3,4-di dehydroretinal, an uridine, and a thymidine.

11. The memory device according to claim 6,
wherein the photosensitized oxidation agent comprises alloxazine round or chlorophyll.

12. A memory device having a memory element comprising:
a first conductive layer;
a second conductive layer over the first conductive layer;
a third conductive layer over the second conductive layer;
a first organic compound layer between the first conductive layer and the second conductive layer; and
a second organic compound layer between the second conductive layer and the third conductive layer,
wherein the first organic compound layer comprises:
a photosensitized oxidation agent; and
a substance,
wherein when the photosensitized oxidation agent is excited, the photosensitized oxidation agent is capable of oxidizing the substance at least partly, so that a conductivity of the oxidized substance is different from a conductivity of the substance before oxidation,
wherein the second organic compound layer comprises light emitting material,
wherein the second conductive layer is capable of transmitting light, and
wherein rewriting is not possible in the memory element.

13. The memory device according to claim 12,
wherein a voltage is applied to the second conductive layer and the third conductive layer,
wherein the light emitting material emits light by recombination energy of holes and electrons generated by the voltage, and
wherein the photosensitized oxidation agent is excited by the light.

14. The memory device according to claim 12,
wherein the photosensitized oxidation agent is one selected from the group consisting of lumichrome, alloxazine, lumiflavin, flavin mononucleotide, and tetramethylene paraphenylene diamines.

15. The memory device according to claim 12,
wherein the substance is one selected from the group consisting of an ascorbic acid, guanosine, dibenzofuran, 11-cis-3,4-di dehydroretinal, an uridine, and a thymidine.

16. The memory device according to claim 12,
wherein the photosensitized oxidation agent comprises alloxazine round or chlorophyll.

17. A memory device having a memory element comprising:
a first conductive layer;
a second conductive layer; and
an organic compound layer between the first conductive layer and the second conductive layer,
wherein the organic compound layer comprises:
a photosensitized reduction agent; and
a substance,
wherein when the photosensitized reduction agent is excited, the photosensitized reduction agent is capable of reducing the substance at least partly, so that a conductivity of the reduced substance is different from a conductivity of the substance before reduction, and
wherein rewriting is not possible in the memory element.

18. The memory device according to claim 17,
wherein a voltage is applied to the first conductive layer and the second conductive layer, and
wherein the photosensitized reduction agent is excited by recombination energy of holes and electrons generated by the voltage.

19. The memory device according to claim 17,
wherein the photosensitized reduction agent is one selected from the group consisting of lumichrome, alloxazine, lumiflavin, flavin mononucleotide, and tetramethylene paraphenylene diamines.

20. The memory device according to claim 17,
wherein the substance is one selected from the group consisting of an ascorbic acid, guanosine, dibenzofuran, 11-cis-3,4-di dehydroretinal, an uridine, and a thymidine.

21. The memory device according to claim 17, wherein the photosensitized reduction agent comprises alloxazine round or chlorophyll.

22. A memory device having a memory element comprising:
- a first conductive layer;
- a second conductive layer; and
- an organic compound layer between the first conductive layer and the second conductive layer,
- wherein the organic compound layer comprises:
  - a light emitting material;
  - a photosensitized reduction agent; and
  - a substance,
- wherein when the photosensitized reduction agent is excited, the photosensitized reduction agent is capable of reducing the substance at least partly, so that a conductivity of the reduced substance is different from a conductivity of the substance before reduction, and
- wherein rewriting is not possible in the memory element.

23. The memory device according to claim 22,
wherein the organic compound layer comprises:
- a first layer comprising the light emitting material; and
- a second layer comprising the photosensitized reduction agent and the substance.

24. The memory device according to claim 22,
- wherein a voltage is applied to the first conductive layer and the second conductive layer,
- wherein the light emitting material emits light by recombination energy of holes and electrons generated by the voltage, and
- wherein the photosensitized reduction agent is excited by the light.

25. The memory device according to claim 22,
wherein the photosensitized reduction agent is one selected from the group consisting of lumichrome, alloxazine, lumiflavin, flavin mononucleotide, and tetramethylene paraphenylene diamines.

26. The memory device according to claim 22,
wherein the substance is one selected from the group consisting of an ascorbic acid, guanosine, dibenzofuran, 11-cis-3,4-di dehydroretinal, an uridine, and a thymidine.

27. The memory device according to claim 22,
wherein the photosensitized reduction agent comprises alloxazine round or chlorophyll.

28. A memory device having a memory element comprising:
- a first conductive layer;
- a second conductive layer over the first conductive layer;
- a third conductive layer over the second conductive layer;
- a first organic compound layer between the first conductive layer and the second conductive layer; and
- a second organic compound layer between the second conductive layer and the third conductive layer,
- wherein the first organic compound layer comprises:
  - a photosensitized reduction agent; and
  - a substance,
- wherein when the photosensitized reduction agent is excited, the photosensitized reduction agent is capable of reducing the substance at least partly, so that a conductivity of the reduced substance is different from a conductivity of the substance before reduction,
- wherein the second organic compound layer comprises light emitting material,
- wherein the second conductive layer is capable of transmitting light, and
- wherein rewriting is not possible in the memory element.

29. The memory device according to claim 28,
- wherein a voltage is applied to the second conductive layer and the third conductive layer,
- wherein the light emitting material emits light by recombination energy of holes and electrons generated by the voltage,
- wherein the photosensitized reduction agent is excited by the light.

30. The memory device according to claim 28,
wherein the photosensitized reduction agent is one selected from the group consisting of lumichrome, alloxazine, lumiflavin, flavin mononucleotide, and tetramethylene paraphenylene diamines.

31. The memory device according to claim 28,
wherein the substance is one selected from the group consisting of an ascorbic acid, guanosine, dibenzofuran, 11-cis-3,4-di dehydroretinal, an uridine, and a thymidine.

32. The memory device according to claim 28,
wherein the photosensitized reduction agent comprises alloxazine round or chlorophyll.

* * * * *